US012604613B2

(12) United States Patent
Lee et al.

(10) Patent No.: US 12,604,613 B2
(45) Date of Patent: Apr. 14, 2026

(54) DISPLAY DEVICE

(71) Applicant: Samsung Display Co., Ltd., Yongin-si (KR)

(72) Inventors: Dong-Hoon Lee, Yongin-si (KR);
Jangmi Kang, Yongin-si (KR);
Myunghoon Park, Yongin-si (KR);
Minkyu Woo, Yongin-si (KR);
Byungchang Yu, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/464,308

(22) Filed: Sep. 11, 2023

(65) Prior Publication Data

US 2024/0251599 A1 Jul. 25, 2024

(30) Foreign Application Priority Data

Jan. 19, 2023 (KR) ........................ 10-2023-0007834

(51) Int. Cl.
| | |
|---|---|
| *H01L 27/32* | (2006.01) |
| *G09G 3/3233* | (2016.01) |
| *H10K 59/121* | (2023.01) |
| *H10K 59/131* | (2023.01) |

(52) U.S. Cl.
CPC ....... *H10K 59/1216* (2023.02); *G09G 3/3233* (2013.01); *H10K 59/131* (2023.02); *G09G 2300/0426* (2013.01); *G09G 2300/0819* (2013.01); *G09G 2300/0852* (2013.01); *G09G 2300/0861* (2013.01)

(58) Field of Classification Search
CPC ............. H10K 59/1216; H10K 59/131; H10K 59/121; G09G 3/3233; G09G 2300/0426; G09G 2300/0819; G09G 2300/0852; G09G 2300/0861; G09G 3/3225; H01L 21/02532
USPC ......................................................... 345/76
See application file for complete search history.

(56) References Cited

U.S. PATENT DOCUMENTS

| | | | | |
|---|---|---|---|---|
| 8,648,337 | B2 | 2/2014 | Hsieh | |
| 2006/0284801 | A1* | 12/2006 | Yoon .................... | G09G 3/3233 |
| | | | | 345/76 |
| 2008/0284691 | A1* | 11/2008 | Chung ................. | G09G 3/3225 |
| | | | | 345/76 |
| 2018/0183008 | A1* | 6/2018 | Song .................... | H10K 59/121 |
| 2021/0249452 | A1* | 8/2021 | Jung ................. | H01L 21/02532 |
| 2022/0173192 | A1* | 6/2022 | Wang ................. | H10K 59/1216 |

(Continued)

FOREIGN PATENT DOCUMENTS

| | | |
|---|---|---|
| CN | 103280539 | 9/2013 |
| KR | 10-2022-0102870 | 7/2022 |
| KR | 10-2022-0128549 | 9/2022 |

*Primary Examiner* — Abdul-Samad A Adediran
(74) *Attorney, Agent, or Firm* — Sughrue Mion, PLLC

(57) ABSTRACT

Disclosed is a display device which includes pixel drivers, each of which includes a first transistor switched by a voltage of a node and electrically connected between a second electrode and a second power supply line, a second transistor electrically connected between the node and a data line and switched by a write scan signal, and a capacitor including a first capacitor electrode electrically connected to the node and a second capacitor electrode electrically connected between the second power supply line and the first transistor. First electrodes of light emitting elements overlap each of the first capacitor electrodes of the pixel drivers.

21 Claims, 32 Drawing Sheets

(56) References Cited

U.S. PATENT DOCUMENTS

| | | |
|---|---|---|
| 2022/0225481 A1 | 7/2022 | Jung et al. |
| 2022/0293033 A1 | 9/2022 | Kim et al. |

* cited by examiner

DISPLAY DEVICE

CROSS-REFERENCE TO RELATED APPLICATIONS

This application claims priority to and benefits of Korean Patent Application No. 10-2023-0007834 under 35 U.S.C. § 119 filed on Jan. 19, 2023, in the Korean Intellectual Property Office, the entire contents of which are incorporated herein by reference.

BACKGROUND

1. Technical Field

Embodiments described herein relate to a display device.

2. Description of the Related Art

Multimedia electronic devices, such as a television, a mobile phone, a tablet computer, a car navigation unit, a game machine, and the like, include a display panel for displaying an image.

The display panel may include light emitting elements and pixel drivers for driving the light emitting elements. In order to improve the reliability of the display panel, studies on connections between the light emitting elements and the pixel drivers are being conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device for improving display quality by preventing horizontal stains.

According to an embodiment, a display device may include light emitting elements, each of which may include a first electrode electrically connected to a first power supply line; a second electrode disposed over the first electrode; and an emissive layer disposed between the first electrode and the second electrode; and pixel drivers disposed below the light emitting elements and electrically connected to the light emitting elements, respectively. Each of the pixel drivers may include a first transistor switched by a voltage of a node and electrically connected between the second electrode and a second power supply line; a second transistor electrically connected between the node and a data line and switched by a write scan signal; and a capacitor including a first capacitor electrode electrically connected to the node and a second capacitor electrode electrically connected between the second power supply line and the first transistor. Each first electrode of the light emitting elements overlap each first capacitor electrode of the pixel drivers.

The first electrode of each of the light emitting elements may be integral with one another.

The display first capacitor electrode of each of the pixel drivers may be disposed in a direction, and the integral first electrode of each of the light emitting elements may include an overlapping part extending in a direction, and the overlapping part may overlap the first capacitor electrode of each of the pixel drivers.

The display device may further comprise light emitting parts defined as regions where light is emitted from the light emitting elements in a plan view; and light emitting units, each including a first light emitting part, a second light emitting part, and a third light emitting part among the light emitting parts, the light emitting units being disposed in a second direction intersecting a first direction, wherein the second light emitting part may be spaced apart from the first light emitting part in a first direction, the third light emitting part is spaced apart from the first light emitting part and the second light emitting part in the second direction, and the pixel drivers may be disposed in the second direction.

The display device may further comprise connecting electrodes disposed between the first electrode of each of the light emitting elements and extending from the first electrode of each of the light emitting elements.

The connecting electrodes may be in plural numbers between the first light emitting part and the second light emitting part.

The connecting electrodes may be singly disposed between the first light emitting part and the second light emitting part The display device may further comprise drive units, each including a first pixel driver electrically connected to a first light emitting element constituting the first light emitting part, a second pixel driver electrically connected to a second light emitting element constituting the second light emitting part, and a third pixel driver electrically connected to a third light emitting element constituting the third light emitting part, the drive units disposed in the second direction; and a display panel including the light emitting units and the drive units wherein in the second direction, a width of each of the drive units may be less than a width of each of the light emitting units.

A distance between each of the drive units and a light emitting unit corresponding to each of the drive units may be gradually increased from a center of the display panel toward a periphery of the display panel in the second direction.

The display panel may be divided into a first region, a second region, and a third region disposed in the second direction, the light emitting units may be disposed in the first region, the second region, and the third region, and the drive units may be disposed in the first region and the second region, the light emitting units disposed in the third region may be electrically connected to the drive units disposed in the second region, and the light emitting units disposed in the first region and the second region may be electrically connected to the drive units disposed in the first region.

The display device may further comprise connecting lines including light emitting connections respectively electrically connected to the light emitting elements, drive connections respectively electrically connected to the respective pixel drivers, and extension lines respectively extending from the light emitting connections to the drive connections Each of the first electrode may not overlap the light emitting connections.

The display device may further comprise a display panel including the light emitting elements and the pixel drivers; and branch lines overlapping, in the second direction, first capacitor electrodes of pixel drivers disposed in a central portion of the display panel.

The branch lines may extend from extension lines disposed in the central portion of the display panel The K extension lines may overlap a first capacitor electrode of a pixel driver adjacent to a periphery of the display panel in the first direction, and K is a natural number of 2 or more, and a number of branch lines overlapping each of the first capacitor electrodes disposed in the central portion of the display panel is K.

The K branch lines may extend in parallel in the second direction from each of the extension lines disposed in the central portion of the display panel.

A single branch line may extend in the second direction from each of the extension lines.

A line width of single branch lines may be greater than a line width of each of the extension lines.

According to an embodiment, a display device may include light emitting elements, each including a first electrode electrically connected to a first power supply line; a second electrode disposed over the first electrode; and an emissive layer disposed between the first electrode and the second electrode and pixel drivers disposed below the light emitting elements and electrically connected to the light emitting elements, respectively. Each of the pixel drivers may include a first transistor switched by a voltage of a node and electrically connected between the second electrode and a second power supply line; a second transistor electrically connected between the node and a data line and switched by a write scan signal; and a capacitor including a first capacitor electrode electrically connected to the node and a second capacitor electrode electrically connected between the second power supply line and the first transistor. The first electrodes of the light emitting elements may be integral with each other and may overlap each of the first capacitor electrode of the pixel drivers.

According to an embodiment, a display device may include light emitting elements, each including a first electrode electrically connected to a first power supply line; a second electrode disposed over the first electrode; and an emissive layer disposed between the first electrode and the second electrode; pixel drivers disposed below the light emitting elements and electrically connected to the light emitting elements, respectively; connecting lines including light emitting connections respectively electrically connected to the light emitting elements; drive connections respectively electrically connected to the pixel drivers; and extension lines respectively extending from the light emitting connections to the drive connections; and branch lines that extend from connecting lines disposed in a central portion among the connecting lines. Each of the pixel drivers may include a first transistor switched by a voltage of a node and electrically connected between the second electrode and a second power supply line; a second transistor electrically connected between the node and a data line and switched by a write scan signal; and a capacitor including a first capacitor electrode electrically connected to the node and a second capacitor electrode electrically connected between the second power supply line and the first transistor. The branch lines may overlap first capacitor electrodes disposed in a central portion among the first capacitor electrodes of the pixel driver.

BRIEF DESCRIPTION OF THE DRAWINGS

The above and other objects and features of the disclosure will become apparent by describing in detail embodiments thereof with reference to the accompanying drawings in which:

FIG. 13 is a schematic perspective view illustrating light emitting units disposed in second and third regions and drive units disposed in the second region illustrated in FIG. 12A.

FIG. 14 is a schematic plan view illustrating a connection relationship between a number of light emitting units disposed in the third region and a number of drive units disposed in the second region illustrated in FIG. 13.

DETAILED DESCRIPTION OF THE EMBODIMENTS

Figure 1:
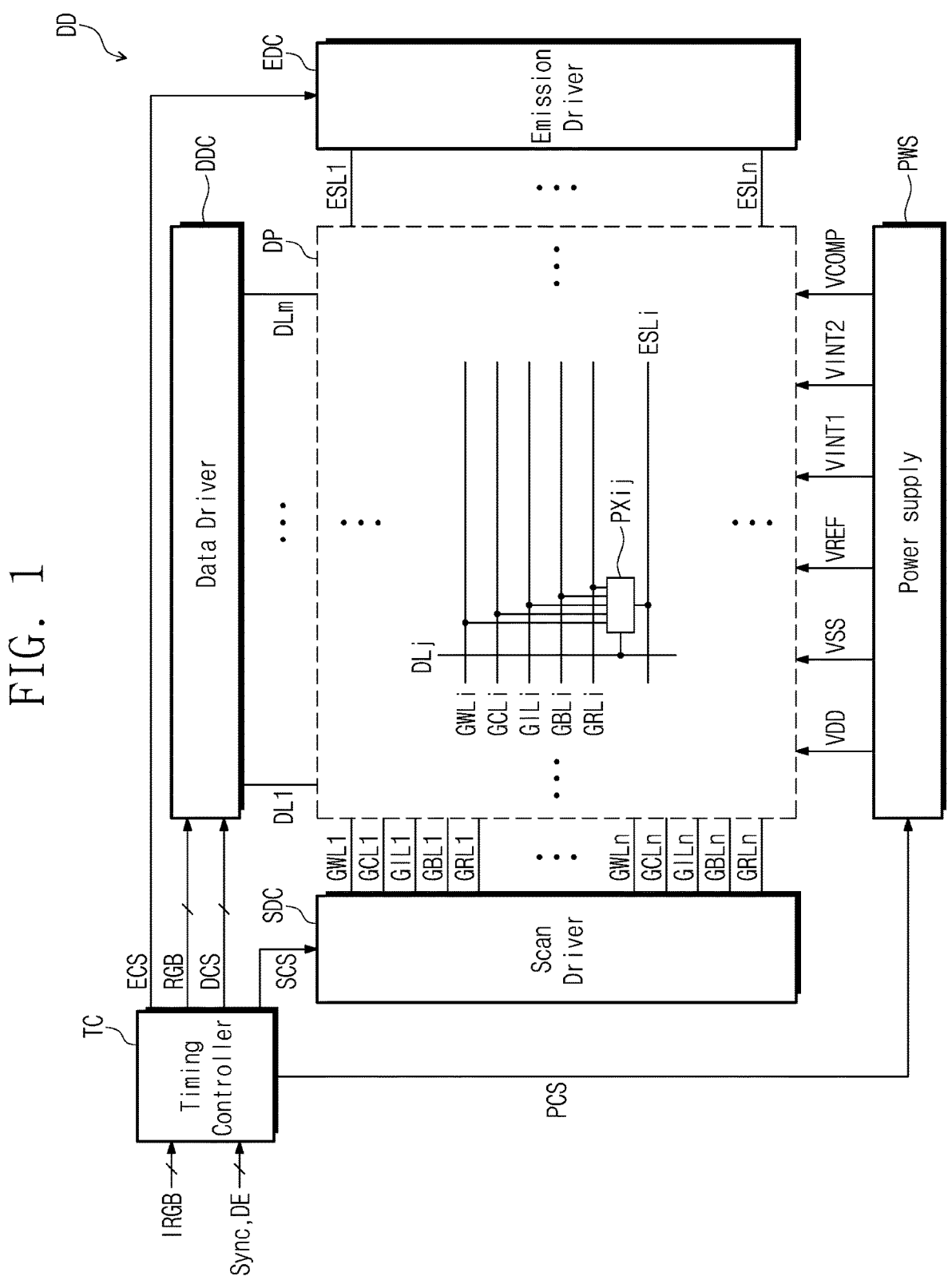
FIG. 1 is a block diagram of a display device according to an embodiment.

Since the disclosure may be variously modified and have various forms, embodiments will be illustrated and described in detail in the following. This, however, by no means restricts the disclosure to the disclosed embodiments, and it is to be understood as embracing all comprised in the spirit and scope of the disclosure changes, equivalents, and substitutes.

In this specification, when it is mentioned that a component (or, an area, a layer, a part, etc.) is referred to as being "on", "connected to" or "coupled to" another component, this means that the component may be directly on, connected to, or coupled to the other component or a third component or other components may be present therebetween.

Identical reference numerals refer to identical components. Additionally, in the drawings, the thicknesses, proportions, and dimensions of components are exaggerated for effective description.

Singular forms are intended to comprise plural forms unless the context clearly indicates otherwise.

In the specification and the claims, the term "and/or" is intended to include any combination of the terms "and" and "or" for the purpose of its meaning and interpretation.

For example, "A and/or B" may be understood to mean "A, B, or A and B." The terms "and" and "or" may be used in the conjunctive or disjunctive sense and may be understood to be equivalent to "and/or.

In the specification and the claims, the phrase "at least one of" is intended to include the meaning of "at least one selected from the group of" for the purpose of its meaning and interpretation. For example, "at least one of A and B" may be understood to mean "A, B, or A and B.

Terms such as first, second, and the like may be used to describe various components, but the components should not be limited by the terms. The terms may be used only for distinguishing one component from other components. For example, without departing the scope of the disclosure, a first component may be referred to as a second component, and similarly, the second component may also be referred to as the first component. The terms of a singular form may include plural forms unless otherwise specified.

Terms such as "below", "under", "above", and "over" are used to describe a relationship of components illustrated in the drawings. The terms are relative concepts and are described based on directions illustrated in the drawings.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied, all terms used herein, including technical or scientific terms, have the same meanings as those generally understood by those skilled in the art to which the disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the application.

It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

Hereinafter, embodiments will be described with reference to the accompanying drawings.

FIG. 1 is a block diagram of a display device according to an embodiment.

Referring to FIG. 1, the display device DD may include a display panel DP, a panel driver SDC, EDC, and DDC, a power supply PWS, and a timing controller TC. The panel driver SDC, EDC, and DDC may include a scan driver SDC, an emission driver EDC, and a data driver DDC.

In this embodiment, the display panel DP may be an emissive display panel. The emissive display panel may include an organic light emitting display panel, an inorganic light emitting display panel, or a quantum-dot light emitting display panel. Hereinafter, it will be described that the display panel is an organic light emitting display panel.

The display panel DP may include scan lines GWL1 to GWLn, GCL1 to GCLn, GIL1 to GILn, GBL1 to GBLn, and GRL1 to GRLn, emission lines ESL1 to ESLn, and data lines DL1 to DLm. "m" and "n" may be natural numbers greater than 1.

The display panel DP may include pixels PXij connected to the scan lines GWL1 to GWLn, GCL1 to GCLn, GIL1 to GILn, GBL1 to GBLn, and GRL1 to GRLn, the emission lines ESL1 to ESLn, and the data lines DL1 to DLm. For example, one pixel PXij disposed on the i-th horizontal line (or, the i-th pixel row) and the j-th vertical line (or, the j-th pixel column) is illustrated in FIG. 1. However, the pixels PXij may be substantially disposed in the display panel DP. "i" and "j" may be natural numbers.

The pixel PXij may be connected to the i-th first scan line (or, write scan line) GWLi, the i-th second scan line (or, compensation scan line) GCLi, the i-th third scan line (or, first initialization scan line) GILi, the i-th fourth scan line (or, second initialization scan line) GBLi, the i-th fifth scan line (or, reset scan line) GRLi, the j-th data line DLj, and the i-th emission line ESLi.

The pixel PXij may include a light emitting element, transistors, and capacitors. The pixel PXij may receive a first power supply voltage VDD, a second power supply voltage VSS, a third power supply voltage (or, a reference voltage) VREF, a fourth power supply voltage (or, a first initialization voltage) VINT1, a fifth power supply voltage (or, a second initialization voltage) VINT2, and a sixth power supply voltage (or, a compensation voltage) VCOMP through the power supply PWS.

The light emitting element may be driven by the first power supply voltage VDD and the second power supply voltage VSS. Voltage values of the first power supply voltage VDD and the second power supply voltage VSS may be set such that electric current flows through the light emitting element and the light emitting element emits light. For example, the first power supply voltage VDD may be set to a voltage value higher than the second power supply voltage VSS.

The third power supply voltage VREF may be a voltage for initializing a gate of a drive transistor of the pixel PXij. The fourth power supply voltage VINT1 may be a voltage for initializing a capacitor of the pixel PXij. The fifth power supply voltage VINT2 may be a voltage for initializing a cathode of the light emitting element of the pixel PXij.

The sixth power supply voltage VCOMP may provide a selectable current to the drive transistor in case that the threshold voltage of the drive transistor is compensated for. The sixth power supply voltage VCOMP may be set to a voltage value equal to the fifth power supply voltage VINT2. However, without being limited thereto, the sixth power supply voltage VCOMP may be set to a voltage value different from the fifth power supply voltage VINT2.

Although FIG. 1 illustrates one example that all of the first to sixth power supply voltages VDD, VSS, VREF, VINT1, VINT2, and VCOMP are provided from the power supply PWS to the display panel DP, embodiments are not limited thereto. For example, the first power supply voltage VDD and the second power supply voltage VSS may be provided to the display panel DP irrespective of the structure of the pixel PXij, and at least one voltage among the third, fourth, fifth, and sixth power supply voltages VREF, VINT1, VINT2, and VCOMP may not be provided to the display panel DP depending on the structure of the pixel PXij.

The scan driver SDC may receive a first control signal SCS from the timing controller TC and may generate scan signals in response to the first control signal SCS. The scan driver SDC may provide the scan signals to the first scan lines GWL1 to GWLn, the second scan lines GCL1 to GCLn, the third scan lines GIL1 to GILn, the fourth scan lines GBL1 to GBLn, and the fifth scan lines GRL1 to GRLn.

The scan signals may be set to voltage levels at which transistors receiving the scan signals are turned on. For example, a scan signal provided to a P-type transistor may be set to a logic low level, and a scan signal provided to an N-type transistor may be set to a logic high level. In an embodiment, the transistors of the pixel PXij may be N-type transistors.

In FIG. 1, for convenience of description, the scan driver SDC is illustrated as a single component. However, embodiments are not limited thereto. For example, the display device DD may include scan drivers for providing the scan signals to the first scan lines GWL1 to GWLn, the second scan lines GCL1 to GCLn, the third scan lines GIL1 to GILn, the fourth scan lines GBL1 to GBLn, and the fifth scan lines GRL1 to GRLn.

The emission driver EDC may receive a second control signal ECS from the timing controller TC and may generate emission signals in response to the second control signal ECS. The emission driver EDC may provide the emission signals to the emission lines ESL1 to ESLn.

The data driver DDC may receive a third control signal DCS and image data RGB from the timing controller TC. The data driver DDC may convert the digital image data RGB into analog data signals (for example, data voltages). The data driver DDC may provide the data signals to the data lines DL1 to DLm in response to the third control signal DCS.

In response to a fourth control signal PCS provided from the timing controller TC, the power supply PWS may generate the first power supply voltage VDD, the second power supply voltage VSS, the third power supply voltage VREF, the fourth power supply voltage VINT1, the fifth power supply voltage VINT2, and the sixth power supply voltage VCOMP to drive the pixel PXij.

The power supply PWS may provide the first power supply voltage VDD, the second power supply voltage VSS, the third power supply voltage VREF, the fourth power supply voltage VINT1, the fifth power supply voltage VINT2, and the sixth power supply voltage VCOMP to the display panel DP. The first power supply voltage VDD, the second power supply voltage VSS, the third power supply voltage VREF, the fourth power supply voltage VINT1, the fifth power supply voltage VINT2, and the sixth power supply voltage VCOMP may be provided to the pixel PXij through power supply lines (illustrated in FIG. 2A) that are connected to the pixel PXij.

The timing controller TC may generate the first control signal SCS, the second control signal ECS, the third control signal DCS, and the fourth control signal PCS, based on input image data IRGB, synchronization signals Sync (for example, vertical synchronization signals and horizontal synchronization signals), a data enable signal DE, and a clock signal.

The first control signal SCS may be provided to the scan driver SDC, and the second control signal ECS may be provided to the emission driver EDC. The third control signal DCS may be provided to the data driver DDC, and the fourth control signal PCS may be provided to the power supply PWS.

The timing controller TC may generate the image data RGB (or, frame data) by rearranging the input image data IRGB depending on the arrangement of the pixels PXij in the display panel DP.

The scan driver SDC, the emission driver EDC, the data driver DDC, the power supply PWS, and/or the timing controller TC may be directly formed on the display panel DP, or may be implemented with a separate driver IC and may be connected to the display panel DP. Furthermore, at least two of the scan driver SDC, the emission driver EDC, the data driver DDC, the power supply PWS, and the timing controller TC may be implemented with one driver IC. For example, the data driver DDC and the timing controller TC may be implemented with one driver IC.

Figure 2A:
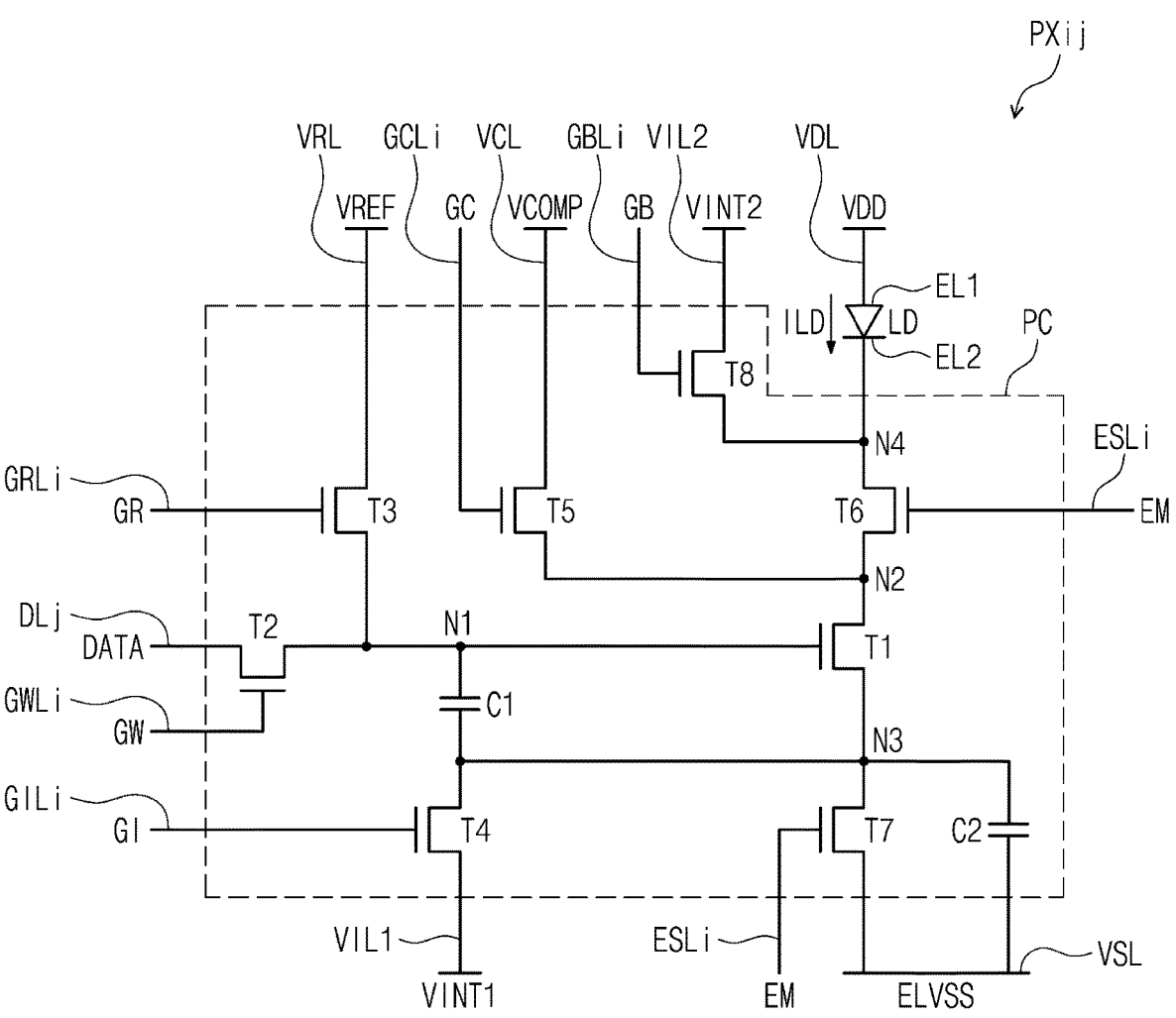
FIGS. 2A and 2B are schematic diagrams of equivalent circuits of pixels illustrated in FIG. 1 according to an embodiment.
Figure 2B:
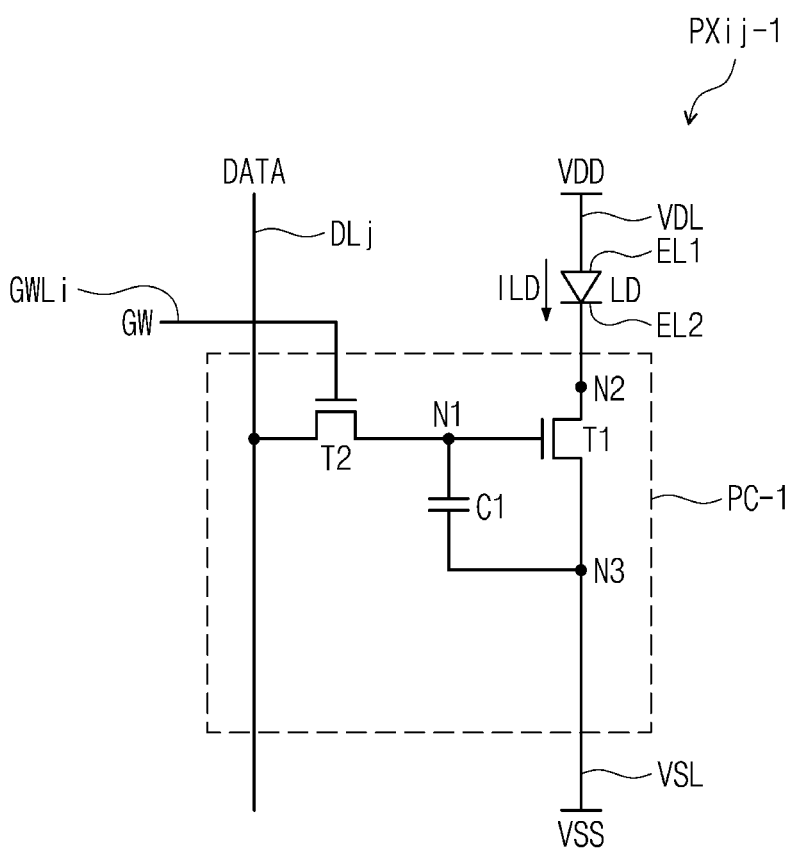

FIGS. 2A and 2B are schematic diagrams of equivalent circuits of pixels illustrated in FIG. 1 according to an embodiment.

Equivalent circuit diagrams of pixels PXij and PXij-1 connected to the i-th first scan line GWLi and the j-th data line DLj are illustrated in FIGS. 2A and 2B.

Referring to FIG. 2A, the pixel PXij may include a light emitting element LD and a pixel driver PC. The light emitting element LD may be connected between a first power supply line VDL and the pixel driver PC.

The light emitting element LD may include a first electrode EL1 (or, an anode), a second electrode EL2 (or, a cathode), and an emissive layer (illustrated in FIG. 7) between the first electrode EL1 and the second electrode EL2. The first power supply voltage VDD may be applied to the first electrode EL1, and the second power supply voltage VSS may be applied to the second electrode EL2.

The pixel driver PC may be connected to the i-th first scan line GWLi, the i-th second scan line GCLi, the i-th third scan line GILi, the i-th fourth scan line GBLi, the i-th fifth scan line GRLi, the j-th data line DLj (hereinafter, referred to as the data line), the i-th emission line ESLi (hereinafter, referred to as the emission line), and power supply voltage lines VDL, VSL, VIL1, VIL2, VRL, and VCL. The pixel driver PC may include first to eighth transistors T1 to T8, a first capacitor C1, and a second capacitor C2.

Hereinafter, the i-th first scan line GWLi, the i-th second scan line GCLi, the i-th third scan line GILi, the i-th fourth scan line GBLi, and the i-th fifth scan line GRLi are referred to as the write scan line GWLi, the compensation scan line GCLi, the first initialization scan line GILi, the second initialization scan line GBLi, and the reset scan line GRLi, respectively.

Hereinafter, it will be described that all of the first to eighth transistors T1 to T8 are N-type transistors. However, the disclosure is not limited thereto. A number of the first to eighth transistors T1 to T8 may be N-type transistors, and the other transistors may be P-type transistors. For example, the first to eighth transistors T1 to T8 may all be P-type transistors.

Each of the first to eighth transistors T1 to T8 may include a source, a drain, and a gate. Hereinafter, in FIGS. 2A and 2B, for convenience, one of the source and the drain is referred to as the first electrode, and the other is referred to as the second electrode.

The first transistor T1 may be switched by a voltage of a first node N1. The first transistor T1 may be connected to the second electrode EL2 of the light emitting element LD through the sixth transistor T6. The first transistor T1 may be connected to the second power supply line VSL through the seventh transistor T7.

The first transistor T1 may include the gate connected to the first node N1, the first electrode connected to a second node N2, and the second electrode connected to a third node N3. The first transistor T1 may be defined as a drive transistor.

Depending on the voltage of the first node N1, the first transistor T1 may control a drive current ILD flowing from the first power supply line VDL to the second power supply line VSL via the light emitting element LD. For this operation, the first power supply voltage VDD may be set to a voltage having a higher level than the second power supply voltage VSS.

The second transistor T2 may be connected between the first node N1 and the data line DLj and may be switched by a write scan signal GW. The second transistor T2 may include the gate connected to the write scan line GWLi, the first electrode connected to the data line DLj, and the second electrode connected to the first node N1. The data line DLj may receive a data signal DATA.

The second transistor T2 may provide the data signal DATA to the first node N1 in response to the write scan signal GW provided through the write scan line GWLi. The second transistor T2 may be turned on by the write scan signal GW and may electrically connect the data line DLj and the first node N1.

The third transistor T3 may be connected between the first node N1 and the reference voltage line VRL. The third transistor T3 may include the gate connected to the reset scan line GRLi, the first electrode connected to the reference voltage line VRL, and the second electrode connected to the first node N1.

The reference voltage line VRL may receive the reference voltage VREF, and the reset scan line GRLi may receive a reset scan signal GR. The third transistor T3 may be turned on in response to the reset scan signal GR and provide the reference voltage VREF to the first node N1.

The fourth transistor T4 may be connected between the third node N3 and the first initialization voltage line VIL1. The fourth transistor T4 may include the gate connected to the first initialization scan line GILi, the first electrode connected to the third node N3, and the second electrode connected to the first initialization voltage line VIL1.

The first initialization scan line GILi may receive a first initialization scan signal GI, and the first initialization voltage line VIL1 may receive the first initialization voltage VINT1. The fourth transistor T4 may be turned on in response to the first initialization scan signal GI and may provide the first initialization voltage VINT1 to the third node N3.

The fifth transistor T5 may be connected between the compensation voltage line VCL and the second node N2. The fifth transistor T5 may include the gate connected to the compensation scan line GCLi, the first electrode connected to the compensation voltage line VCL, and the second electrode connected to the second node N2.

The compensation scan line GCLi may receive a compensation scan signal GC, and the compensation voltage line VCL may receive the compensation voltage VCOMP. The fifth transistor T5 may be turned on in response to the compensation scan signal GC and may provide the compensation voltage VCOMP to the second node N2, and the threshold voltage of the first transistor T1 may be compensated for during a compensation period.

The sixth transistor T6 may be connected between the first transistor T1 and the light emitting element LD. The sixth transistor T6 may include the gate connected to the emission line ESLi, the first electrode connected to a fourth node N4, and the second electrode connected to the second node N2.

The emission line ESLi may receive an emission signal EM. The sixth transistor T6 may be turned on in response to the emission signal EM and may electrically connect the light emitting element LD and the first transistor T1.

The seventh transistor T7 may be connected between the second power supply line VSL and the third node N3. The seventh transistor T7 may include the gate connected to the emission line ESLi, the first electrode connected to the third node N3, and the second electrode connected to the second power supply line VSL.

The second power supply line VSL may receive the second power supply voltage VSS. The seventh transistor T7 may be turned on in response to the emission signal EM and may electrically connect the first transistor T1 and the second power supply line VSL.

In an embodiment, the sixth transistor T6 and the seventh transistor T7 may be connected to the same emission line ESLi and may be turned on the same emission signal EM. However, embodiments are not limited thereto. For example, the sixth transistor T6 and the seventh transistor T7 may be independently turned on by different signals distinguished from each other. Furthermore, in the pixel driver PC according to an embodiment, one of the sixth transistor T6 and the seventh transistor T7 may be omitted.

The eighth transistor T8 may be connected between the second initialization voltage line VIL2 and the fourth node N4. The eighth transistor T8 may include the gate connected to the second initialization scan line GBLi, the first electrode connected to the second initialization voltage line VIL2, and the second electrode connected to the fourth node N4.

The second initialization scan line GBLi may receive a second initialization scan signal GB, and the second initialization voltage line VIL2 may receive the second initialization voltage VINT2. The eighth transistor T8 may be turned on in response to the second initialization scan signal GB and may provide the second initialization voltage VINT2 to the fourth node N4 connected to the second electrode EL2 of the light emitting element LD. The second electrode EL2 of the light emitting element LD may be initialized by the second initialization voltage VINT2.

In an embodiment, the fifth and eighth transistors T5 and T8 may be turned on by the same scan signal and may receive the same voltage. For example, the fifth and eighth transistors T5 and T8 may be simultaneously turned on/off by the same compensation scan signal GC.

The compensation scan line GCLi and the second initialization scan line GBLi may be substantially provided as a single scan line. Accordingly, initialization of the cathode of the light emitting element LD and compensation of the threshold voltage of the first transistor T1 may be performed at the same timing.

In an embodiment, initialization of the second electrode EL2 of the light emitting element LD and compensation of the threshold voltage of the first transistor T1 may be performed with the same power supply voltage. For example, the compensation voltage line VCL and the second initialization voltage line VIL2 may be substantially provided as a single power supply voltage line. The initialization of the second electrode EL2 of the light emitting element LD and the compensation of the threshold voltage of the first transistor T1 may be performed with one power supply voltage, and thus the design of the driver may be simplified.

The first capacitor C1 may be connected between the first node N1 and the third node N3. The first capacitor C1 may store charges corresponding to a difference in voltage between the first node N1 and the third node N3. The first capacitor C1 may be defined as a storage capacitor.

The first capacitor C1 may include a first capacitor electrode connected to the first node N1 and a second capacitor electrode connected to the third node N3. The second capacitor electrode may be connected between the first transistor T1 and the second power supply line VSL. The first capacitor electrode may be connected to the gate of the first transistor T1, and the second capacitor electrode may be connected to the second electrode of the first transistor T1.

The second capacitor C2 may be connected between the third node N3 and the second power supply line VSL. The second capacitor C2 may include a third capacitor electrode connected to the third node N3 and a fourth capacitor electrode connected to the second power supply line VSL. The second capacitor C2 may store charges corresponding to a voltage difference between the second power supply voltage VSS and the second node N3. The second capacitor C2 may be defined as a hold capacitor.

The second capacitor C2 may have a higher storage capacity than the first capacitor C1. Accordingly, the second capacitor C2 may minimize a voltage change at the third node N3 in response to a voltage change at the first node N1.

The light emitting element LD may be connected with the pixel driver PC through the fourth node N4. The first electrode EL1 of the light emitting element LD may be connected to the first power supply line VDL, and the second electrode EL2 of the light emitting element LD may be connected to the fourth node N4. The light emitting element LD may be connected with the pixel driver PC through the second electrode EL2.

A connection node at which the light emitting element LD and the pixel driver PC are connected may be the fourth node N4, and the fourth node N4 may correspond to a connection node between the first electrode of the sixth transistor T6 and the second electrode EL2 of the light emitting element LD. Accordingly, the potential of the fourth node N4 may substantially correspond to the potential of the second electrode EL2 of the light emitting element LD.

The first power supply voltage VDD, which is a constant voltage, may be applied to the first electrode EL1 of the light emitting element LD, and the second electrode EL2 of the light emitting element LD may be connected to the first transistor T1 through the sixth transistor T6. According to this connecting structure, in this embodiment in which the first to eighth transistors T1 to T8 are N-type transistors, the potential of the third node N3 corresponding to the source of the first transistor T1, which is the drive transistor, may not be directly affected by characteristics of the light emitting element LD.

Even though the light emitting element LD is degraded, an effect on the transistors constituting the pixel driver PC may be reduced. By way of example, an effect on the gate-source voltage Vgs of the drive transistor due to the degradation of the light emitting element LD may be reduced. For example, even though the light emitting element LD is degraded, the amount of change in the drive current may be reduced. Thus, an after-image defect of the display panel DP depending on an increase in the time of use may be reduced, and the lifespan of the pixel PXij may be improved.

Referring to FIG. 2B, the pixel PXij-1 may include a pixel driver PC-1 that may include two transistors T1 and T2 and one capacitor C1. The pixel driver PC-1 may be connected to a light emitting element LD, the write scan line GWLi, the data line DLj, and the second power supply line VSL. The pixel driver PC-1 illustrated in FIG. 2B may have a structure in which the third to eighth transistors T3 to T8 and the second capacitor C2 are omitted from the pixel driver PC illustrated in FIG. 2A.

The first transistor T1 may include a gate connected to a first node N1, a first electrode connected to a second node N2, and a second electrode connected to a third node N3. The first transistor T1 may be connected to the light emitting element LD through the second node N2 and may be connected to the second power supply line VSL through the third node N3. The first transistor T1 may be defined as a drive transistor.

The second transistor T2 may include a gate that receives a write scan signal GW through the write scan line GWLi, a first electrode connected to the data line DLj, and a second electrode connected to the first node N1. The second transistor T2 may provide a data signal DATA to the first node N1 in response to the write scan signal GW provided through the write scan line GWLi.

The capacitor C1 may include the first capacitor electrode connected to the first node N1 and the second capacitor electrode connected to the third node N3. The capacitor C1 may store the data signal DATA transmitted to the first node N1.

A first electrode EL1 of the light emitting element LD may be connected with the first power supply line VDL, and a second electrode EL2 of the light emitting element LD may be connected with the pixel driver PC-1 through the second node N2. The second electrode EL2 may be connected to the first transistor T1. The light emitting element LD may emit light in response to the amount of current flowing through the first transistor T1 of the pixel driver PC-1.

Although the circuits for the pixel drivers PC and PC-1 according to the embodiments are illustrated in FIGS. 2A and 2B, the number of transistors or an arrangement relationship therebetween and the number of capacitors or an arrangement relationship therebetween may be designed in various ways.

Figure 3:
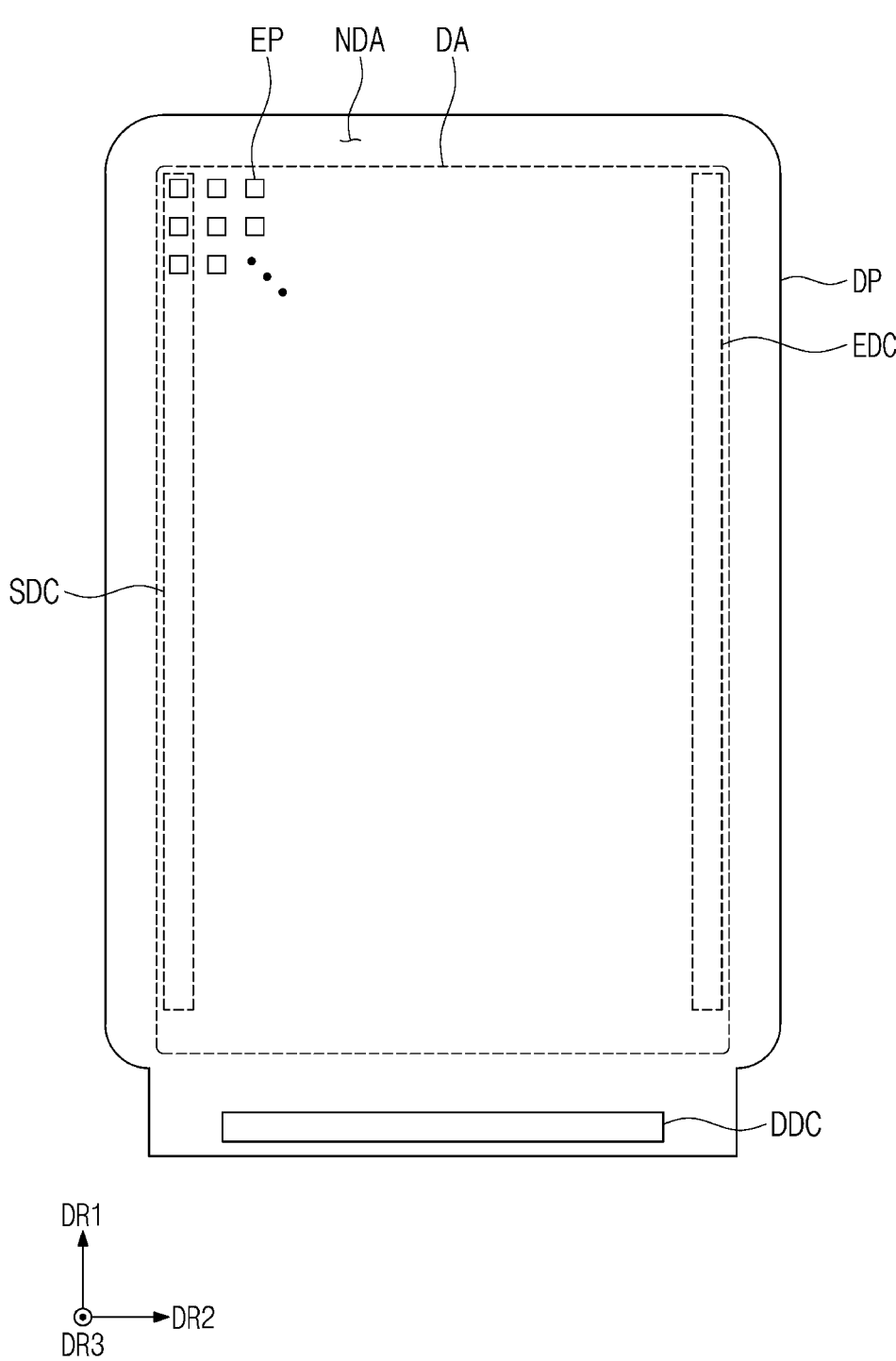
FIG. 3 is a schematic view illustrating a planar configuration of a display panel according to an embodiment.

FIG. 3 is a schematic view illustrating a planar configuration of the display panel according to an embodiment.

In FIG. 3, a number of components (for example, lines) of the display panel DP are omitted.

Referring to FIG. 3, the display panel DP may extend longer in a first direction DR1 than in a second direction DR2. The first direction DR1 and the second direction DR2 may be defined as directions intersecting each other. Hereinafter, a third direction DR3 may be defined as a direction intersecting a plane defined by the first and second directions DR1 and DR2. The expression "when viewed from above the plane" used herein may mean that it is viewed in the third direction DR3.

The display panel DP may include a display region DA and a non-display region NDA around the display region DA. The display region DA may include light emitting parts EP. The light emitting parts EP may be regions where light is emitted by the pixels PXij. For example, each of the light emitting parts EP may correspond to a region of a light emitting opening OP-PDL to be described below. The non-display region NDA may be disposed adjacent to the display region DA. In this embodiment, the non-display region NDA may surround the display region DA or may be adjacent to the display region DA.

In this embodiment, the scan driver SDC, the emission driver EDC, and the data driver DDC may be mounted on the display panel DP. For example, the scan driver SDC and the emission driver EDC may be disposed in the display region DA, and the data driver DDC may be disposed in the non-display region NDA. When viewed from above the plane, the data driver DDC may be disposed in the non-display region NDA adjacent to a lower side of the display panel DP.

The scan driver SDC and the emission driver EDC may overlap a number of the light emitting parts EP disposed in the display region DA on the plane. For example, the scan driver SDC and the emission driver EDC may overlap light emitting parts EP adjacent to opposite sides of the display region DA that face away from each other in the second direction DR2.

The above-described pixel drivers PC may not be disposed below the light emitting parts EP adjacent to the opposite sides of the display region DA. Accordingly, circuits that form the scan driver SDC and the emission driver EDC may be disposed below the light emitting parts EP adjacent to the opposite sides of the display region DA. This configuration will be described below in detail.

In a case in which the scan driver SDC and the emission driver EDC are disposed in the non-display region NDA, the non-display region NDA may be expanded. However, in an embodiment, the area of the non-display region NDA may be reduced since the scan driver SDC and the emission driver EDC are disposed in the display region DA without being disposed in the non-display region NDA.

Figure 4:
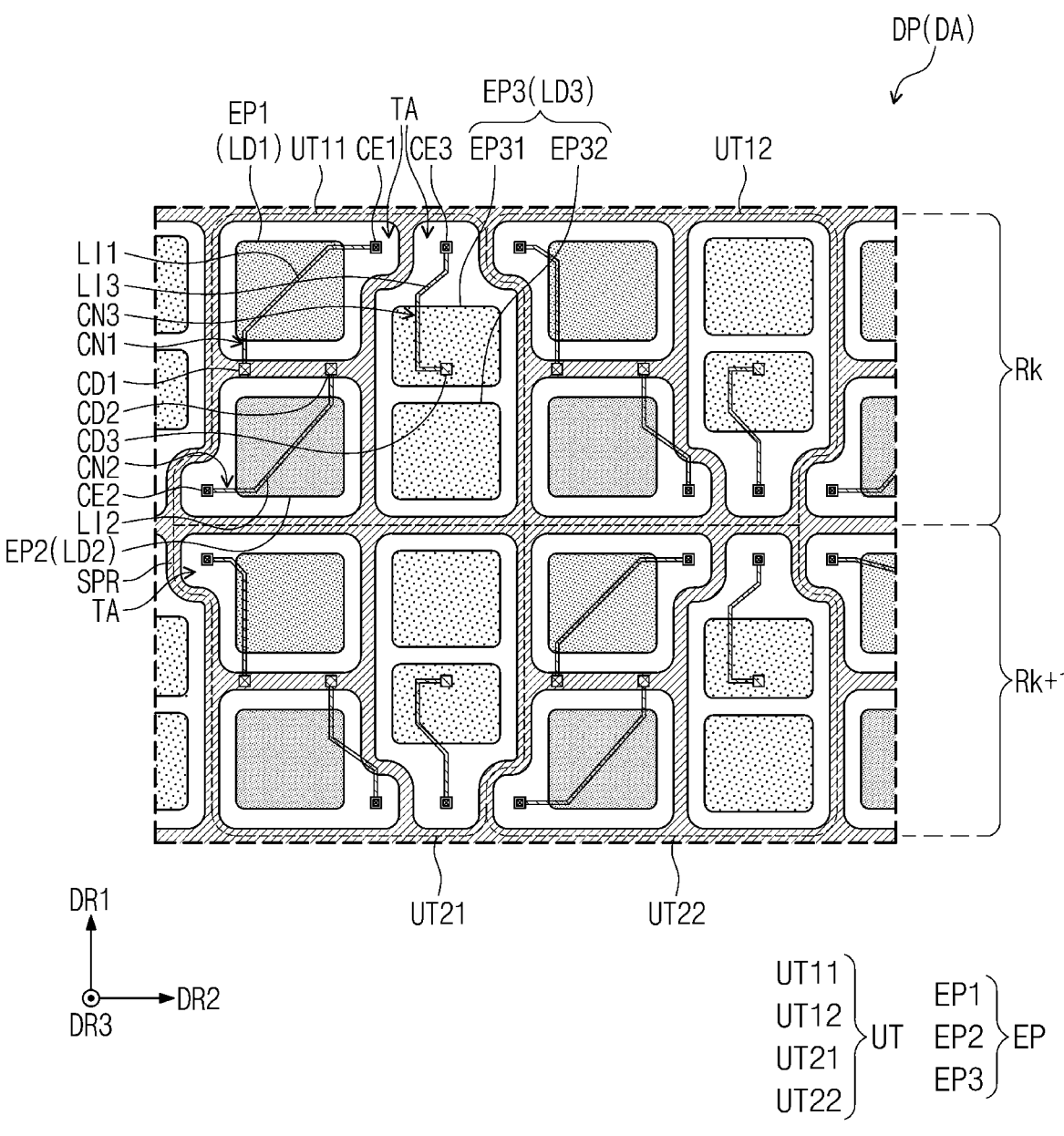
FIG. 4 is an enlarged schematic plan view illustrating a partial area of a display region of the display panel illustrated in FIG. 3.

FIG. 4 is an enlarged schematic plan view illustrating a partial area of the display region of the display panel illustrated in FIG. 3.

Referring to FIG. 4, the display panel DP may include light emitting parts EP, a separator SPR, and connecting lines CN1, CN2, and CN3. The light emitting parts EP may be disposed in regions divided from one another by the separator SPR.

The light emitting parts EP may include first light emitting parts EP1, second light emitting parts EP2, and third light emitting parts EP3. For example, the first light emitting parts EP1, the second light emitting parts EP2, and the third light emitting parts EP3 are illustrated with different hatching.

The first light emitting parts EP1, the second light emitting parts EP2, and the third light emitting parts EP3 may emit lights having different colors. For example, the first light emitting parts EP1 may emit red light, the second light emitting parts EP2 may emit green light, and the third light emitting parts EP3 may emit blue light.

Each of the third light emitting parts EP3 may include two third-first and third-second sub-light emitting parts EP31 and EP32 spaced apart from each other in the first direction DR1. However, this is illustrative, and the third light emitting part EP3 may be formed in one pattern having an integrated shape like the other light emitting parts EP1 and EP2. When viewed from above the plane, the third-first sub-light emitting part EP31 may have a smaller area than the third-second sub-light emitting part EP32. However, the areas of the third-first sub-light emitting part EP31 and the third-second sub-light emitting part EP32 are not limited thereto.

Each of the first, second, and third light emitting parts EP1, EP2, and EP3 may be a part corresponding to the light emitting opening OP-PDL (refer to FIG. 7) that will be described below. For example, each of the light emitting parts EP1, EP2, and EP3 may be defined as a region where light emitted by the light emitting element LD (refer to FIG. 7) is displayed. Each of the first, second, and third light emitting parts EP1, EP2, and EP3 may be defined as a region where the first electrode EL1, the emissive layer EML, and the second electrode EL2 constituting the light emitting element LD (refer to FIG. 7) overlap one another.

Accordingly, the first light emitting parts EP1 may be constituted by first light emitting elements LD1, the second light emitting parts EP2 may be constituted by second light emitting elements LD2, and the third light emitting parts EP3 may be constituted by third light emitting elements LD3. The first, second, and third light emitting elements LD1, LD2, and LD3 may have substantially the same configuration as the light emitting element LD illustrated in FIG. 7.

Figure 7:
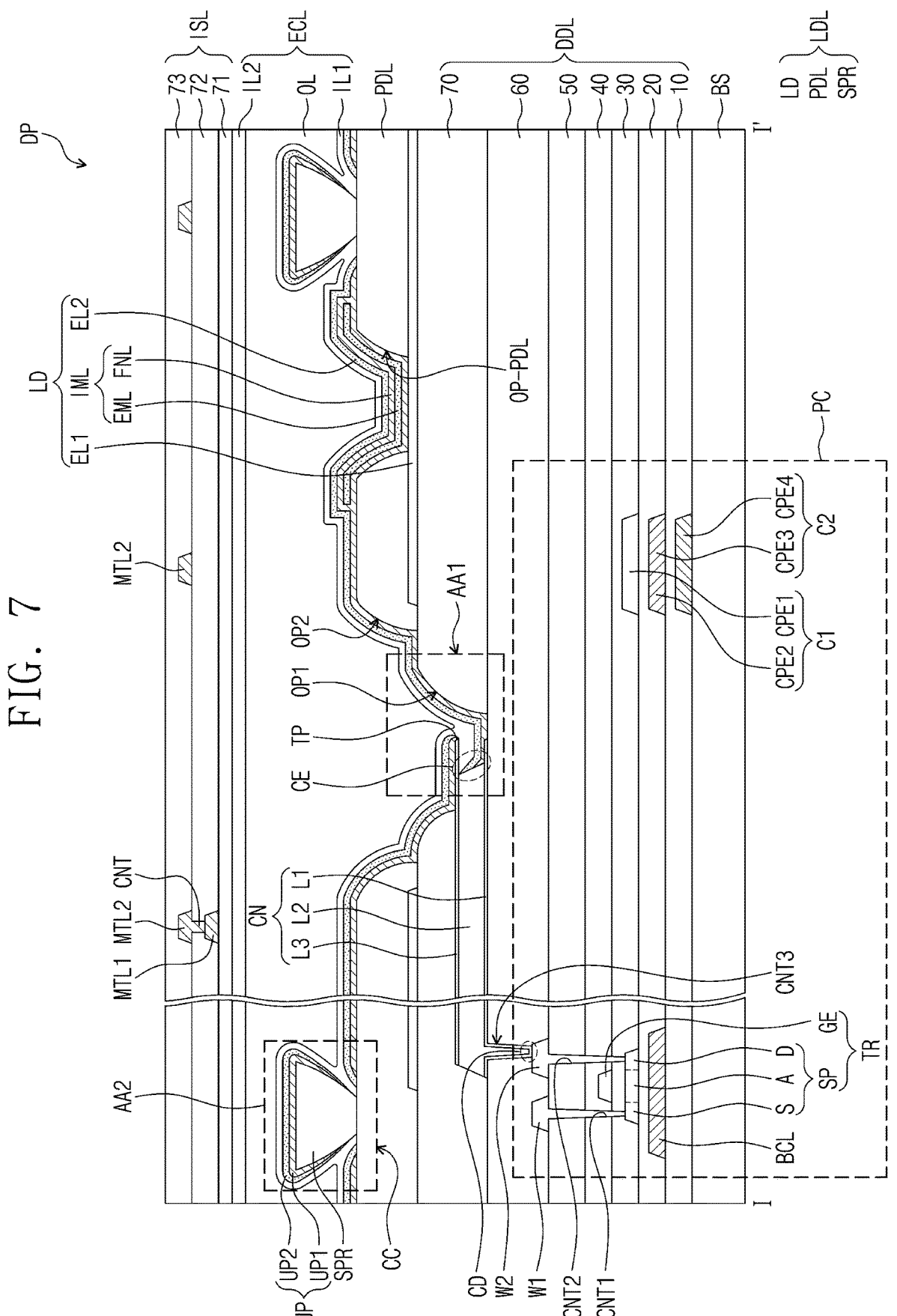
FIG. 7 is a sectional view taken along line I-I' illustrated in FIG. 5.

The first, second, and third light emitting parts EP1, EP2, and EP3 may be defined as emissive regions on the plane, and the first, second, and third light emitting elements LD1, LD2, and LD3 may be defined as components on the section illustrated in FIG. 7. Accordingly, the arrangement state of the first, second, and third light emitting parts EP1, EP2, and EP3 may substantially correspond to the arrangement state of the first, second, and third light emitting elements LD1, LD2, and LD3 on the plane.

The display panel DP may include light emitting units UT. The light emitting units UT may be disposed in the first direction DR1 and the second direction DR2. Each of the light emitting units UT may include the first light emitting part EP1, the second light emitting part EP2, and the third light emitting part EP3. Furthermore, each of the light emitting units UT may be construed as including the first light emitting element LD1, the second light emitting element LD2, and the third light emitting element LD3.

In each of the light emitting units UT, the first light emitting part EP1 may be spaced apart from the second light emitting part EP2 in the first direction DR1, and the third light emitting part EP3 may be spaced apart from the first and second light emitting parts EP1 and EP2 in the second direction DR2.

The light emitting units UT may be disposed in a first row Rk and a second row Rk+1. The rows may correspond to the second direction DR2. A first-first light emitting unit UT11 and a first-second light emitting unit UT12 may be repeatedly disposed in the first row Rk. A second-first light emitting unit UT21 and a second-second light emitting unit UT22 may be repeatedly disposed in the second row Rk+1.

The first-first light emitting unit UT11 and the second-first light emitting unit UT21 may be repeatedly disposed in the first direction DR1. The first-second light emitting unit UT12 and the second-second light emitting unit UT22 may be repeatedly disposed in the first direction DR1. The first direction DR1 may correspond to the columns.

The first, second, and third light emitting parts EP1, EP2, and EP3 of the first-first light emitting unit UT11 may have the same arrangement structure as the first, second, and third light emitting parts EP1, EP2, and EP3 of the second-second light emitting unit UT22. The first, second, and third light emitting parts EP1, EP2, and EP3 of the first-second light emitting unit UT12 may have the same arrangement structure as the first, second, and third light emitting parts EP1, EP2, and EP3 of the second-first light emitting unit UT21. Accordingly, configurations of the first-first light emitting unit UT11 and the first-second light emitting unit UT12 disposed in the first row Rk will be described below.

The third-first sub-light emitting part EP31 and the third-second sub-light emitting part EP32 of the first-first light emitting unit UT11 may be disposed opposite to the third-first sub-light emitting part EP31 and the third-second sub-light emitting part EP32 of the first-second light emitting unit UT12. In case that the third-first and third-second sub-light emitting parts EP31 and EP32 in the first-first light emitting unit UT11 are disposed in the order of the third-second sub-light emitting part EP32 and the third-first sub-light emitting part EP31, the third-first and third-second sub-light emitting parts EP31 and EP32 in the first-second light emitting unit UT12 may be disposed in the order of the third-first sub-light emitting part EP31 and the third-second sub-light emitting part EP32.

The third light emitting part EP3 of the first-first light emitting unit UT11 may be adjacent to a lower side of the first row Rk, and the third light emitting part EP3 of the first-second light emitting unit UT12 may be adjacent to an upper side of the first row Rk.

The connecting lines CN1, CN2, and CN3 may include the first connecting lines CN1 overlapping the first light emitting parts EP1, the second connecting lines CN2 overlapping the second light emitting parts EP2, and the third connecting lines CN3 overlapping the third light emitting parts EP3.

Each of the first connecting lines CN1 may include a first light emitting connection CE1, a first drive connection CD1 spaced apart from the first light emitting connection CE1, and a first extension line LI1 that bends and extends from the first light emitting connection CE1 to the first drive connection CD1. The first light emitting connection CE1 may extend from one side or a side of the first extension line LI1, and the first drive connection CD1 may extend from an opposite side of the first extension line LI1.

Each of the second connecting lines CN2 may include a second light emitting connection CE2, a second drive connection CD2 spaced apart from the second light emitting connection CE2, and a second extension line LI2 that bends and extends from the second light emitting connection CE2 to the second drive connection CD2. The second light emitting connection CE2 may extend from one side or a side of the second extension line LI2, and the second drive connection CD2 may extend from an opposite side of the second extension line LI2.

Each of the third connecting lines CN3 may include a third light emitting connection CE3, a third drive connection CD3 spaced apart from the third light emitting connection CE3, and a third extension line LI3 that bends and extends from the third light emitting connection CE3 to the third drive connection CD3. The third light emitting connection CE3 may extend from one side or a side of the third extension line LI3, and the third drive connection CD3 may extend from an opposite side of the third extension line LI3.

The first, second, and third drive connections CD1, CD2, and CD3 may be disposed in the second direction DR2 in a central portion of the first row Rk. The first, second, and third drive connections CD1, CD2, and CD3 may be connected to pixel drivers PC1, PC2, and PC3, respectively, which will be described below with reference to FIG. 5.

When viewed from above the plane, a number of the drive connections may overlap the separator SPR. For example, when viewed from above the plane, the first and second drive connections CD1 and CD2 may overlap the separator SPR, and the third drive connection CD3 may not overlap the separator SPR.

When viewed from above the plane, the first and second drive connections CD1 and CD2 may be disposed between the first light emitting part EP1 and the second light emitting part EP2 of each of the first-first and first-second light emitting units UT11 and UT12. When viewed from above the plane, the third drive connections CD3 may overlap the third-first sub-light emitting parts EP31.

When viewed from above the plane, the first, second, and third light emitting connections CE1, CE2, and CE3 may be spaced apart from the first light emitting parts EP1, EP2, and EP3 and may not overlap the first light emitting parts EP1, EP2, and EP3. The first, second, and third light emitting connections CE1, CE2, and CE3 may be connected to second electrodes EL2-1, EL2-2, and EL2-3 of the first, second, and third light emitting elements LD1, LD2, and LD3 constituting the first, second, and third light emitting parts EP1, EP2, and EP3, which will be described below with reference to FIG. 5.

The first and third light emitting connections CE1 and CE3 of the first-first light emitting unit UT11 and the first light emitting connection CE1 of the first-second light emitting unit UT12 may be disposed in the second direction DR2 and may be adjacent to each other. The first and third light emitting connections CE1 and CE3 of the first-first light emitting unit UT11 and the first light emitting connection CE1 of the first-second light emitting unit UT12 may be adjacent to the upper side in the region of the first row Rk.

The second light emitting connection CE2 of the first-first light emitting unit UT11 and the second and third light emitting connections CE2 and CE3 of the first-second light emitting unit UT12 may be disposed in the second direction DR2 and may be adjacent to each other. The second light emitting connection CE2 of the first-first light emitting unit UT11 and the second and third light emitting connections CE2 and CE3 of the first-second light emitting unit UT12 may be adjacent to the lower side in the region of the first row Rk.

The first and third light emitting connections CE1 and CE3 of the first-first light emitting unit UT11 and the first light emitting connection CE1 of the first-second light emitting unit UT12 may be disposed between the first light emitting part EP1 of the first-first light emitting unit UT11, the third-first sub-light emitting part EP31 of the first-first light emitting unit UT11, and the first light emitting part EP1 of the first-second light emitting unit UT12.

The second light emitting connection CE2 of the first-first light emitting unit UT11 and the second and third light emitting connections CE2 and CE3 of the first-second light emitting unit UT12 may be disposed between the second light emitting part EP2 of the first-first light emitting unit UT11, the second emitting part EP2 of the first-second light emitting unit UT12, and the third-first sub-light emitting part EP31 of the first-second light emitting unit UT12.

The regions divided from one another by the separator SPR may include tip regions TA having a protruding shape further spaced apart from the first, second, and third light emitting parts EP1, EP2, and EP3. The first, second, and third light emitting connections CE1, CE2, and CE3 may be disposed in the tip regions TA.

The first extension line LI1, when viewed from above the plane, may overlap the first light emitting part EP1 and may extend from the first light emitting connection CE1 to the first drive connection CD1. The second extension line LI2, when viewed from above the plane, may overlap the second light emitting part EP2 and may extend from the second light emitting connection CE2 to the second drive connection CD2. The third extension line LI3, when viewed from above the plane, may overlap the third light emitting part EP3 and may extend from the third light emitting connection CE3 to the third drive connection CD3.

Figure 5:
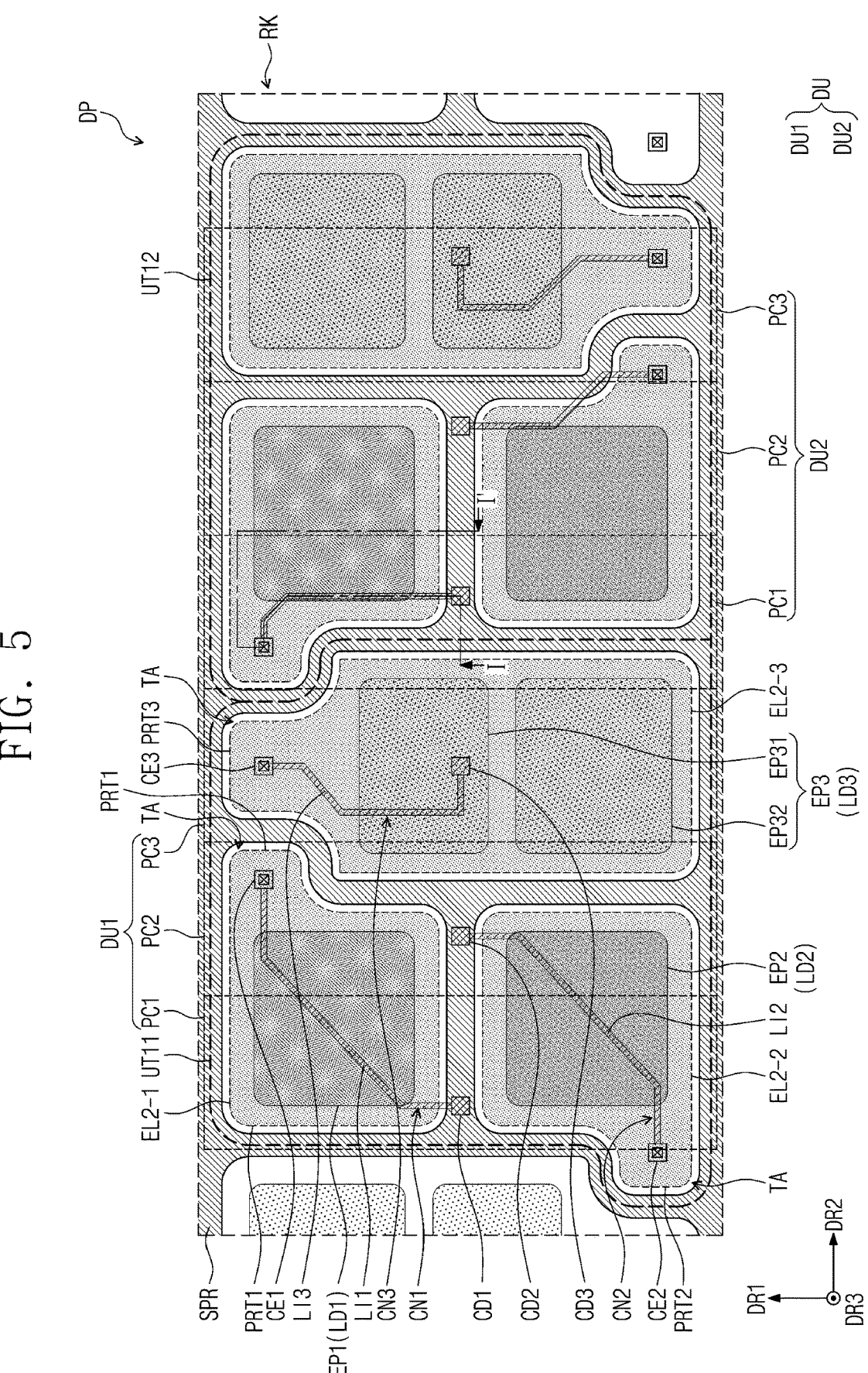
FIG. 5 is an enlarged view of light emitting units disposed in a first row illustrated in FIG. 4.

FIG. 5 is an enlarged view of the light emitting units disposed in the first row illustrated in FIG. 4.

Referring to FIG. 5, each of the light emitting units UT11 and UT12 may include the second electrodes EL2-1, EL2-2, and EL2-3. The second electrodes EL2-1, EL2-2, and EL2-3 may overlap the first, second, and third light emitting parts EP1, EP2, and EP3, respectively. The second electrodes EL2-1, EL2-2, and EL2-3 may be separated from one another by the separator SPR and may be electrically disconnected from one another.

In each of the light emitting units UT11 and UT12, the second electrodes EL2-1, EL2-2, and EL2-3 may include the electrode 2-1 EL2-1 overlapping the first light emitting part EP1, the electrode 2-2 EL2-2 overlapping the second light emitting part EP2, and the electrode 2-3 EL2-3 overlapping the third light emitting part EP3. The electrode 2-1 EL2-1, the electrode 2-2 EL2-2, and the electrode 2-3 EL2-3 may be defined as cathodes. Each of the electrode 2-1 EL2-1, the electrode 2-2 EL2-2, and the electrode 2-3 EL2-3 may correspond to the second electrode EL2 illustrated in FIGS. 2A and 7.

The electrode 2-1 EL2-1 may be the cathode of the first light emitting element LD1 that forms the first light emitting part EP1. The electrode 2-2 EL2-2 may be the cathode of the second light emitting element LD2 that forms the second light emitting part EP2. The electrode 2-3 EL2-3 may be the cathode of the third light emitting element LD3 that forms the third light emitting part EP3.

The electrode 2-1 EL2-1, the electrode 2-2 EL2-2, and the electrode 2-3 EL2-3, when viewed from above the plane, may have larger areas than the first, second, and third light emitting parts EP1, EP2, and EP3, respectively. The first, second, and third light emitting parts EP1, EP2, and EP3 may have a quadrangular shape, and the electrode 2-1 EL2-1, the electrode 2-2 EL2-2, and the electrode 2-3 EL2-3 may have an irregular shape.

The electrode 2-1 EL2-1, the electrode 2-2 EL2-2, and the electrode 2-3 EL2-3, when viewed from above the plane, may include first, second, and third protrusions PRT1, PRT2, and PRT3 further spaced apart from the first, second, and third light emitting parts EP1, EP2, and EP3. The first, second, and third protrusions PRT1, PRT2, and PRT3 may overlap the tip regions TA, respectively.

When viewed from above the plane, in each of the light emitting units UT11 and UT12, the first protrusion PRT1 may overlap the first light emitting connection CE1, the second protrusion PRT2 may overlap the second light emitting connection CE2, and the third protrusion PRT3 may overlap the third light emitting connection CE3.

The display panel DP may include drive units DU1 and DU2 disposed in the second direction DR2. The drive units DU1 and DU2 may include the first drive unit DU1 corresponding to the first-first light emitting unit UT11 and the second drive unit DU2 corresponding to the first-second light emitting unit UT12.

Each of the first and second drive units DU1 and DU2 may include the first pixel driver PC1, the second pixel driver PC2, and the third pixel driver PC3. The first, second, and third pixel drivers PC1, PC2, and PC3 may be sequentially disposed in the second direction DR2. For example, the regions of the first, second, and third pixel drivers PC1, PC2, and PC3 on the plane are illustrated as dotted quadrangles.

The first, second, and third pixel drivers PC1, PC2, and PC3 may have substantially the same configuration as the pixel driver PC illustrated in FIG. 2A. The first, second, and third pixel drivers PC1, PC2, and PC3 may be electrically connected to the first, second, and third light emitting elements LD1, LD2, and LD3 constituting the first, second, and third light emitting parts EP1, EP2, and EP3. The first, second, and third pixel drivers PC1, PC2, and PC3 may be disposed below the first, second, and third light emitting elements LD1, LD2, and LD3.

The first and second drive units DU, when viewed from above the plane, may have smaller areas than the first-first and first-second light emitting units UT11 and UT12, respectively. A detailed area comparison between the first and second drive units DU and the first-first and first-second light emitting units UT11 and UT12 will be for example illustrated in FIG. 11 below.

For example, in each of the first and second drive units DU1 and DU2, the first pixel driver PC1 may overlap the first light emitting part EP1 and the second light emitting part EP2, and the second pixel driver PC2 may overlap the first light emitting part EP1 and the second light emitting part EP2. In each of the first and second drive units DU1 and DU2, the third pixel driver PC3 may overlap the third light emitting part EP3.

However, this is illustrative, and the first, second, and third pixel drivers PC1, PC2, and PC3 may overlap various portions of the first, second, and third light emitting parts EP1, EP2, and EP3 depending on an arrangement of the first and second drive units DU1 and DU2.

The first-first light emitting unit UT11 may be connected to the first drive unit DU1, and the first-second light emitting unit UT12 may be connected to the second drive unit DU2. The first-first and first-second light emitting units UT11 and UT12 and the first and second drive units DU1 and DU2 may be connected with each other by the first, second, and third connecting lines CN1, CN2, and CN3. Hereinafter, a connection configuration of the first-first light emitting unit UT11 and the first drive unit DU1 will be described as an example.

The first connecting line CN1 may be connected to the first pixel driver PC1 and the first light emitting element LD1 constituting the first light emitting part EP1. For example, the first light emitting connection CE1 may be connected to the electrode 2-1 EL2, and the first drive connection CD1 may be connected to the first pixel driver PC1. Accordingly, the first light emitting element LD1 and the first pixel driver PC1 may be connected with each other.

The first light emitting connection CE1 may be connected to the first protrusion PRT1 of the electrode 2-1 EL2. Accordingly, the electrode 2-1 EL2-1 may be electrically connected to the first light emitting connection CE1. The electrode 2-1 EL2-1 may be connected to the first connecting line LI1 by the first light emitting connection CE1.

The first drive connection CD1 may substantially correspond to the fourth node N4 illustrated in FIG. 2A. For example, the first drive connection CD1 may be connected to the fourth node N4 of the first pixel driver PC1. For example, the first pixel driver PC1 may be connected to the first connecting line LI1 by the first drive connection CD1.

The second connecting line CN2 may be connected to the second pixel driver PC2 and the second light emitting element LD2 constituting the second light emitting part EP2. For example, the second light emitting connection CE2 may be connected to the electrode 2-2 EL2-2, and the second drive connection CD2 may be connected to the second pixel driver PC2. Accordingly, the second light emitting element LD2 and the second pixel driver PC2 may be connected with each other.

The second light emitting connection CE2 may be connected to the second protrusion PRT2 of the electrode 2-2 EL2-2. Accordingly, the electrode 2-2 EL2-2 may be electrically connected to the second light emitting connection CE2. The electrode 2-2 EL2-2 may be connected to the second connecting line LI2 by the second light emitting connection CE2.

The second drive connection CD2 may substantially correspond to the fourth node N4 illustrated in FIG. 2A. For example, the second drive connection CD2 may be connected to the fourth node N4 of the second pixel driver PC2. For example, the second pixel driver PC2 may be connected to the second connecting line LI2 by the second drive connection CD2.

The third connecting line CN3 may be connected to the third pixel driver PC3 and the third light emitting element LD3 constituting the third light emitting part EP3. For example, the third light emitting connection CE3 may be connected to the electrode 2-3 EL2-3, and the third drive connection CD3 may be connected to the third pixel driver PC3. Accordingly, the third light emitting element LD3 and the third pixel driver PC3 may be connected with each other.

The third light emitting connection CE3 may be connected to the third protrusion PRT3 of the electrode 2-3 EL2-3. Accordingly, the electrode 2-3 EL2-3 may be electrically connected to the third light emitting connection CE3. The electrode 2-3 EL2-3 may be connected to the third connecting line LI3 by the third light emitting connection CE3.

The third drive connection CD3 may substantially correspond to the fourth node N4 illustrated in FIG. 2A. For example, the third drive connection CD3 may be connected to the fourth node N4 of the third pixel driver PC3. For example, the third pixel driver PC3 may be connected to the third connecting line LI3 by the third drive connection CD3.

Figure 6:
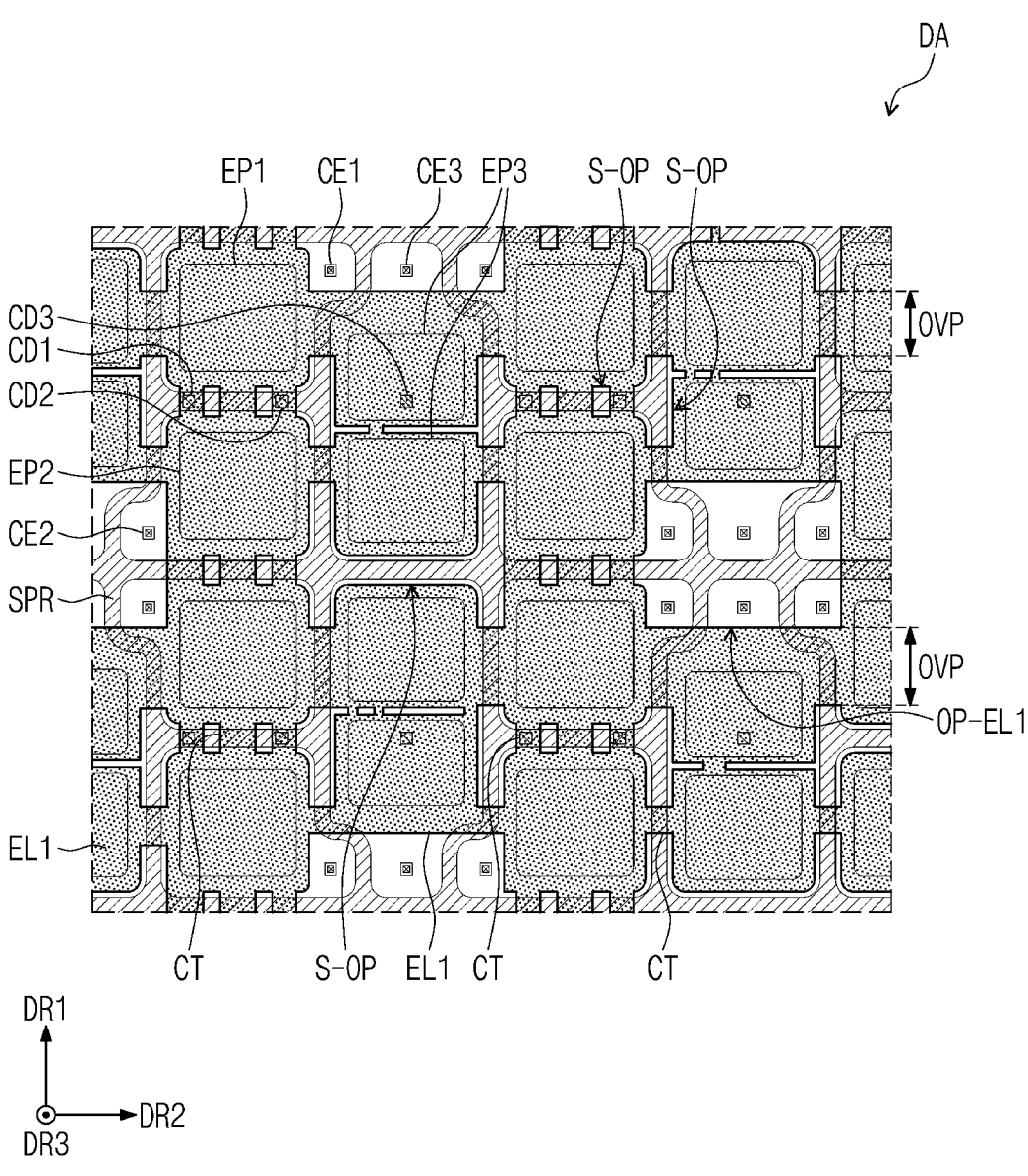
FIG. 6 is a view illustrating a first electrode of a light emitting device in the configuration illustrated in FIG. 4.

FIG. 6 is a view illustrating a first electrode of a light emitting device in the configuration illustrated in FIG. 4.

In FIG. 6, the extension lines illustrated in FIG. 4 are omitted.

Referring to FIG. 6, the first electrode EL1 may correspond to the first electrode EL1 illustrated in FIG. 2A. The first electrode EL1 may be an anode of the first, second, and third light emitting elements LD1, LD2, and LD3. The first electrode EL1 may be commonly provided for the first, second, and third light emitting elements LD1, LD2, and LD3.

The first electrode EL1 may overlap the first, second, and third light emitting parts EP1, EP2, and EP3 when viewed from above the plane. The first electrode EL1 may overlap the first, second, and third drive connections CD1, CD2, and CD3 when viewed from above the plane. The first electrode EL1 may not overlap the first, second, and third light emitting connections CE1, CE2, and CE3 when viewed from above the plane.

Openings OP-EL1 overlapping the first, second, and third light emitting connections CE1, CE2, and CE3 may be defined by removal of selectable portions of the first electrode EL1 that overlap the first, second, and third light emitting connections CE1, CE2, and CE3. The first electrode EL1 may be partially opened to expose portions of the separator SPR. For example, openings S-OP may be defined in portions of the first electrode EL1 that overlap the portions of the separator SPR.

The first electrode EL1 may be divided into portions overlapping the first, second, and third light emitting parts EP1, EP2, and EP3 and may be defined as first electrodes EL1 overlapping the first, second, and third light emitting parts EP1, EP2, and EP3. For example, the first electrode EL1 may include first electrodes EL1 of the first light emitting elements LD1, first electrodes EL1 of the second light emitting elements LD2, and first electrodes EL1 of the third light emitting elements LD3. Hereinafter, in FIG. 6, the first electrode EL1 will be described as the first electrodes EL1 of the first, second, and third light emitting elements LD1, LD2, and LD3.

The first electrodes EL1 of the first, second, and third light emitting elements LD1, LD2, and LD3 may be connected together and may be integral. To integrally form the first electrodes EL1, the first, second, and third light emitting elements LD1, LD2, and LD3 may include connecting electrodes CT that are disposed between the first electrodes EL1 and that extend from the first electrodes EL1.

Connecting electrodes CT may be provided between the first light emitting parts EP1 and the second light emitting parts EP2. A single connecting electrode CT may be provided between the first light emitting parts EP1 and the third light emitting parts EP3. A single connecting electrode CT may be provided between the second light emitting parts EP2 and the third light emitting parts EP3.

The integral first electrodes EL1 may include overlapping parts OVP extending in the second direction DR2. The overlapping part OVP may be adjacent to the first, second, and third light emitting connections CE1, CE2, and CE3. Functions of the overlapping parts OVP will be described below in detail.

Figure 8:
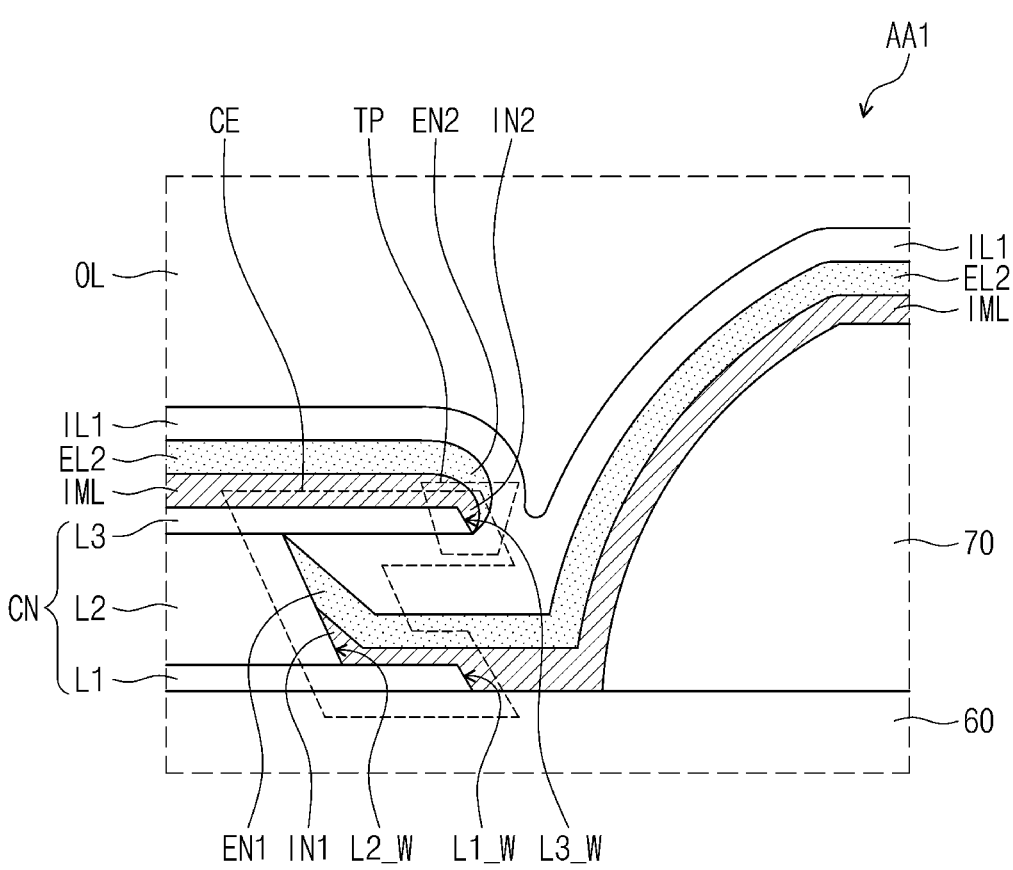
FIG. 8 is an enlarged view of a first region AA1 illustrated in FIG. 7.
Figure 9:
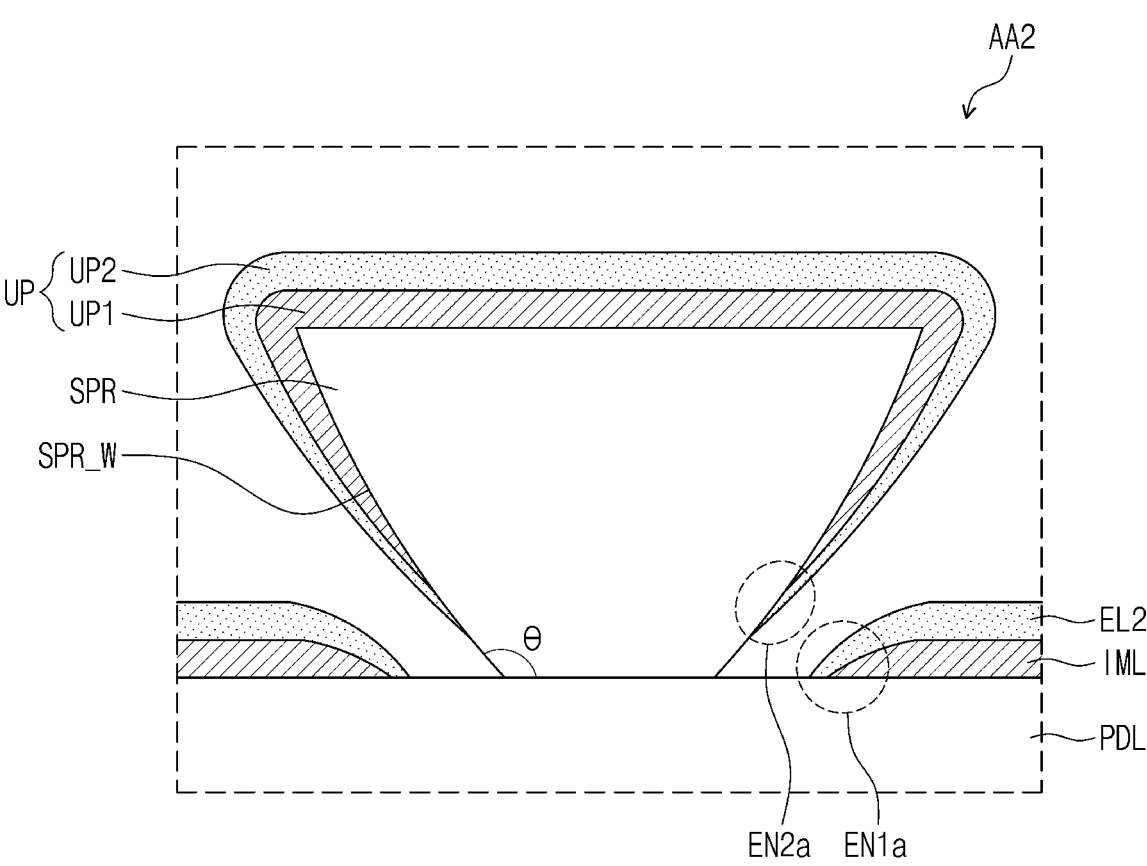
FIG. 9 is an enlarged view of a second region AA2 illustrated in FIG. 7.

FIG. 7 is a sectional view taken along line I-I' illustrated in FIG. 5. FIG. 8 is an enlarged view of a first region AA1 illustrated in FIG. 7. FIG. 9 is an enlarged view of a second region AA2 illustrated in FIG. 7.

Referring to FIG. 7, the display panel DP may include a base layer BS, a drive element layer DDL, a light emitting element layer LDL, an encapsulation layer ECL, and a sensing layer ISL. In FIG. 7, a section of a partial area of a region in which one light emitting part is disposed is illustrated as an example.

The base layer BS may be a member that provides a base surface on which a pixel driver PC is disposed. The base layer BS may be a rigid substrate, or may be a flexible substrate that is bendable, foldable, or rollable. The base layer BS may be a glass substrate, a metal substrate, or a polymer substrate.

The drive element layer DDL may include first to sixth insulating layers 10 to 60 be sequentially stacked each other on the base layer BS and the pixel driver PC. The pixel driver PC may be disposed on the base layer BS. The pixel driver PC may be one of the first, second, and third pixel drivers PC1, PC2, and PC3 illustrated in FIG. 5.

A transistor TR and first and second capacitors C1 and C2 of the pixel driver PC may be disposed on the base layer BS. The transistor TR may be the sixth transistor T6 illustrated in FIG. 2A. The transistor TR may be defined as a connection transistor connected to the fourth node N4 illustrated in FIG. 2A. Although not illustrated, other transistors of the pixel driver PC may also be disposed on the base layer BS and may have the same configuration as the transistor TR illustrated in FIG. 7.

The first insulating layer 10 may be disposed on the base layer BS. A lower conductive layer BCL may be disposed on the first insulating layer 10. The second insulating layer 20 may be disposed on the lower conductive layer BCL. The second insulating layer 20 may be disposed on the first insulating layer 10 to cover the lower conductive layer BCL.

The lower conductive layer BCL may block an influence of an electrical potential due to a polarization phenomenon of the base layer BS on the transistor TR. The lower conductive layer BCL may block light incident to the transistor TR from below the base layer BS. To achieve this, the lower conductive layer BCL may include a reflective metal.

Although not illustrated, the lower conductive layer BCL may be connected to a source electrode pattern W1. However, without being limited thereto, the lower conductive layer BCL may be connected to a gate of the transistor TR. For example, the lower conductive layer BCL may be provided in a form isolated from another conductive pattern. A constant voltage may be applied to the lower conductive layer BCL.

The transistor TR may be disposed on the second insulating layer 20. The transistor TR may include a semiconductor pattern SP and a gate electrode GE. The semiconductor pattern SP may be disposed on the second insulating layer 20.

The semiconductor pattern SP may include an oxide semiconductor. For example, the oxide semiconductor may include transparent conductive oxide (TCO) such as indium tin oxide (ITO), indium zinc oxide (IZO), indium gallium zinc oxide (IGZO), zinc oxide ($ZnO_x$), or indium oxide ($In_2O_3$). However, without being limited thereto, the semiconductor pattern SP may include amorphous silicon, low-temperature polycrystalline silicon, or polycrystalline silicon.

The semiconductor pattern SP may include a source region S, a drain region D, and a channel region A that are distinguished from one another depending on the degree of conductivity. The channel region A may be a portion of the semiconductor pattern SP that overlaps the gate electrode GE on the plane. The source region S and the drain region D may be portions of the semiconductor pattern SP spaced apart from each other with the channel region A therebetween.

The source region S and the drain region D may have a higher conductivity than the channel region A. The source region S may correspond to a source electrode of the transistor TR, and the drain region D may correspond to a drain electrode of the transistor TR.

The third insulating layer 30 may be disposed on the semiconductor pattern SP. The third insulating layer 30 may be disposed on the second insulating layer 20 to cover the semiconductor pattern SP.

The gate electrode GE of the transistor TR may be disposed on the third insulating layer 30. The gate electrode GE may be disposed over the semiconductor pattern SP and may overlap the channel region A. The gate electrode GE of the transistor TR may function as the gate of the transistor TR.

The fourth insulating layer 40 may be disposed on the gate electrode GE. The fourth insulating layer 40 may be disposed on the third insulating layer 30 to cover the gate electrode GE. The fifth insulating layer 50 may be disposed on the fourth insulating layer 40, and the source electrode pattern W1 and a drain electrode pattern W2 may be disposed on the fifth insulating layer 50. The first to fifth insulating layers 10 to 50 may be inorganic layers or organic layers.

The source electrode pattern W1 may be connected to the source region S of the transistor TR through a first contact hole CNT1 defined in the third, fourth, and fifth insulating layers 30, 40, and 50. The source electrode pattern W1 and the source region S of the semiconductor pattern SP may function as a source of the connection transistor TR.

The drain electrode pattern W2 may be connected to the drain region D of the transistor TR through a second contact hole CNT2 defined in the third, fourth, and fifth insulating layers 30, 40, and 50. The drain electrode pattern W2 and the drain region D of the semiconductor pattern SP may function as a drain of the connection transistor TR.

The sixth insulating layer 60 may be disposed on the source electrode pattern W1 and the drain electrode pattern W2. The sixth insulating layer 60 may be an organic layer.

The first capacitor C1 may include a first capacitor electrode CPE1 and a second capacitor electrode CPE2 disposed below the first capacitor electrode CPE1. The first capacitor electrode CPE1 and the second capacitor electrode CPE2 may overlap each other when viewed from above the plane. The first capacitor electrode CPE1 may be connected to the above-described first node N1, and the second capacitor electrode CPE2 may be connected to the above-described third node N3.

The first capacitor electrode CPE1 may be disposed in the same layer as the semiconductor pattern SP, and the second capacitor electrode CPE2 may be disposed in the same layer as the lower conductive layer BCL. The first capacitor electrode CPE1 and the semiconductor pattern SP may be formed of the same material or a similar material and may be simultaneously subjected to patterning. The second capacitor electrode CPE2 and the lower conductive layer BCL may be formed of the same material or a similar material and may be simultaneously subjected to patterning.

The second capacitor C2 may include a third capacitor electrode CPE3 and a fourth capacitor electrode CPE4 disposed below the third capacitor electrode CPE3. The third capacitor electrode CPE3 and the fourth capacitor electrode CPE4 may overlap each other when viewed from above the plane. The third capacitor electrode CPE3 may be connected to the above-described third node N3, and the fourth capacitor electrode CPE4 may be connected to the above-described second power supply line VSL. The third capacitor electrode CPE3 and the lower conductive layer BCL may be formed of the same material or a similar material and may be simultaneously subjected to patterning.

The third capacitor electrode CPE3 may be substantially the second capacitor electrode CPE2. For example, the first capacitor C1 and the second capacitor C2 may share one capacitor electrode.

The fourth capacitor electrode CPE4 may be disposed on the base layer BS. The first insulating layer 10 may be disposed on the base layer BS to cover the fourth capacitor electrode CPE4.

A connecting line CN may be disposed on the sixth insulating layer 60. The connecting line CN may be one of the first, second, and third connecting lines CN1, CN2, and CN3 illustrated in FIG. 4. The connecting line CN may electrically connect the pixel driver PC and a light emitting element LD. For example, the connecting line CN may electrically connect the transistor TR and the light emitting element LD.

A seventh insulating layer 70 may be disposed on the connecting line CN. The seventh insulating layer 70 may be disposed on the sixth insulating layer 60 to cover the connecting line CN. The seventh insulating layer 70 may be an organic layer.

The seventh insulating layer 70 may include an opening for exposing at least a portion of the connecting line CN. The portion of the connecting line CN exposed from the seventh insulating layer 70 may be electrically connected to the light emitting element LD.

The connecting line CN may include a drive connection CD, an extension line LI, and a light emitting connection CE. The drive connection CD may be one of the first, second, and third drive connections CD1, CD2, and CD3 illustrated in FIG. 4, the extension line LI may be one of the first, second, and third extension lines LI1, LI2, and LI3 illustrated in FIG. 4, and the light emitting connection CE may be one of the first, second, and third light emitting connections CE1, CE2, and CE3 illustrated in FIG. 4.

A portion of the connecting line CN connected to the transistor TR may be defined as the drive connection CD, and a portion of the connecting line CN connected to the light emitting element LD may be defined as the light emitting connection CE.

The drive connection CD may be connected to the drain electrode pattern W2 through a third contact hole CNT3 defined in the sixth insulating layer 60. Accordingly, the connecting line CN may be electrically connected to the transistor TR through the drive connection CD.

The portion of the connecting line CN exposed from the seventh insulating layer 70 may be defined as the light emitting connection CE. The light emitting connection CE may be electrically connected to a second electrode EL2 of the light emitting element LD. This configuration will be described below in detail with reference to FIG. 8.

The light emitting element layer LDL may be disposed on the seventh insulating layer 70. The light emitting element layer LDL may include a pixel defining layer PDL, the light emitting element LD, and a separator SPR. The pixel defining layer PDL may be an organic layer. In an embodiment, the pixel defining layer PDL may have a property of absorbing light. For example, the pixel defining layer PDL may be black in color. The pixel defining layer PDL may be a light blocking pattern having light blocking characteristics.

An opening OP-PDL (hereinafter, referred to as the light emitting opening) for exposing a portion of a first electrode EL1 may be defined in the pixel defining layer PDL. Components of the light emitting element LD may be disposed in the light emitting opening OP-PDL to overlap one another, and the light emitting opening OP-PDL may be a region in which light emitted by the light emitting element LD is substantially displayed. The shape of the above-described light emitting part EP (refer to FIG. 4) may substantially correspond to the region of the light emitting opening OP-PDL on the plane.

The light emitting element LD may include the first electrode EL1, an intermediate layer IML, and the second electrode EL2. The first electrode EL1 may be an anode of the light emitting element LD. For example, the first electrode EL1 may be connected to the first power supply line VDL (refer to FIG. 2A) and may receive the first power supply voltage VDD (refer to FIG. 2A).

The first electrode EL1 may be disposed on the seventh insulating layer 70, and the pixel defining layer PDL may be disposed on the first electrode EL1. A portion of the first electrode EL1 may be exposed by the light emitting opening OP-PDL. The first electrode EL1 may be the first electrode EL1 described with reference to FIG. 6. The first electrode EL1 may overlap the first capacitor C1 when viewed from above the plane.

The second electrode EL2 may be disposed over the first electrode EL1, and the intermediate layer IML may be disposed between the first electrode EL1 and the second electrode EL2. The intermediate layer IML may include an emissive layer EML and a functional layer FNL.

The light emitting element LD may include the intermediate layer IML having various structures and is not limited to any one embodiment. For example, the functional layer FNL may include layers, or may include two or more layers spaced apart from each other with the emissive layer EML therebetween.

The emissive layer EML may include an organic light emitting material. For example, the emissive layer EML may include an inorganic light emitting material, or may include a mixed layer of an organic light emitting material and an inorganic light emitting material. The emissive layer EML may generate one of red light, green light, and blue light.

The functional layer FNL may be disposed between the first electrode EL1 and the second electrode EL2. The functional layer FNL may be disposed between the first electrode EL1 and the emissive layer EML and between the second electrode EL2 and the emissive layer EML. The emissive layer EML may be disposed in the light emitting opening OP-PDL and may extend to a portion adjacent to the light emitting opening OP-PDL.

The functional layer FNL may control movement of charges between the first electrode EL1 and the second electrode EL2. The functional layer FNL may include a hole injection/transport material and/or an electron injection/transport material. The functional layer FNL may include at least one of an electron blocking layer, a hole transport layer, a hole injection layer, a hole blocking layer, an electron transport layer, an electron injection layer, and a charge generating layer.

The second electrode EL2 may be disposed on the intermediate layer IML. As described above, the second electrode EL2 may be connected to the connecting line CN and may be electrically connected to the pixel driver PC. For example, the second electrode EL2 may be electrically connected with the transistor TR through the connecting line CN.

Referring to FIGS. 7 and 8, the light emitting connection CE may be a portion of the connecting line CN exposed from the seventh insulating layer 70 and may be a portion of the connecting line CN to which the second electrode EL2 is connected. A tip part TP may be defined in the light emitting connection CE.

The connecting line CN may have a three-layer structure. The connecting line CN may include a first layer L1, a second layer L2, and a third layer L3 that may be sequentially stacked each other in an upper direction. The second layer L2 may include a material different from those of the first layer L1 and the third layer L3. The second layer L2 may have a greater thickness than the first layer L1 and the third layer L3. The second layer L2 may include a highly conductive material. In an embodiment, the second layer L2 may include aluminum (Al).

The first layer L1 may include a material having a lower etch rate than the second layer L2. In an embodiment, the first layer L1 may include titanium (Ti), and the second layer L2 may include aluminum (Al). A side surface L1_W of the first layer L1 may be defined outward of a side surface L2_W of the second layer L2.

The third layer L3 may include a material having a lower etch rate than the second layer L2. In an embodiment, the third layer L3 may include titanium (Ti). A side surface L3_W of the third layer L3 may be defined outward of the side surface L2_W of the second layer L2.

The side surface L1_W of the first layer L1 and the side surface L3_W of the third layer L3 may protrude outward from the side surface L2_W of the second layer L2. Furthermore, the side surface L2_W of the second layer L2 may be depressed with respect to the side surface L1_W of the first layer L1 and the side surface L3_W of the third layer L3. According to this configuration, the light emitting connection CE of the connecting line CN may have an undercut shape or an overhang structure. The tip part TP of the light emitting connection CE may be defined by the portion of the third layer L3 that protrudes outward from the second layer L2.

The seventh insulating layer 70 and the pixel defining layer PDL may expose at least a portion of the tip part TP and at least a portion of the second side surface L2_W. For example, a first opening OP1 exposing one side or a side of the connecting line CN may be defined in the seventh insulating layer 70, and a second opening OP2 overlapping the first opening OP1 may be defined in the pixel defining layer PDL. The area of the second openings OP2 on the plane may be greater than that of the first opening OP1.

The intermediate layer IML may be disposed on the pixel defining layer PDL. The intermediate layer IML may also be disposed on a portion of the seventh insulating layer 70 exposed by the second opening OP2 of the pixel defining layer PDL. The intermediate layer IML may also be disposed on a portion of the connecting line CN exposed by the first opening OP1 of the seventh insulating layer 70. The intermediate layer IML disposed on the portion of the seventh insulating layer 70 and the portion of the connecting line CN may be the functional layer FNL.

As illustrated in FIG. 8, the intermediate layer IML may include one end or an end IN1 disposed along an upper surface of the sixth insulating layer 60 and an opposite end IN2 disposed along an upper surface of the tip part TP. When viewed on the section, the intermediate layer IML may have a shape that is partially cut with respect to the tip part TP in the region where the light emitting connection CE is defined. However, when viewed from above the plane, the intermediate layer IML may have an integrated shape that is connected as a whole within a region (refer to FIG. 4) defined by the separator SPR.

The second electrode EL2 disposed on the intermediate layer IML may also be disposed on the portion of the seventh insulating layer 70 exposed by the second opening OP2 of the pixel defining layer PDL. The second electrode EL2 may also be disposed on the portion of the connecting line CN exposed by the first opening OP1 of the seventh insulating layer 70.

As illustrated in FIG. 8, the second electrode EL2 may include one end or an end EN1 of the second electrode EL2 disposed along the upper surface of the sixth insulating layer 60 and an opposite end EN2 disposed along the upper surface of the tip part TP. When viewed on the section, the second electrode EL2 may have a shape that is partially cut with respect to the tip part TP in the region where the light emitting connection CE is defined. However, when viewed from above the plane, the second electrode EL2 may have an integrated shape that is connected as a whole within a region (refer to FIG. 4) defined by the separator SPR.

The one end or an end EN1 of the second electrode EL2 may be disposed along the side surface L2_W of the second layer L2 and may make contact with the side surface L2_W of the second layer L2. Accordingly, the second electrode EL2 may be connected to the second layer L2. Thus, the light emitting element LD may be electrically connected with the pixel driver PC through the connecting line CN.

The opposite end IN2 of the intermediate layer IML and the opposite end EN2 of the second electrode EL2 may cover the side surface L3_W of the third layer L3. However, without being limited thereto, at least a portion of the side surface L3_W of the third layer L3 may be exposed from the opposite end IN2 of the intermediate layer IML and/or the opposite end EN2 of the second electrode EL2.

The separator SPR may be disposed on the pixel defining layer PDL. In an embodiment, the second electrode EL2 and the intermediate layer IML may be commonly formed for the pixels by deposition through an open mask. The second electrode EL2 and the intermediate layer IML may be divided by the separator SPR. Accordingly, the second electrode EL2 and the intermediate layer IML may be electrically independent for respective adjacent pixels.

Referring to FIGS. 7 and 9, the separator SPR may include an organic insulating material. The separator SPR may have an inverted tapered shape. For example, the angle θ (hereinafter, referred to as the taper angle) formed by a side surface SPR_W of the separator SPR with respect to an upper surface of the pixel defining layer PDL may be an obtuse angle. However, this is illustrative, and the taper angle θ may be diversely set as long as the separator SPR is capable of electrically disconnecting the second electrode EL2 for each pixel.

A dummy layer UP may be disposed on the separator SPR. The dummy layer UP may include a first dummy layer UP1 disposed on the separator SPR and a second dummy layer UP2 disposed on the first dummy layer UP1. The first dummy layer UP1 may be formed through the same process as the intermediate layer IML and may include the same material or a similar material as the intermediate layer IML. The second dummy layer UP2 may be formed through the same process as the second electrode EL2 and may include the same material or a similar material as the second electrode EL2.

As illustrated in FIG. 9, in an embodiment, the second electrode EL2 may include a first end portion EN1a, and the second dummy layer UP2 may include a second end portion EN2a. The first end portion EN1a may be spaced apart from the separator SPR and may be disposed on the pixel defining layer PDL. The second end portion EN2a may be separated from the first end portion EN1a and may be disposed on the side surface SPR_W of the separator SPR.

According to the disclosure, even though there is no separate patterning process for the second electrode EL2 or the intermediate layer IML, the second electrode EL2 or the intermediate layer IML may not be allowed to be formed on a lower portion of the side surface SPR_W of the separator SPR, and thus the second electrode EL2 or the intermediate layer IML may be divided for each pixel. As long as the second electrode EL2 or the intermediate layer IML is capable of being electrically disconnected between adjacent pixels, the shape of the separator SPR may be diversely modified and is not limited to any one embodiment.

Referring again to FIG. 7, the encapsulation layer ECL may be disposed on the light emitting element layer LDL. The encapsulation layer ECL may cover the light emitting element LD and may cover the separator SPR. The encapsulation layer ECL may include a first inorganic layer IL1, an organic layer OL, and a second inorganic layer IL2 that may be sequentially stacked one above another.

The first and second inorganic layers IL1 and IL2 may protect the light emitting element LD from moisture and oxygen outside the display panel DP. The organic layer OL may protect the light emitting element LD from foreign matter such as particles remaining in a process of forming the first inorganic layer IL1.

The sensing layer ISL may sense an external input. In this embodiment, the sensing layer ISL may be formed on the encapsulation layer ECL through a continuous process. The sensing layer ISL may include conductive layers and insulating layers. The conductive layers may include a first sensing conductive layer MTL1 and a second sensing conductive layer MTL2, and the insulating layers may include first to third sensing insulation layers 71, 72, and 73.

The first sensing conductive layer MTL1 may be disposed between the first sensing insulation layer 71 and the second sensing insulation layer 72, and the second sensing conductive layer MTL2 may be disposed between the second sensing insulation layer 72 and the third sensing insulation layer 73. A portion of the second sensing conductive layer MTL2 may be connected with the first sensing conductive layer MTL1 through a contact hole CNT formed in the second sensing insulation layer 72.

The first sensing conductive layer MTL1 and the second sensing conductive layer MTL2 may constitute a sensor that senses an external input. The sensor may be driven by a capacitance method and may be driven by one of a mutual-cap method or a self-cap method.

Each of the first sensing conductive layer MTL1 and the second sensing conductive layer MTL2 may include transparent conductive oxide and may have a metal mesh shape formed of an opaque conductive material. As long as the visibility of an image displayed by the display panel DP is not deteriorated, the first sensing conductive layer MTL1 and the second sensing conductive layer MTL2 may have various materials and various shapes and are not limited to any one embodiment.

Figure 10:
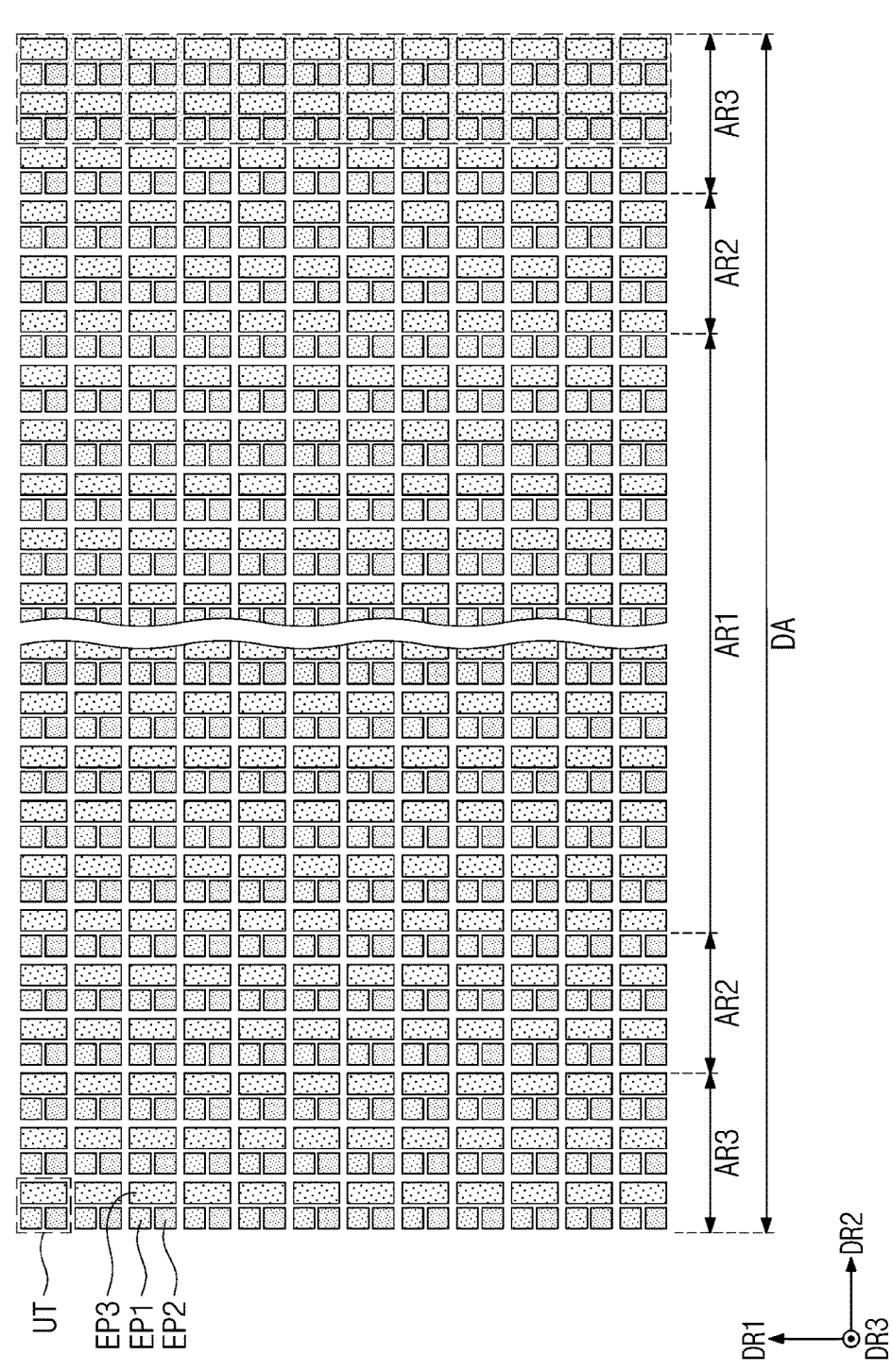
FIG. 10 is a view illustrating a configuration in which light emitting parts illustrated in FIG. 5 are disposed in the display region.

FIG. 10 is a view illustrating a configuration in which the light emitting parts illustrated in FIG. 5 are disposed in the display region.

Referring to FIG. 10, the light emitting units UT may be disposed in the display region DA. The light emitting units UT may be disposed in the first direction DR1 and the second direction DR2. Accordingly, the light emitting units UT may be disposed in a matrix form.

The display panel DP may include a first region AR1, second regions AR2, and third regions AR3. The first region AR1, the second regions AR2, and the third regions AR3 may be disposed in the second direction DR2. The first region AR1 may be disposed between the second regions AR2. The third regions AR3 may be adjacent to the periphery of the display region DA. The second regions AR2 may be disposed between the first region AR1 and the third regions AR3.

The light emitting units UT may be disposed in the first region AR1, the second regions AR2, and the third regions AR3. The scan driver SDC and the emission driver EDC illustrated in FIG. 3 may be disposed below the light emitting units UT disposed in the third regions AR3.

Figure 11:
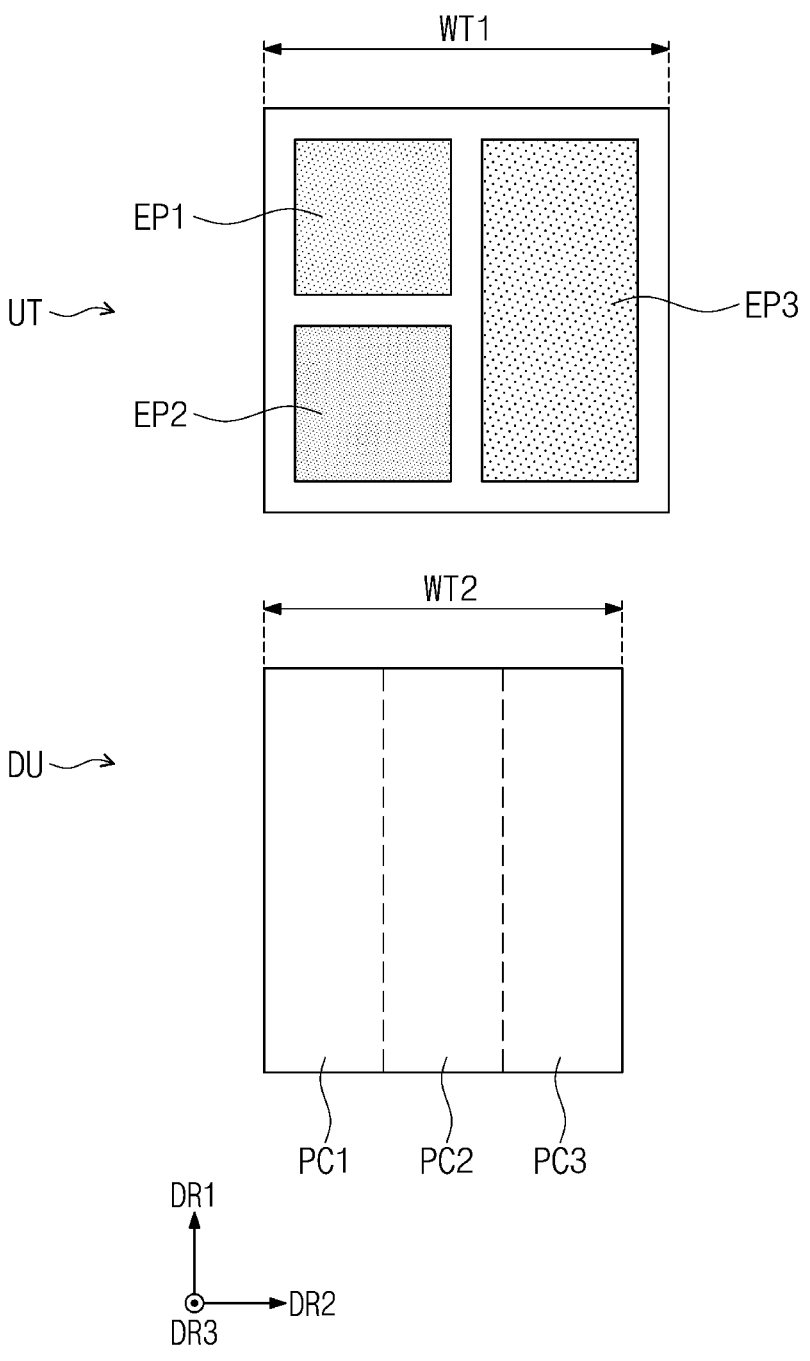
FIG. 11 is a schematic plan view of one light emitting unit and one drive unit illustrated in FIG. 5.

FIG. 11 is a schematic plan view of one light emitting unit and one drive unit illustrated in FIG. 5.

Referring to FIG. 11, the light emitting unit UT may have a first width WT1 in the second direction DR2. The drive unit DU may have a second width W2T in the second direction DR2. The second width W2T may be greater than the first width W1T. The light emitting unit UT and the drive unit DU may have the same width in the first direction DR1. Accordingly, the drive unit DU may have a smaller area than the light emitting unit UT.

Figure 12A:
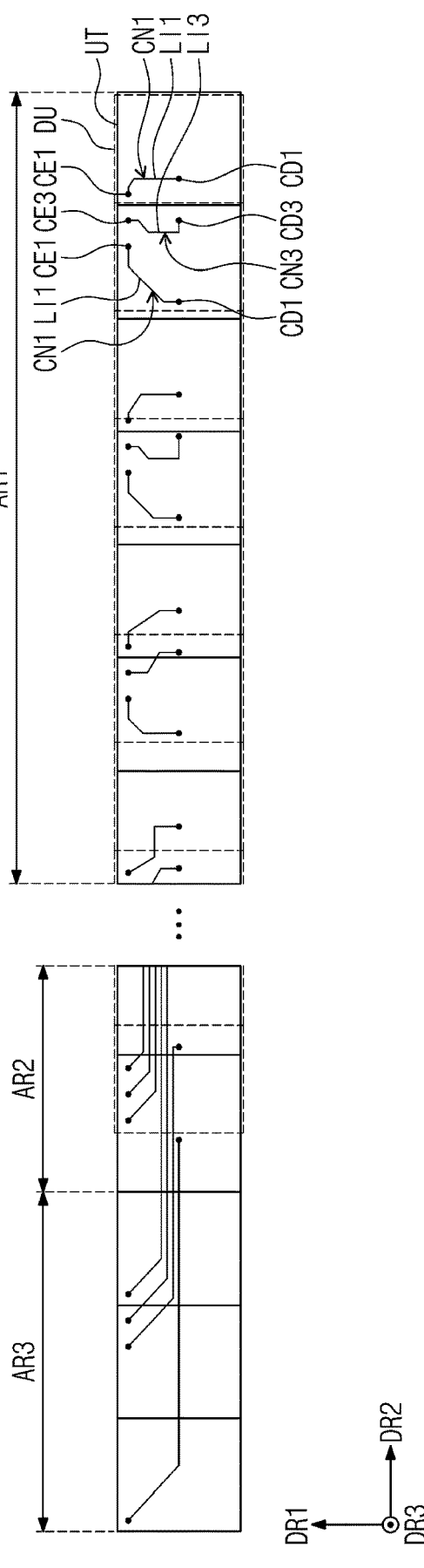
FIG. 12A is a view illustrating a row of light emitting units illustrated in FIG. 10 and a row of drive units connected to the row of light emitting units.
Figure 12B:
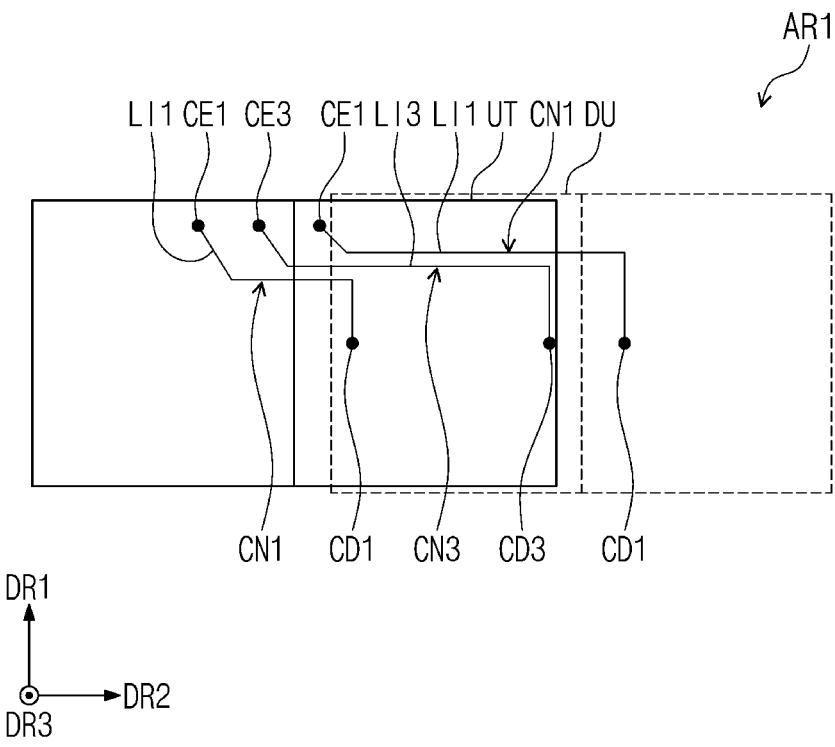
FIG. 12B is a view illustrating a number of light emitting units and a number of drive units disposed in a portion of a first region to the left of a portion of a first region illustrated in FIG. 12A.

FIG. 12A is a view illustrating a row of light emitting units illustrated in FIG. 10 and a row of drive units connected to the row of light emitting units. FIG. 12B is a view illustrating a number of light emitting units and a number of drive units disposed in a portion of a first region to the left of a portion of a first region illustrated in FIG. 12A.

In FIG. 12A, a second region AR2 and a third region AR3 on the left side of the center of the first region AR1 are illustrated as an example. Furthermore, first and third connecting lines CN1 and CN3 disposed on an upper side of the row are illustrated, and second and third connecting lines CN2 and CN3 disposed on a lower side of the row are omitted.

For example, in FIG. 12A, the light emitting units UT are illustrated by solid lines, and the drive units DU are illustrated by dotted lines. The light emitting units UT and the drive units DU have the same width in the first direction DR1. However, in FIG. 12A, to distinguish the drive units DU from the light emitting units UT, the drive units DU are illustrated as dotted boxes greater than the light emitting units UT in the first direction DR1.

Referring to FIGS. 10, 11, 12A, and 12B, the drive units DU may have a smaller width than the light emitting units UT in the second direction DR2. Accordingly, even though the same number of light emitting units UT and drive units DU are disposed in the display panel DP, the areas thereof may differ from each other. In the second direction DR2, the area of the light emitting units UT having a larger width may be greater than the area of the drive units DU having a smaller width.

The light emitting units UT may be disposed in the first, second, and third regions AR1, AR2, and AR3. However, the drive units DU may be disposed in the second and third regions AR2 and AR3 and may not be disposed in the third region AR3.

The positions in which the drive units DU and the light emitting units UT are disposed may vary depending on the difference in size between the drive units DU and the light emitting units UT. For example, the positions of the drive units DU relative to the light emitting units UT may be varied. For example, the distance between each of the drive units DU and the light emitting unit UT corresponding to the drive unit DU may be gradually increased from the center of the display panel DP (for example, the center of the first region AR1) toward the periphery of the display panel DP.

The lengths of the first and third connecting lines CN1 and CN3 may be varied. For example, the distance between first and third drive connections CD1 and CD3 and first and third light emitting connections CE1 and CE3 may be varied, and the lengths of first and third extension lines LI1 and LI3 may be varied. Although not illustrated, the lengths of the second and third connecting lines CN2 and CN3 adjacent to the lower side of the row illustrated in FIG. 12A may also be varied.

Depending to the structure, the lengths of the first and third extension lines LI1 and LI3 extending from the first and third light emitting connections CE1 and CE3 disposed in the third region AR3 may be greater than the lengths of the first and third extension lines LI1 and LI3 extending from the first and third light emitting connections CE1 and CE3 disposed in the first region AR1 and the second region AR2.

Furthermore, the lengths of the first and third extension lines LI1 and LI3 extending from the first and third light emitting connections CE1 and CE3 disposed in the second region AR2 may be greater than the lengths of the first and third extension lines LI1 and LI3 extending from the first and third light emitting connections CE1 and CE3 disposed in the first region AR1.

In a central portion of the first region AR1, the first and third extension lines LI1 and LI3 may not extend in the second direction DR2. However, as the distance between the drive unit DU and the light emitting unit UT corresponding to each other is increased in the second direction DR2, at least one of the first and third extension lines LI1 and LI3 may extend in the second direction DR2.

As the distance between the drive unit DU and the light emitting unit UT corresponding to each other is increased in the second direction DR2, the first and third extension lines LI1 and LI3 may extend parallel to each other in the second direction DR2. As the distance between the drive unit DU and the light emitting unit UT corresponding to each other is increased, the number of first and third extension lines LI1 and LI3 extending parallel to each other in the second direction DR2 may also be increased.

For example, as the lengths of the first and third extension lines LI1 and LI3 are increased, the first and third extension lines LI1 and LI3 may extend longer in the second direction DR2. In the second region AR2, the first and third extension lines LI1 and LI3 may extend parallel to each other in the second direction DR2 and may be disposed in the first direction DR1. In the second region AR2, at least four first and third extension lines LI1 and LI3 may extend parallel to each other in the second direction DR2 and may be disposed in the first direction DR1.

The number of first and third extension lines LI1 and LI3 extending in the second direction DR2 may vary in a portion of the first region AR1 spaced apart from the second region AR2. For example, as illustrated in FIG. 12B, the number of first and third extension lines LI1 and LI3 extending parallel to each other in the second direction DR2 in a portion of the first region AR1 may be two.

However, without being limited thereto, depending on positions, one of the first and third extension lines LI1 and LI3 may extend in the second direction DR2, or three first and third extension lines LI1 and LI3 may extend in parallel in the second direction DR2.

Depending on this structure, the number of first and third extension lines LI1 and LI3 extending parallel to each other may be maximal in the second region AR2.

The display panel DP may have bilateral symmetry. Accordingly, although not illustrated, the second and third regions AR2 and AR3 may have a similar configuration to the right from the center of the first region AR1.

Figure 13:
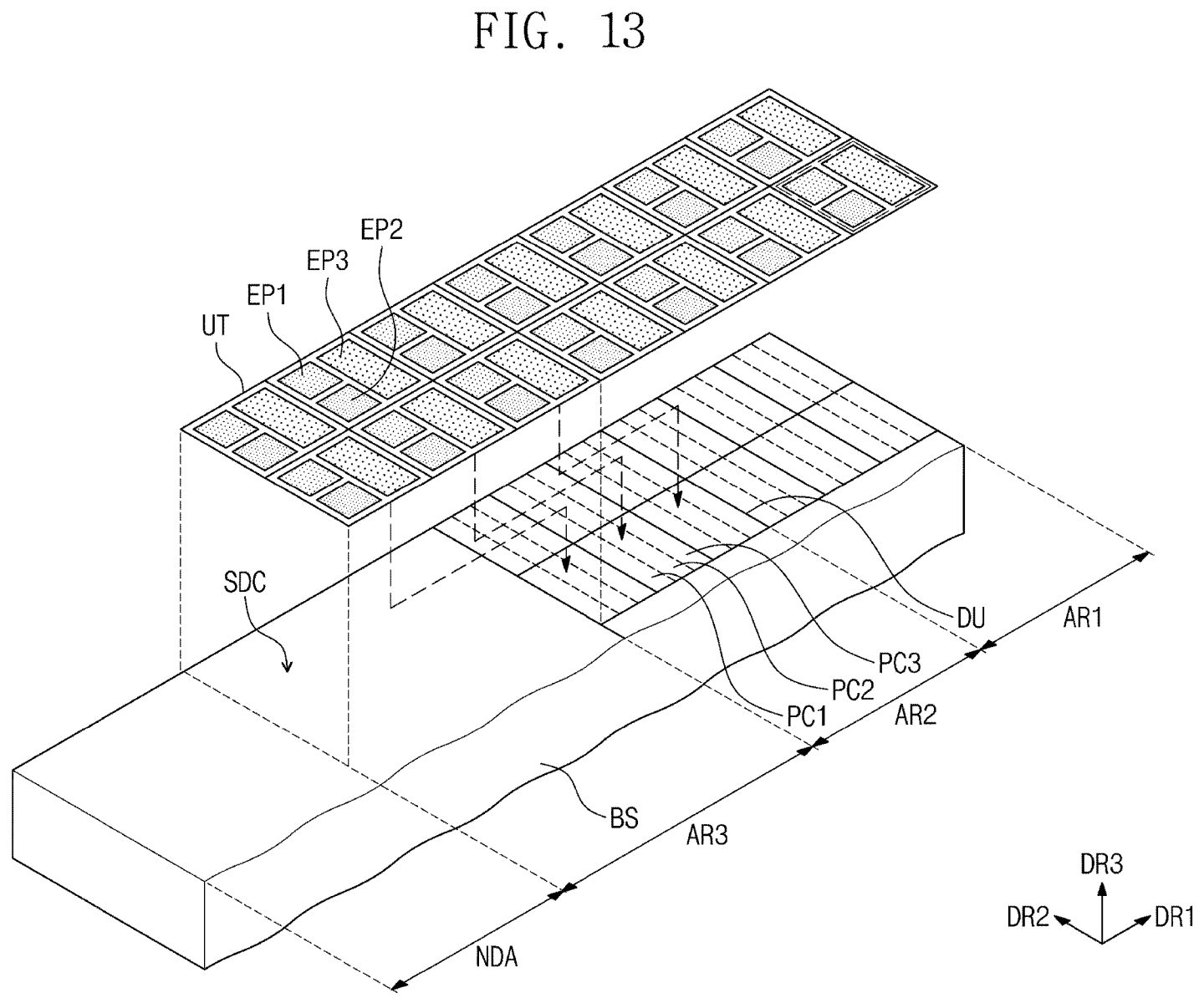

FIG. 13 is a perspective view illustrating the light emitting units disposed in the second and third regions and the drive units disposed in the second region illustrated in FIG. 12A.

In FIG. 13, a portion of the first region AR1 adjacent to the second region AR2 is illustrated as an example.

Referring to FIGS. 12 and 13, the driving units DU having a smaller width in the second direction DR2 may be disposed in the first region AR1 and the second region AR2 without being disposed in the third region AR3. For example, the drive units DU may be disposed below the light emitting units UT in the first and second regions AR1 and AR2 without being disposed below the light emitting units UT in the third region AR3.

The light emitting units UT disposed in the third region AR3 may be connected to the drive units DU disposed in the second region AR2. For example, connection between the light emitting units UT disposed in the third region AR3 and the drive units DU disposed in the second region AR2 is illustrated by dotted arrows. Although not illustrated by dotted arrows, the light emitting units UT disposed in the first and second regions AR1 and AR2 may be connected to the drive units DU disposed in the first region AR1.

Since the drive units DU are not disposed in the third region AR3, the scan driver SDC may be disposed in the third region AR3. Although not illustrated, the emission driver EDC rather than the drive units DU may be disposed in the third region AR3 disposed on the right side.

Figure 14:
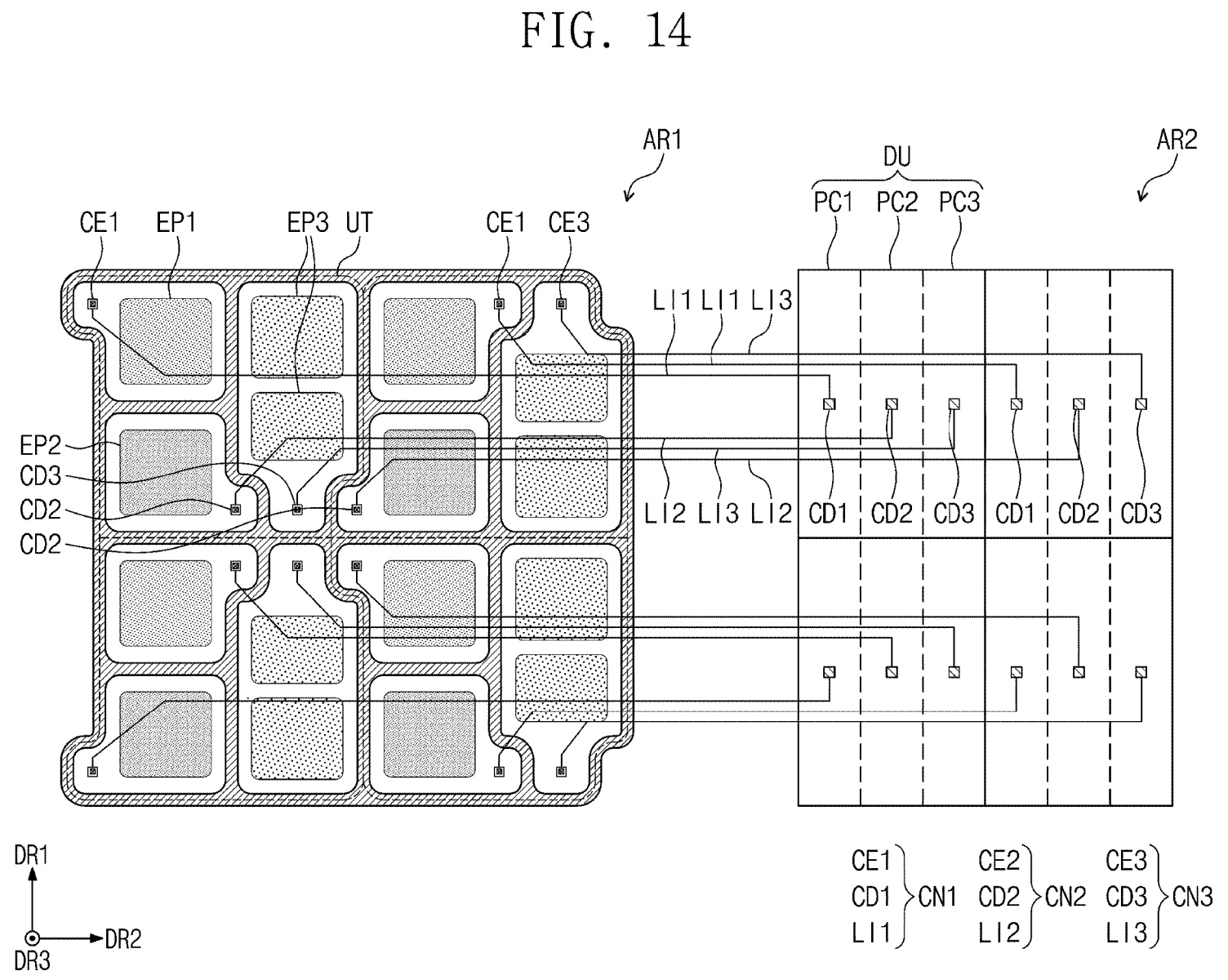

FIG. 14 is a schematic plan view illustrating a connection relationship between a number of light emitting units disposed in the third region and a number of drive units disposed in the second region illustrated in FIG. 13.

Referring to FIG. 14, the light emitting units UT disposed in the third region AR3 may be spaced, in the second direction DR2, apart from the drive units DU disposed in the second region AR2. For example, the electrode 2-1 EL2-1, the electrode 2-2 EL2-2, and the electrode 2-3 EL2-3 are omitted in FIG. 14.

The first extension lines LI1 extending from the first light emitting connections CE1 disposed in the third region AR3 may extend to the first drive connections CD1 disposed in the second region AR2. The second extension lines LI2 extending from the second light emitting connections CE2 disposed in the third region AR3 may extend to the second drive connections CD2 disposed in the second region AR2. The third extension lines LI3 extending from the third light emitting connections CE3 disposed in the third region AR3 may extend to the third drive connections CD3 disposed in the second region AR2.

Accordingly, the first, second, and third connecting lines may extend from the third region AR3 to the second region AR2, and the light emitting units UT disposed in the third region AR3 may be connected to the drive units DU disposed in the second region AR2.

FIGS. 15A to 15F are views illustrating a planar structure of the pixel driver illustrated in FIG. 2A in stages.

FIGS. 15A to 15F may be defined as plan view drawings of the pixel PXij.

Figure 15A:
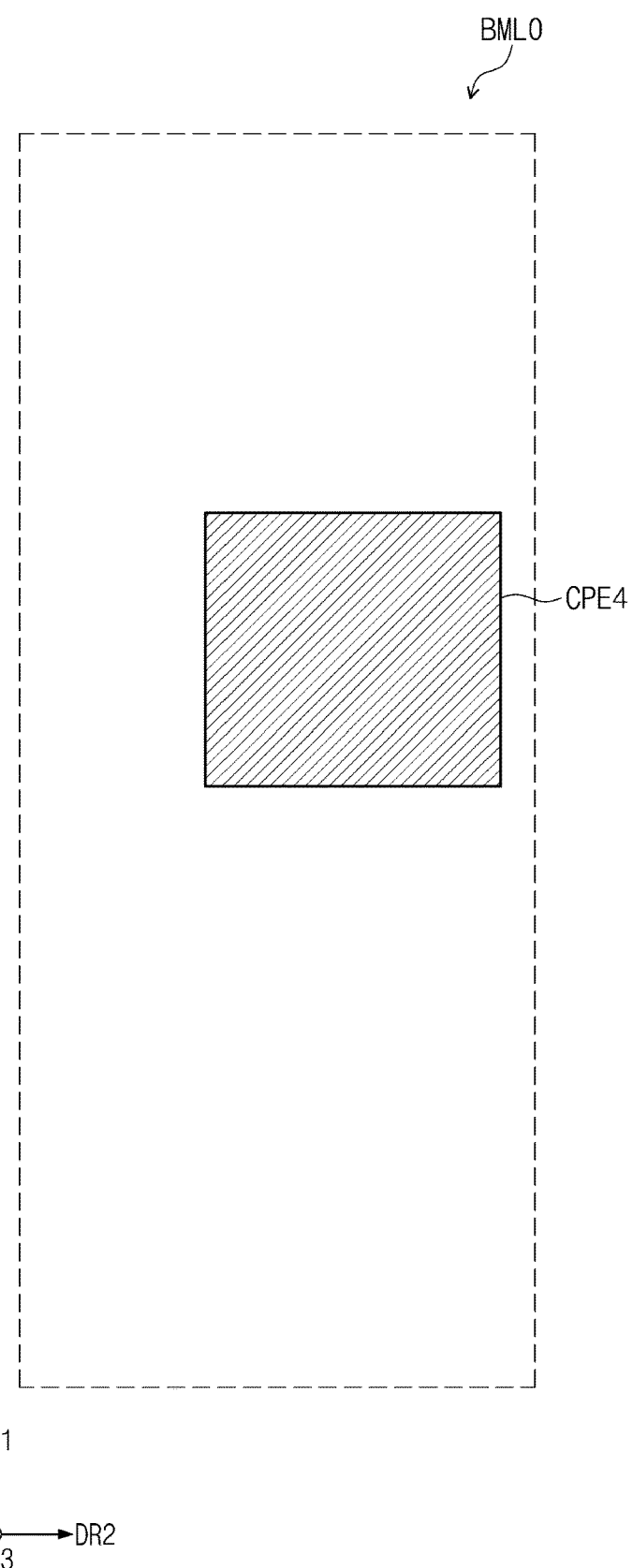
FIGS. 15A to 15F are views illustrating a planar structure of a pixel driver illustrated in FIG. 2A in stages.

Referring to FIG. 15A, a first lower conductive pattern BML0 may be disposed on the base layer BS illustrated in FIG. 7. The first lower conductive pattern BML0 may form the fourth capacitor electrode CPE4 of the second capacitor C2.

Figure 15B:
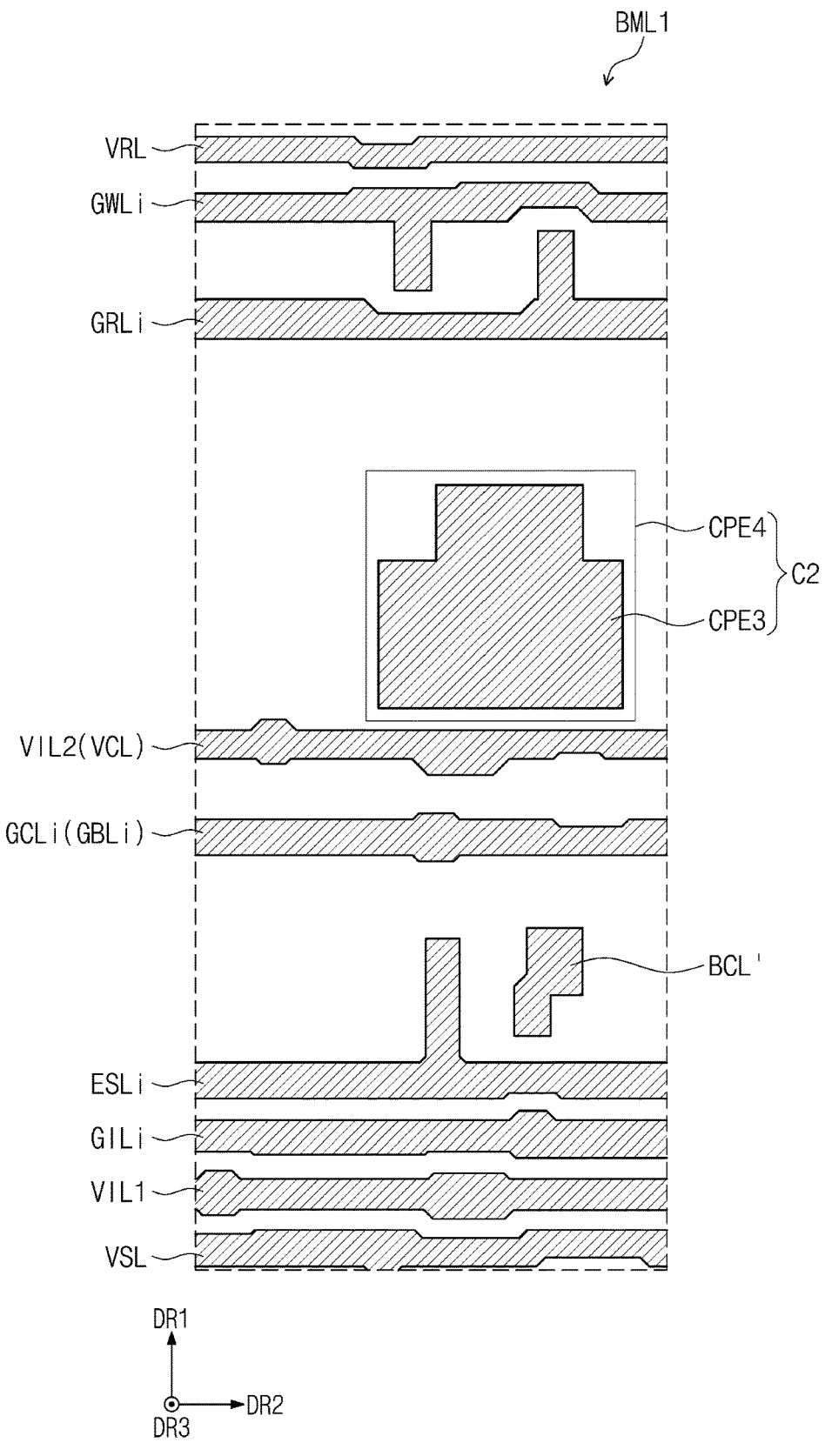

Referring to FIGS. 15A and 15B, a second lower conductive pattern BML1 may be disposed on the first lower conductive pattern BML0. The second lower conductive pattern BML1 may include a lower conductive layer BCL′ and the third capacitor electrode CPE3 of the second capacitor C2. The third capacitor electrode CPE3 may be the second capacitor electrode CPE2 of the first capacitor C1.

The third capacitor electrode CPE3 may overlap the fourth capacitor electrode CPE4. The third capacitor electrode CPE3 may have a smaller area than the fourth capacitor electrode CPE4 when viewed from above the plane. A portion of the fourth capacitor electrode CPE4 may be exposed outside the third capacitor electrode CPE3.

The lower conductive pattern BML1 may include the write scan line GWLi, the compensation scan line GCLi, the first initialization scan line GILi, the second initialization scan line GBLi, the reset scan line GRLi, the emission line ESLi, the second power supply line VSL, the reference voltage line VRL, the first initialization voltage line VIL1, the second initialization voltage line VIL2, and the compensation voltage line VCL.

The initialization voltage line VIL2 and the compensation voltage line VCL may be formed of the same line. The compensation scan line GCLi and the second initialization scan line GBLi may be formed of the same line.

The write scan line GWLi, the compensation scan line GCLi, the first initialization scan line GILi, the second initialization scan line GBLi, the reset scan line GRLi, the emission line ESLi, the second power supply line VSL, the reference voltage line VRL, the first initialization voltage line VIL1, the second initialization voltage line VIL2, and the compensation voltage line VCL may extend in the second direction DR2 and may be disposed in the first direction DR1.

When viewed from above the plane, the reference voltage line VRL, the write scan line GWLi, and the reset scan line GRLi may be disposed on an upper side of the fourth capacitor electrode CPE4. When viewed from above the plane, the compensation scan line GCLi, the first initialization scan line GILi, the second initialization scan line GBLi, the emission line ESLi, the second power supply line VSL, the first initialization voltage line VIL1, the second initialization voltage line VIL2, and the compensation voltage line VCL may be disposed on a lower side of the fourth capacitor electrode CPE4.

The fourth capacitor electrode CPE4 may be disposed between the reset scan line GRLi and the second initialization voltage line VIL2. The reset scan line GRLi may be disposed between the fourth capacitor electrode CPE4 and the write scan line GWLi. The write scan line GWLi may be disposed between the reference voltage line VRL and the reset scan line GRLi.

The second initialization voltage line VIL2 may be disposed between the fourth capacitor electrode CPE4 and the compensation scan line GCLi. The compensation scan line GCLi may be disposed between the second initialization voltage line VIL2 and the emission line ESLi. The lower conductive layer BCL' may be disposed between the compensation scan line GCLi and the emission line ESLi.

The first initialization scan line GILi may be disposed between the emission line ESLi and the first initialization voltage line VIL1. The first initialization voltage line VIL1 may be disposed between the first initialization scan line GILi and the second power supply line VSL.

Figure 15C:
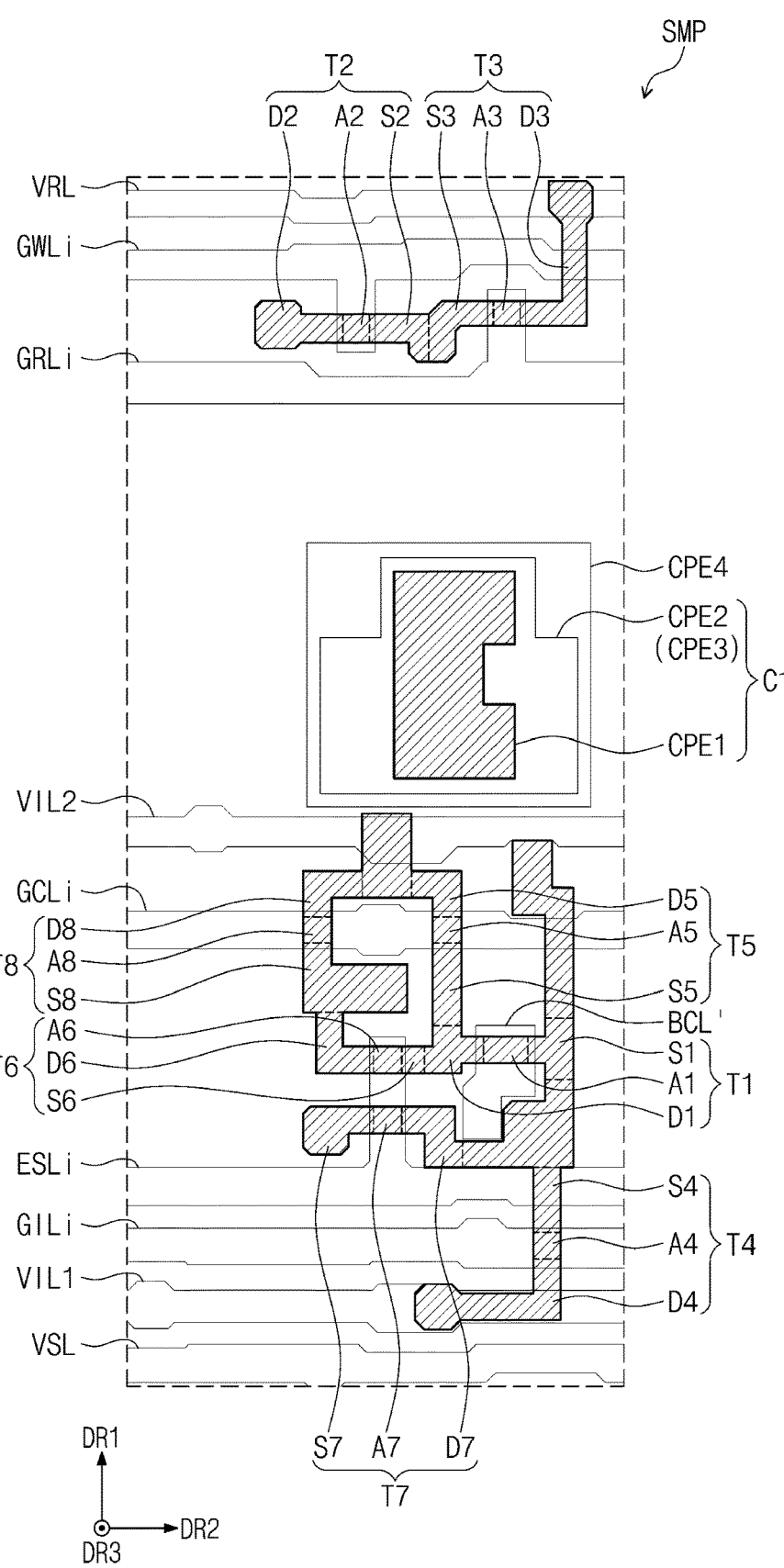
Figure 15D:
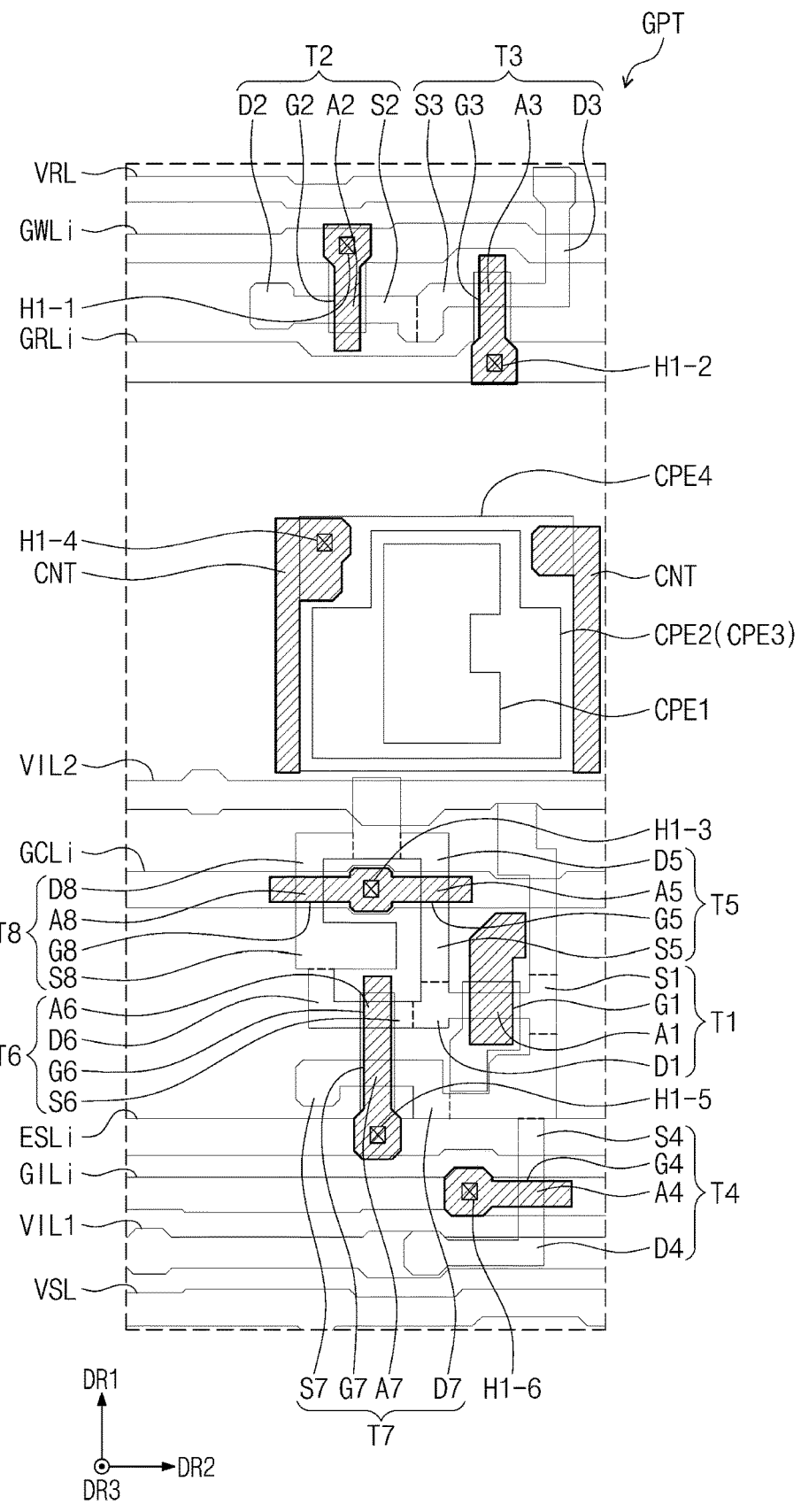

Referring to FIGS. 15A to 15C, a semiconductor pattern SMP may be disposed on the second lower conductive pattern BML1. The semiconductor pattern SMP may form the first capacitor electrode CPE1 of the first capacitor C1.

The first capacitor electrode CPE1 may overlap the second capacitor electrode CPE2. The first capacitor electrode CPE1 may have a smaller area than the second capacitor electrode CPE2 when viewed from above the plane. A portion of the second capacitor electrode CPE2 may be exposed outside the first capacitor electrode CPE1.

The semiconductor pattern SMP may form the semiconductor patterns SP of the first to eighth transistors T1 to T8 (corresponding to the semiconductor pattern SP of FIG. 7). The semiconductor pattern SMP may have various shapes without being limited to the shape illustrated in FIG. 15C.

First to eighth source regions S1 to S8, first to eighth drain regions D1 to D8, and first to eighth channel regions A1 to A8 of the first to eighth transistors T1 to T8 may be formed by the semiconductor pattern SMP. The first to eighth source regions S1 to S8, the first to eighth drain regions D1 to D8, and the first to eighth channel regions A1 to A8 may correspond to the source region S, the drain region D, and the channel region A illustrated in FIG. 7.

The first to eighth channel regions A1 to A8 may be disposed between the first to eighth source regions S1 to S8 and the first to eighth drain regions D1 to D8.

The fourth source region S4 and the seventh drain region D7 may extend from the first source region S1. The fifth source region S5 and the sixth source region S6 may extend from the first drain region D1.

The eighth drain region D8 may extend from the fifth drain region D5. The eighth source region S8 may extend from the sixth drain region D6. The third source region S3 may extend from the second source region S2.

The lower conductive layer BCL' may overlap the first channel region A1. A portion of the lower conductive layer BCL' that overlaps the first channel region A1 may perform the same function as the lower conductive layer BCL illustrated in FIG. 7.

A portion of the write scan line GWLi, when viewed from above the plane, may protrude and may overlap the second channel region A2. The portion of the write scan line GWLi that overlaps the second channel region A2 may perform the same function as the lower conductive layer BCL illustrated in FIG. 7.

A portion of the reset scan line GRLi, when viewed from above the plane, may protrude and may overlap the third channel region A3. The portion of the reset scan line GRLi that overlaps the third channel region A3 may perform the same function as the lower conductive layer BCL illustrated in FIG. 7.

The first initialization scan line GIL1 may overlap the fourth channel region A4 when viewed from above the plane. A portion of the first initialization scan line GIL1 that overlaps the fourth channel region A4 may perform the same function as the lower conductive layer BCL.

Portions of the emission line ESLi, when viewed from above the plane, may protrude and may overlap the sixth and seventh channel regions A6 and A7. The portion of the emission line ESLi that overlaps the sixth channel region A6 may form the lower conductive layer BCL illustrated in FIG. 7. The portion of the emission line ESLi that overlaps the seventh channel region A7 may perform the same function as the lower conductive layer BCL.

The compensation scan line GCLi may overlap the fifth and eighth channel regions A5 and A8 when viewed from above the plane. Portions of the compensation scan line GCLi that overlap the fifth and eighth channel regions A5 and A8 may perform the same function as the lower conductive layer BCL.

The third drain region D3, when viewed from above the plane, may extend and may overlap the reference voltage line VRL. The fifth and eighth drain regions D5 and D8, when viewed from above the plane, may extend and may overlap the second initialization voltage line VIL2. The fourth drain region D4 may extend and may overlap the first initialization voltage line VIL1.

Referring to FIGS. 15A to 15D, a gate pattern GPT may be disposed on the semiconductor pattern SMP. The gate pattern GPT may include first to eighth gate electrodes G1 to G8 of the first to eighth transistors T1 to T8. The first to eighth gate electrodes G1 to G8 may correspond to the gate electrode GE illustrated in FIG. 7. When viewed from above the plane, portions of the gate pattern GPT that overlap the first to eighth channel regions A1 to A8 may be formed as the first to eighth gate electrodes G1 to G8.

The gate pattern GPT, when viewed from above the plane, may include connecting electrodes CNT that overlap portions of the fourth capacitor electrode CPE4. The connecting electrodes CNT may overlap portions of the fourth capacitor electrode CPE4 exposed outside the third capacitor electrode CPE3.

The second gate electrode G2 may be connected to the write scan line GWLi through a first contact hole H1-1. The third gate electrode G3 may be connected to the reset scan line GRLi through a second contact hole H1-2.

The eighth gate electrode G8 may be connected to the compensation scan line GCLi through a third contact hole H1-3. One of the connecting electrodes CNT may be connected to the fourth capacitor electrode CPE4 through a fourth contact hole H1-4.

The sixth and seventh gate electrodes G6 and G7 may be formed of the same electrode and may be connected to the emission line ESLi through a fifth contact hole H1-5. The fourth gate electrode G4 may be connected to the first initialization scan line GILi through a sixth contact hole H1-6.

The first to sixth contact holes H1-1 to H1-6 may be formed in at least two insulating layers among the first, second, and third insulating layers 10, 20, and 30.

Hereinafter, in FIGS. 15E and 15F, to briefly display reference numerals, the reference numerals of the first to eighth source regions S1 to S8, the first to eighth drain regions D1 to D8, the first to eighth channel regions A1 to A8, and the first to eighth gate electrodes G1 to G8 will be omitted, and the reference numerals of the first to eighth transistors T1 to T8 will be displayed.

Referring to FIGS. 15A to 15E, a connecting pattern CPT may be disposed on the gate pattern GPT. The connecting pattern CPT may be disposed in the same layer as the source and drain electrode patterns W1 and W2 illustrated in FIG. 7. The source and drain electrode patterns W1 and W2 may be substantially formed by the connecting pattern CPT.

The connecting pattern CPT may include the first and second initialization voltage lines VIL1 and VIL2, the data line DLj, the second power supply line VSL, the reference voltage line VRL, and connecting electrodes CNE1 to CNE7.

The first initialization voltage line VIL1 extending in the first direction DR1 may be connected, through a first contact hole H2-1, to the first initialization voltage line VIL1 extending in the second direction DR2. The second initialization voltage line VIL2 extending in the first direction DR1 may be connected, through a second contact hole H2-2, to the second initialization voltage line VIL2 extending in the second direction DR2.

The data line DLj may be connected to the second drain region D2 of the second transistor T2 through a third contact hole H2-3. The reference voltage line VRL extending in the first direction DR1 may be connected, through fourth contact holes H2-4, to another one of the reference voltage line VRL extending in the second direction DR2, the third drain region D3 of the third transistor T3, and the connecting electrodes CNT.

The second power supply line VSL extending in the first direction DR1 may be connected, through fifth contact holes H2-5, to one of the connecting electrodes CNT, the seventh source region S7 of the seventh transistor T7, and the second power supply line VSL extending in the second direction DR2. The second power supply line VSL may be connected to the fourth capacitor electrode CPE4 through one connecting electrode CNT.

The first connecting electrode CNE1 may be connected, through sixth contact holes H2-6, to the first capacitor electrode CPE1 and the second and third source regions S2 and S3 of the second and third transistors T2 and T3. The second connecting electrode CNE2 may be connected, through seventh contact holes H2-7, to the second capacitor electrode CPE2 and the first source region S1 of the first transistor T1.

The third connecting electrode CNE3 may be connected, through eighth contact holes H2-8, to the first capacitor electrode CPE1 and the first gate electrode G1 of the first transistor T1. The fourth connecting electrode CNE4 may be connected, through ninth contact holes H2-9, to the fifth and eighth drain regions D5 and D8 of the fifth and eighth transistors T5 and T8 and the second initialization voltage line VIL2.

The fifth connecting electrode CNE5 may be connected to the sixth drain region D6 of the sixth transistor T6 through a tenth contact hole H2-10. A portion of the fifth connecting electrode CNE5 may be connected to the drive connection CD illustrated in FIG. 15F.

The sixth connecting electrode CNE6 may be connected to the first source region S1 of the first transistor T1 and the lower conductive layer BCL' through eleventh contact holes H2-11. The seventh connecting electrode CNE7 may be connected, through twelfth contact holes H2-12, to the first initialization voltage line VIL1 extending in the second direction DR2 and the fourth drain region D4 of the fourth transistor T4.

Figure 15E:
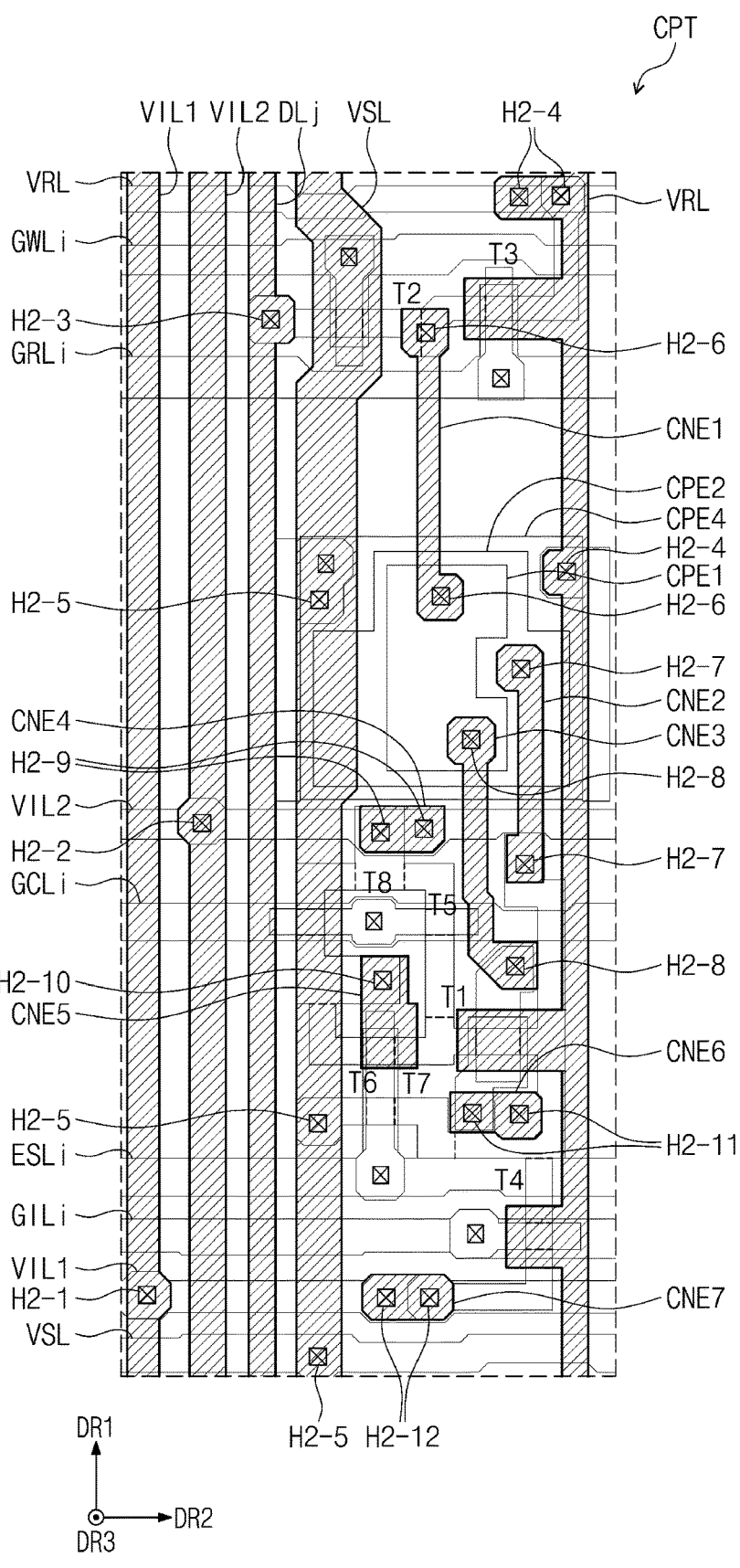

The contact holes H2-1 to H2-12 illustrated in FIG. 15E may be defined in at least three insulating layers among the second, third, fourth, and fifth insulating layers 20, 30, 40, and 50.

Figure 15F:
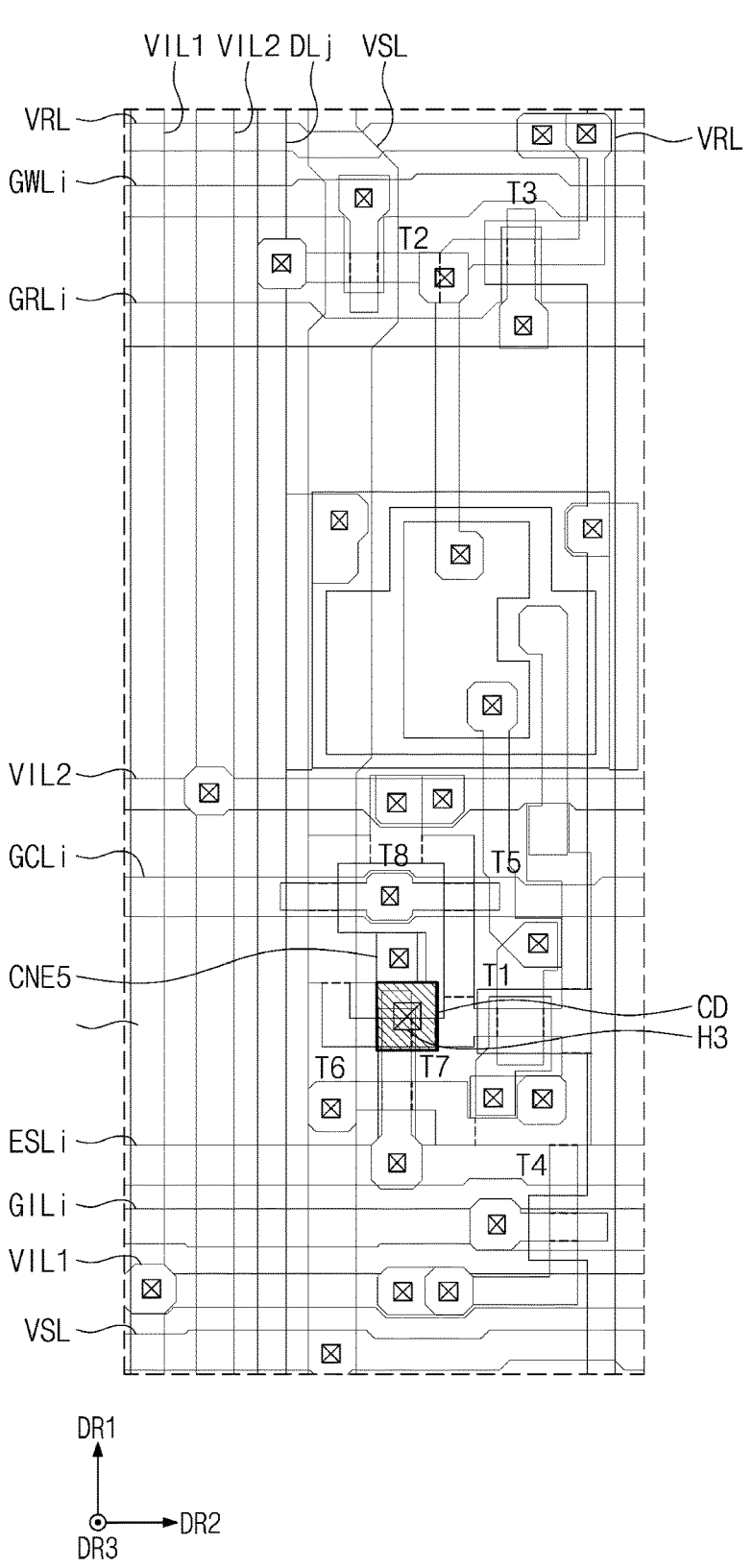

Referring to FIG. 15F, the fifth connecting electrode CNE5 may be connected to the drive connection CD through a third contact hole H3. The drive connection CD may be the drive connection CD illustrated in FIG. 7. The third contact hole H3 may correspond to the third contact hole CNT3 illustrated in FIG. 7.

Figure 16:
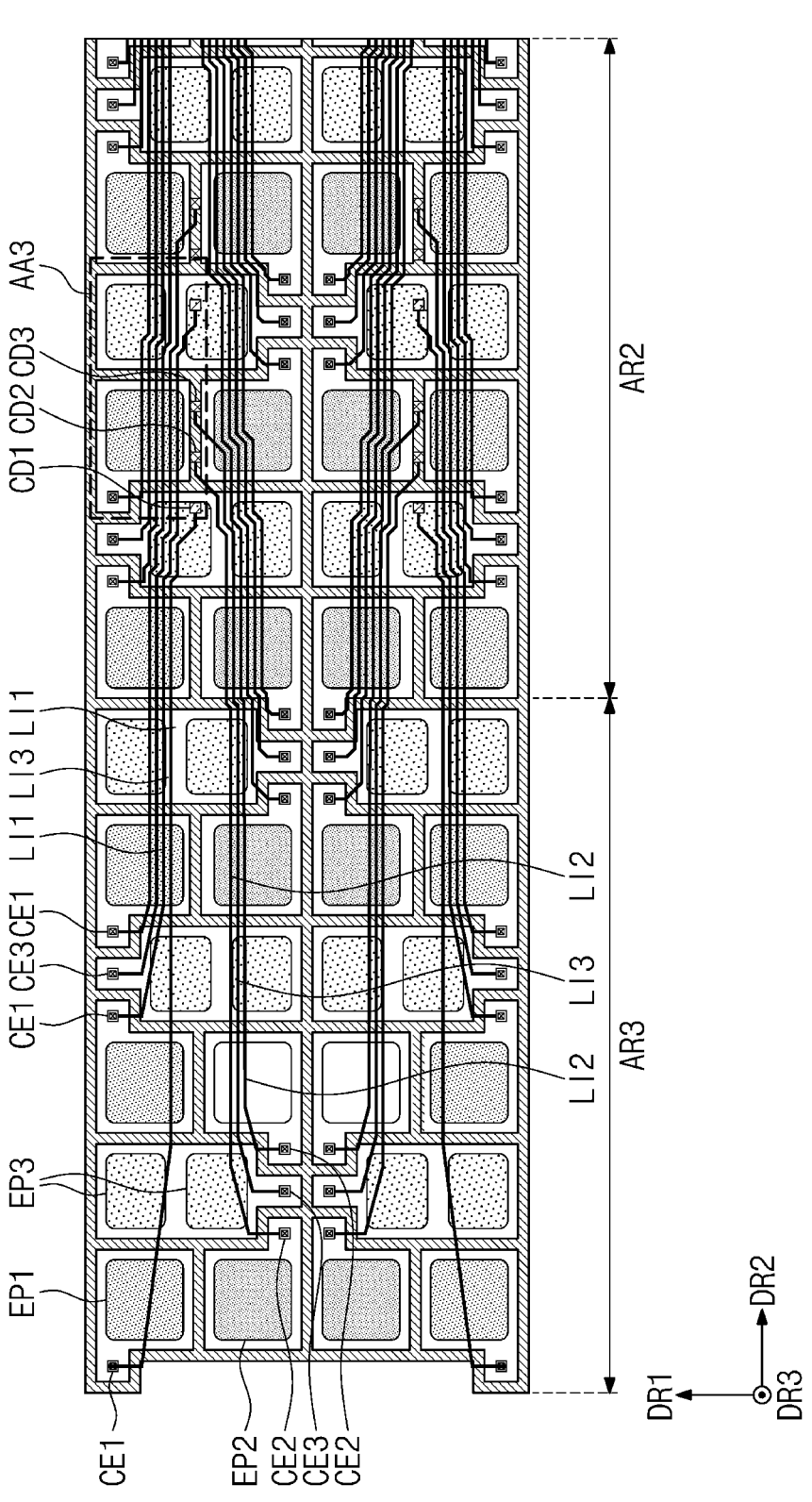
FIG. 16 is a view illustrating a planar configuration of light emitting units and connecting lines illustrated in the second and third region illustrated in FIGS. 13 and 14 in a plan view corresponding to FIGS. 15A to 15F.

FIG. 16 is a view illustrating a planar configuration of light emitting units and connecting lines illustrated in the second and third region illustrated in FIGS. 13 and 14 in a plan view corresponding to FIGS. 15A to 15F.

For example, the drive units DU, the electrode 2-1 EL2-1, the electrode 2-2 EL2-2, and the electrode 2-3 EL2-3 are omitted in FIG. 16.

Referring to FIGS. 14 and 16, the first, second, and third extension lines LI1, LI2, and Li3 extending from the first, second, and third light emitting connections CE1, CE2, and CE3 disposed in the third region AR3 may extend to the second region AR2. The first, second, and third extension lines LI1, LI2, and LI3 may extend in parallel in the second direction DR2.

The first, second, and third extension lines LI1, LI2, and LI3 may extend to the first, second, and third drive connections CD1, CD2, and CD3 disposed in the second region AR2. Each of the first, second, and third drive connections CD1, CD2, and CD3 may be connected to the fifth connecting electrode CNE5 through the third contact hole H3 illustrated in FIG. 15F. The fifth connecting electrode CNE5 may be connected to the sixth transistor T6. Accordingly, each of the first, second, and third drive connections CD1, CD2, and CD3 may be connected to the sixth transistor T6 of the corresponding pixel driver PC.

Figure 17:
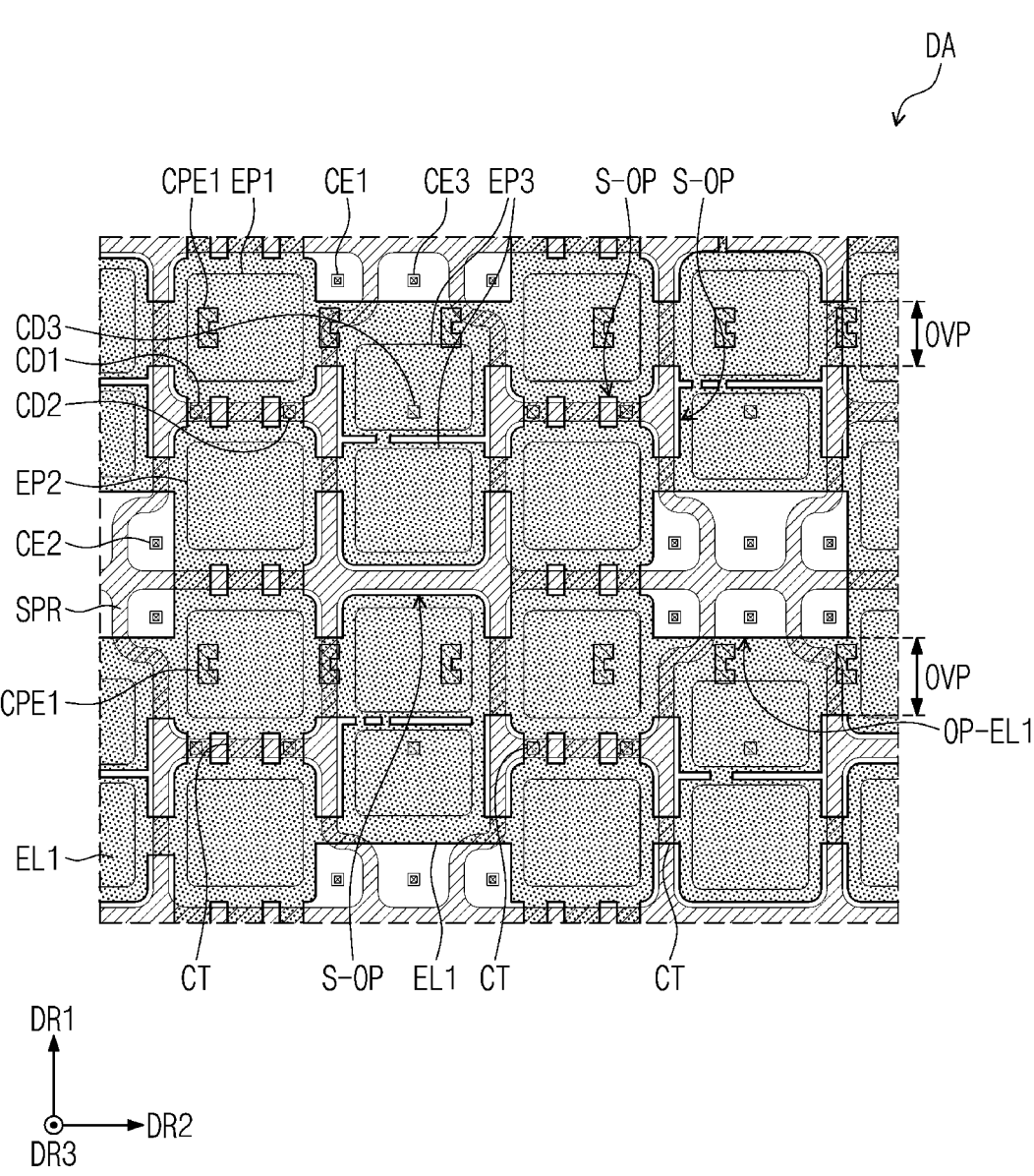
FIG. 17 is a view in which a first capacitor electrode illustrated in FIG. 15C is illustrated in the schematic plan view illustrated in FIG. 6.
Figure 18:
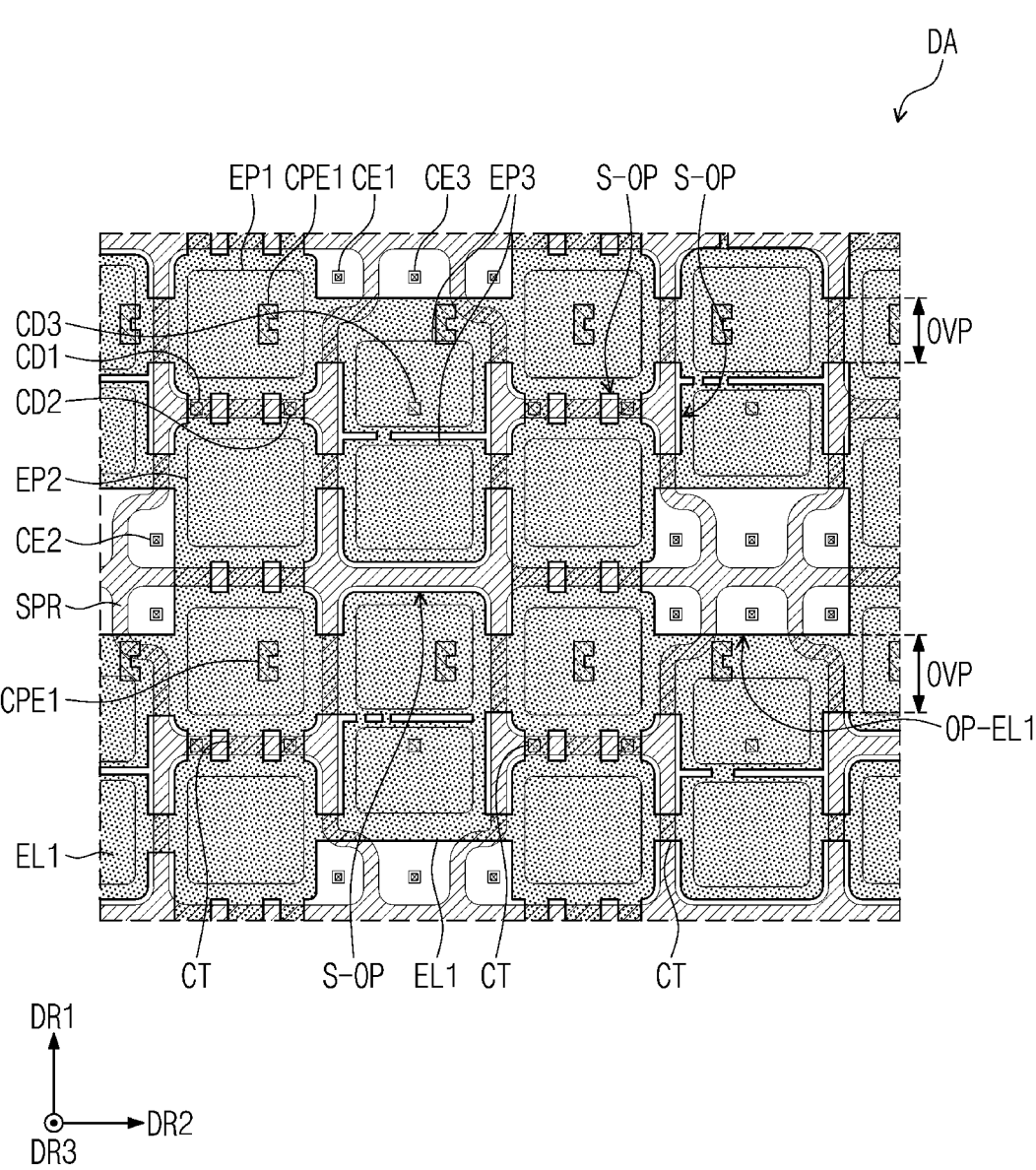
FIG. 18 is a view in which a first capacitor electrode disposed in a position different from that illustrated in FIG. 17 is illustrated in the schematic plan view illustrated in FIG. 6.

FIG. 17 is a view in which the first capacitor electrode illustrated in FIG. 15C is illustrated in the schematic plan view illustrated in FIG. 6. FIG. 18 is a view in which the first capacitor electrode disposed in a position different from that illustrated in FIG. 17 is illustrated in the schematic plan view illustrated in FIG. 6.

The first capacitor electrode CPE1 of the above-described pixel driver PC is illustrated in plural numbers in FIGS. 17 and 18, and other components of the pixel driver PC described with reference to FIGS. 15A to 15F are omitted.

The first capacitor electrodes CPE1 illustrated in FIGS. 17 and 18 may be the first capacitor electrodes CPE1 of the first, second, and third pixel drivers PC1, PC2, and PC3 illustrated in FIG. 5. For example, the first capacitor electrodes CPE1 are illustrated in FIGS. 17 and 18 assuming that the pixel driver PC described with reference to FIGS. 15A to 15F is disposed in plural numbers. Accordingly, the first capacitor electrodes CPE1 are illustrated as being disposed in the second direction DR2.

Referring to FIGS. 17 and 18, the positions of the drive units DU relative to the light emitting units UT may be varied since the driver units DU and the light emitting units UT have different widths in the second direction DR2 as described with reference to FIGS. 11, 12A, and 12B. Accordingly, the first capacitor electrodes CPE1 illustrated in FIG. 17 may be disposed in positions different from the positions of the first capacitor electrodes CPE1 illustrated in FIG. 18.

In an embodiment, the first electrode EL1 may overlap the first capacitor electrodes CPE1. For example, the first electrode EL1 may include the overlapping parts OVP extending in the second direction DR2, and the overlapping parts OVP may overlap the first capacitor electrodes CPE1.

The first capacitor electrodes CPE1 illustrated in FIG. 17 and the first capacitor electrodes CPE1 illustrated in FIG. 18 are disposed in different positions, but may overlap the overlapping parts OVP extending in the second direction DR2.

Parasitic capacitors may be formed between the first electrode EL1 and the first capacitor electrodes CPE1. The parasitic capacitors may affect the first capacitors C1 of the pixel drivers PC. In an embodiment, since the first capacitor electrodes CPE1 entirely overlap the first electrode EL1, a deviation between the capacitances of the parasitic capacitors formed between the first electrode EL1 and the first capacitor electrodes CPE1 may be reduced.

In case that the deviation between the capacitances of the parasitic capacitors is large, a deviation between the capacitances of the first capacitors C1 of the pixel drivers PC may also be increased. The pixel drivers PC including the first capacitors C1 may not normally operate.

However, in an embodiment, since the first capacitor electrodes CPE1 entirely overlap the first electrode EL1, the deviation between the capacitances of the parasitic capacitors may be reduced. The deviation between the capacitances of the first capacitors C1 affected by the parasitic capacitors may be reduced, and thus the pixel drivers PC may normally operate.

Figure 19:
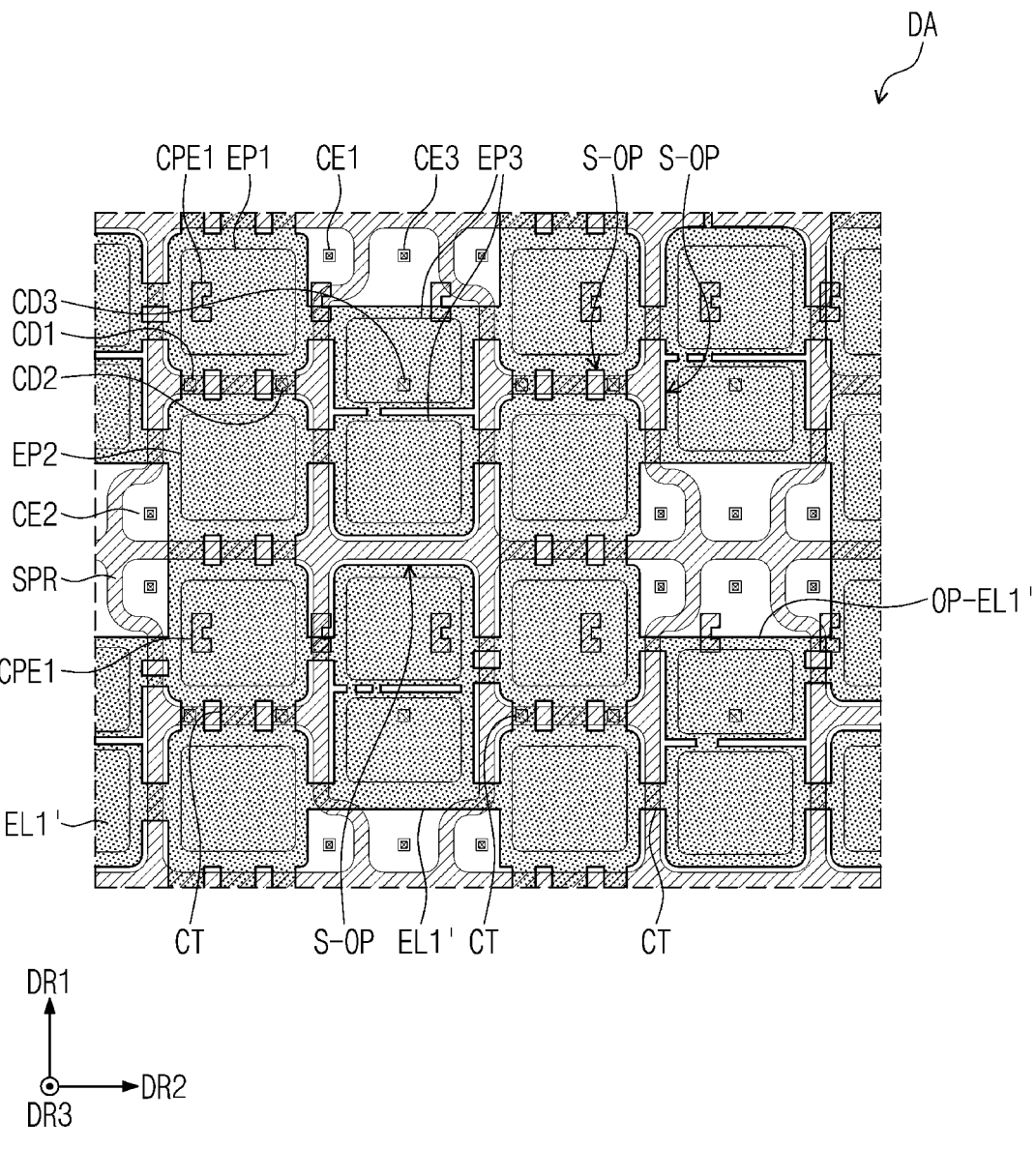
FIGS. 19 and 20 are views illustrating a first electrode having a pattern different from that of a first electrode illustrated in FIGS. 17 and 18.
Figure 20:
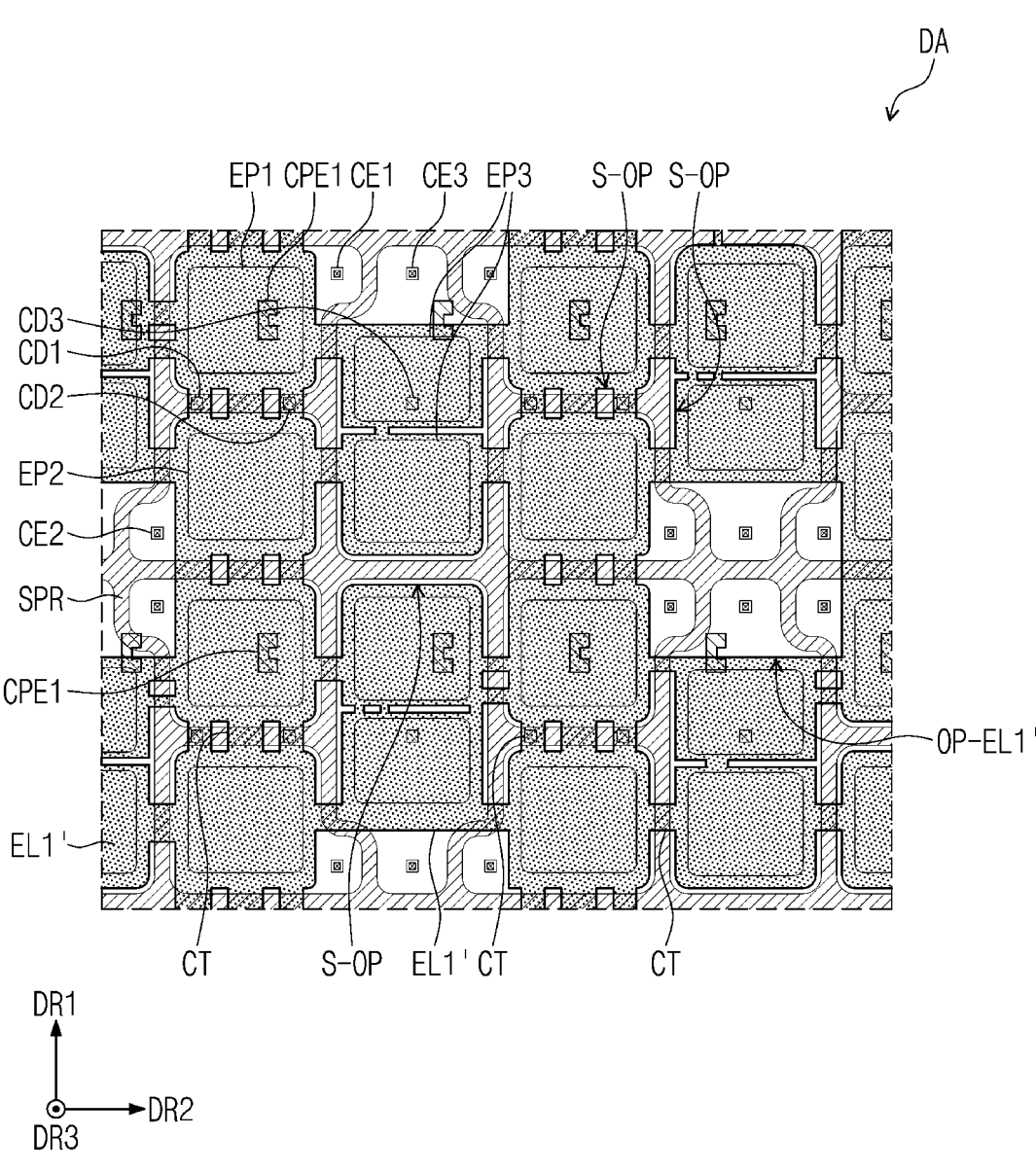

FIGS. 19 and 20 are views illustrating a first electrode having a pattern different from that of the first electrode illustrated in FIGS. 17 and 18.

FIG. 19 is a schematic plan view corresponding to FIG. 17, and FIG. 20 is a schematic plan view corresponding to FIG. 18.

Referring to FIGS. 19 and 29, openings OP-EL1' overlapping the first, second, and third light emitting connections CE1, CE2, and CE3 may be defined in the first electrode EL1'. The openings OP-EL1', when viewed from above the plane, may have a larger area than the openings OP-EL1 illustrated in FIGS. 17 and 18.

In the first electrode EL1' illustrated in FIGS. 19 and 20, a number of the first capacitor electrodes CPE1 may entirely overlap the first electrode EL1'. However, the other first capacitor electrodes CPE1 may partially overlap the first electrode EL1'.

In case that overlapping areas are different from each other, a deviation between the capacitances of parasitic capacitors formed between the first electrode EL1' and the first capacitor electrodes CPE1 may be increased. Accordingly, a deviation between the capacitances of the first capacitors C1 of the pixel drivers PC affected by the parasitic capacitors may be increased. Therefore, an image such as an unintended horizontal stain may be visible.

However, since the deviation between the capacitances of the parasitic capacitors is reduced in the embodiment as described above, the horizontal stain may be improved, and thus the display quality may be improved.

Figure 21:
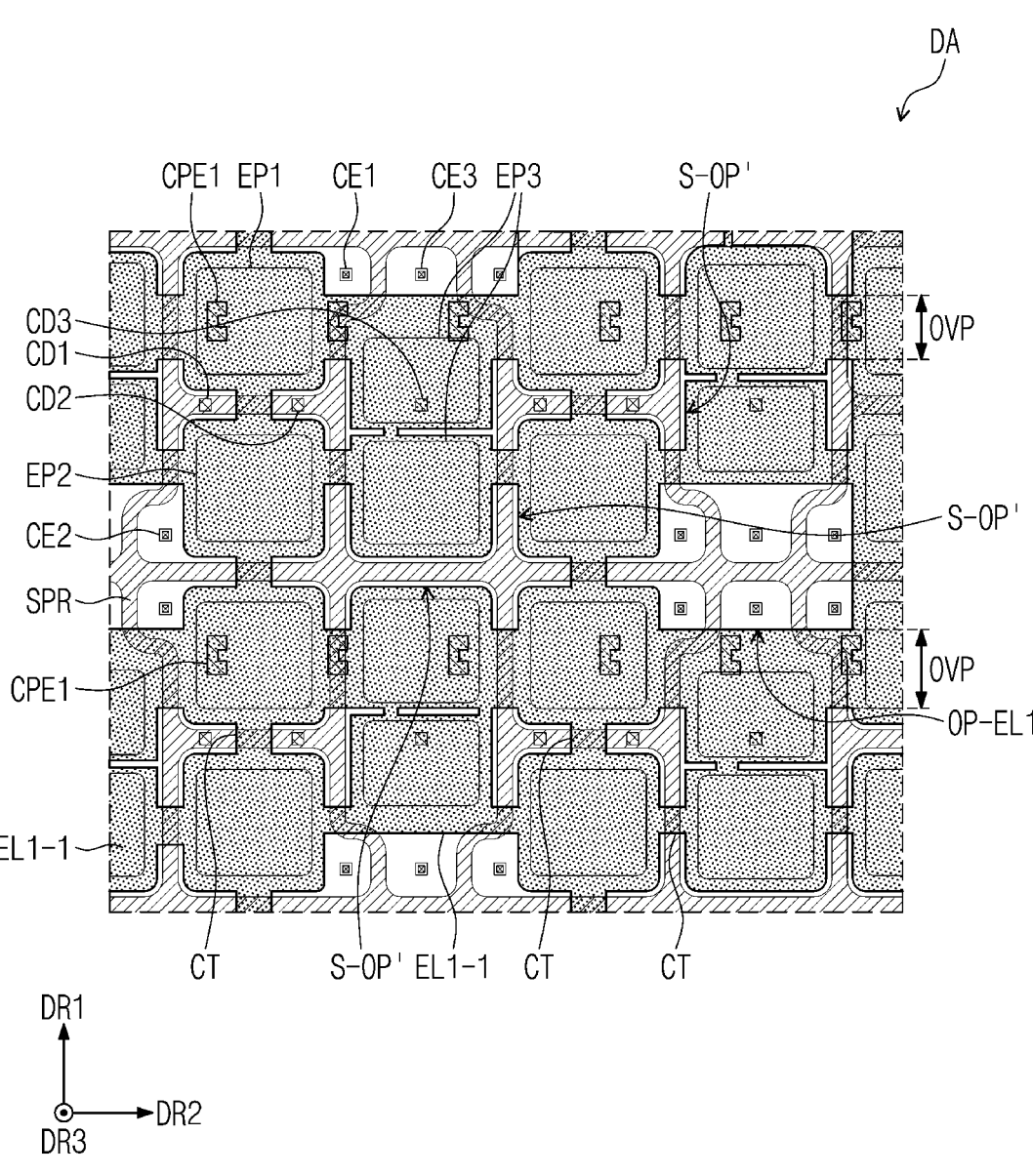
FIG. 21 is a view illustrating a pattern of a first electrode according to an embodiment.

FIG. 21 is a view illustrating a pattern of a first electrode according to an embodiment.

For example, FIG. 21 is a schematic plan view corresponding to FIG. 17.

Referring to FIG. 21, connecting electrodes CT disposed between first electrodes EL1-1 overlapping the first, second, and third light emitting parts EP1, EP2, and EP3 may extend from the first electrodes EL1-1, and the first electrodes EL1-1 may be integral.

The connecting electrodes CT may be singly provided between the first light emitting parts EP1 and the second light emitting parts EP2. The connecting electrodes CT may be singly provided between the first light emitting parts EP1 and the third light emitting parts EP3 and between the second light emitting parts EP2 and the third light emitting parts EP3.

Although the connecting electrodes CT are singly provided between the first light emitting parts EP1 and the second light emitting parts EP2 in FIG. 21, the connecting electrodes CT may be provided in plural numbers between the first light emitting parts EP1 and the second light emitting parts EP2 in FIG. 17. Accordingly, the first electrodes EL1-1 illustrated in FIG. 21 may have a smaller area than the first electrode EL1 illustrated in FIG. 17. For example, the total area of openings S-OP' defined in the first electrode EL1-1 may be greater than the total area of the openings S-OP defined in the first electrode EL1.

Gas may be generated from the seventh insulating layer 70 that is an organic layer in FIG. 7. A space for discharging the gas to the outside is required. The space for discharging the gas may be defined by the openings S-OP, S-OP', and OP-EL1. Since the total area of the openings S-OP' defined in the first electrode EL1-1 is greater than the total area of the openings S-OP defined in the first electrode EL1, the space for discharging the gas may be more readily secured.

Figure 22:
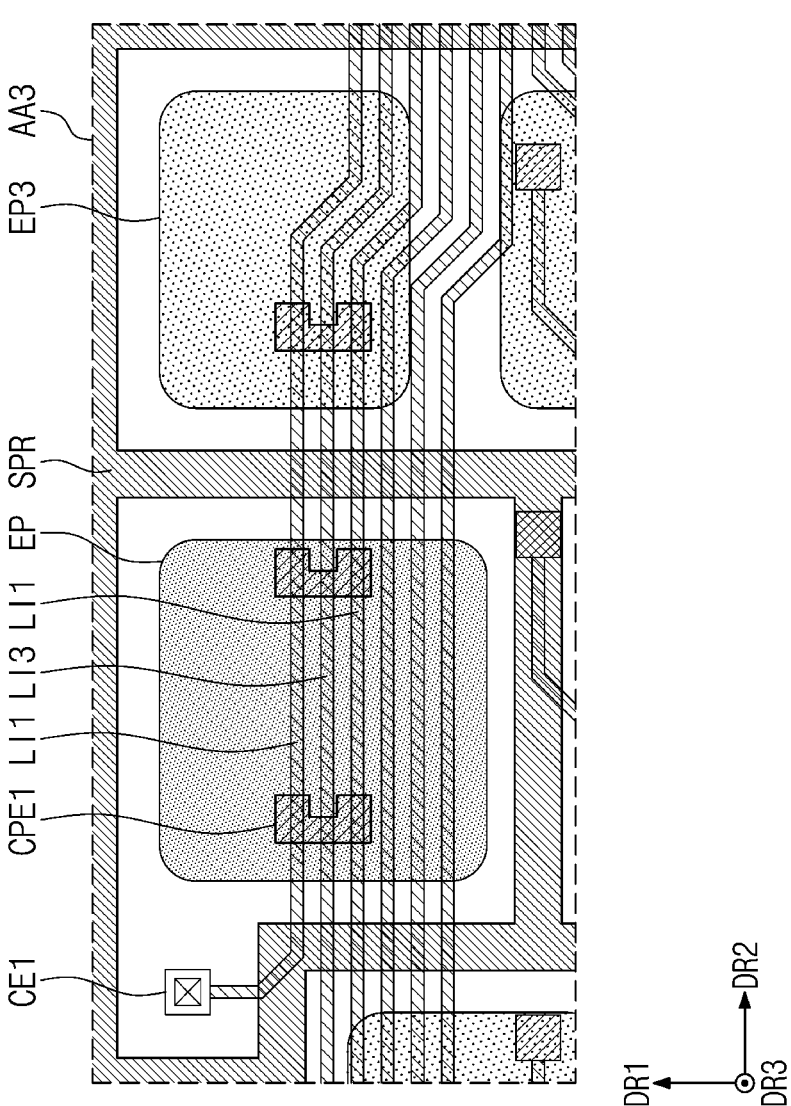
FIG. 22 is an enlarged view of a third region AA3 illustrated in FIG. 16.

FIG. 22 is an enlarged view of a third region AA3 illustrated in FIG. 16.

Referring to FIG. 22, in the second region AR2, the first capacitor electrodes CPE1 of the pixel drivers PC adjacent to the periphery of the display panel DP may overlap K extension lines LI extending in parallel in the second direction DR2. K may be a natural number of 2 or more. The extension lines LI may be the first, second, and third extension lines LI1, LI2, and LI3 illustrated in FIG. 16.

Although three extension lines LI are illustrated as overlapping the first capacitor electrodes CPE1, the number of extension lines LI overlapping the first capacitor electrodes CPE1 is not limited thereto.

Figure 23:
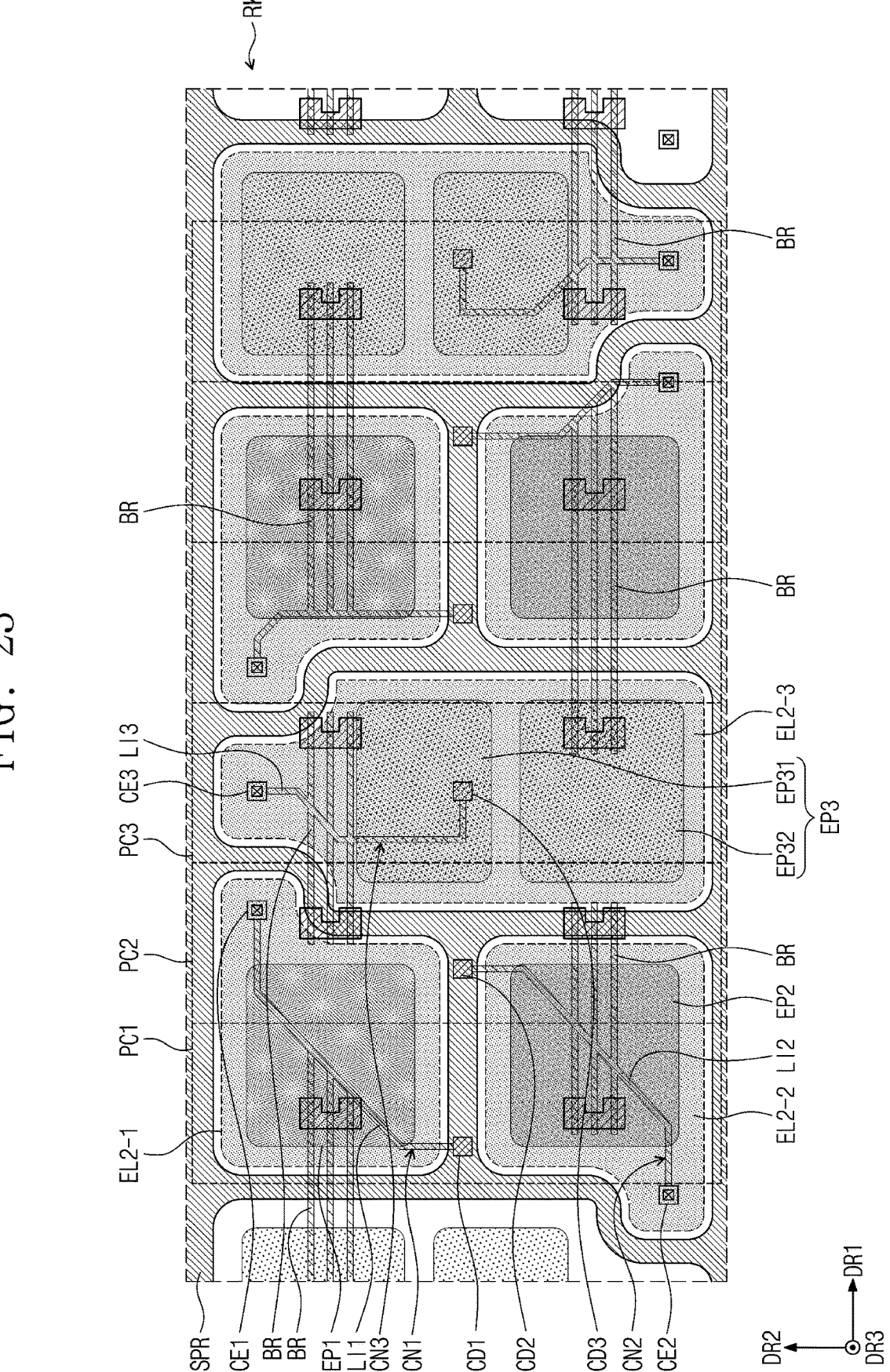
FIG. 23 is a view illustrating a configuration of extension lines according to an embodiment.

FIG. 23 is a view illustrating a configuration of extension lines according to an embodiment.

For example, the first, second, and third extension lines LI1, LI2, and LI3 illustrated in FIG. 23 may be extension lines disposed in the central portion of the display panel DP.

Referring to FIGS. 22 and 23, the first capacitor electrodes CPE1 of the pixel drivers PC1, PC2, and PC3 disposed in the central portion of the display panel DP may be disposed in the second direction DR2. Branch lines BR may extend from the extension lines LI1, LI2, and LI3. The branch lines BR may extend in parallel in the second direction DR2. The branch lines BR may overlap the first capacitor electrodes CPE1.

K branch lines BR may overlap the first capacitor electrodes CPE1. For example, the number of branch lines BR overlapping the first capacitor electrodes CPE1 disposed in the central portion of the display panel DP may be equal to the number of extension lines LI overlapping the first capacitor electrodes CPE1 adjacent to the periphery of the display panel DP in FIG. 22. The K branch lines BR may extend in parallel in the second direction DR2 from the extension lines LI1, LI2, and LI3.

Figure 24:
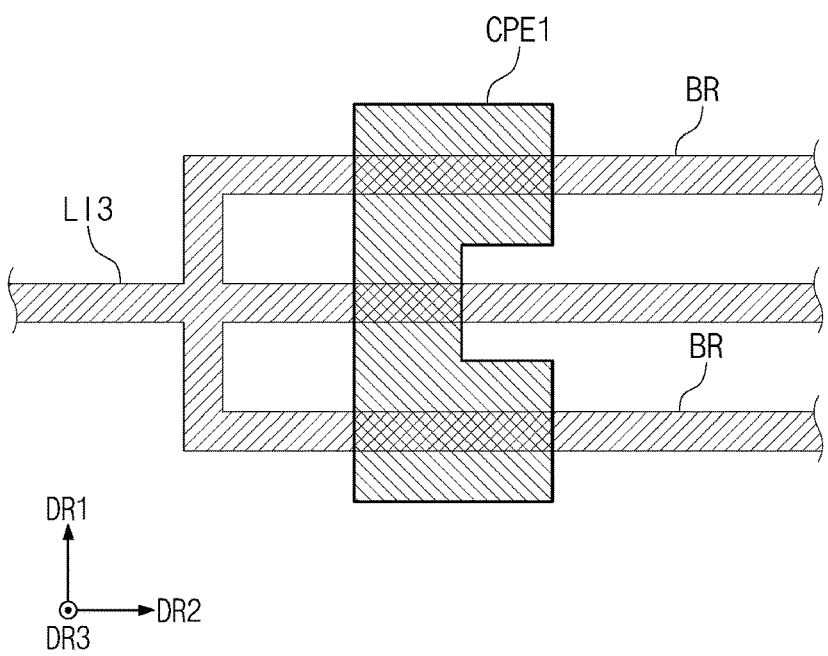
FIGS. 24 and 25 are views illustrating a configuration of an extension line of portions of a first region AR1 spaced apart from a central portion of the display panel according to an embodiment.
Figure 25:
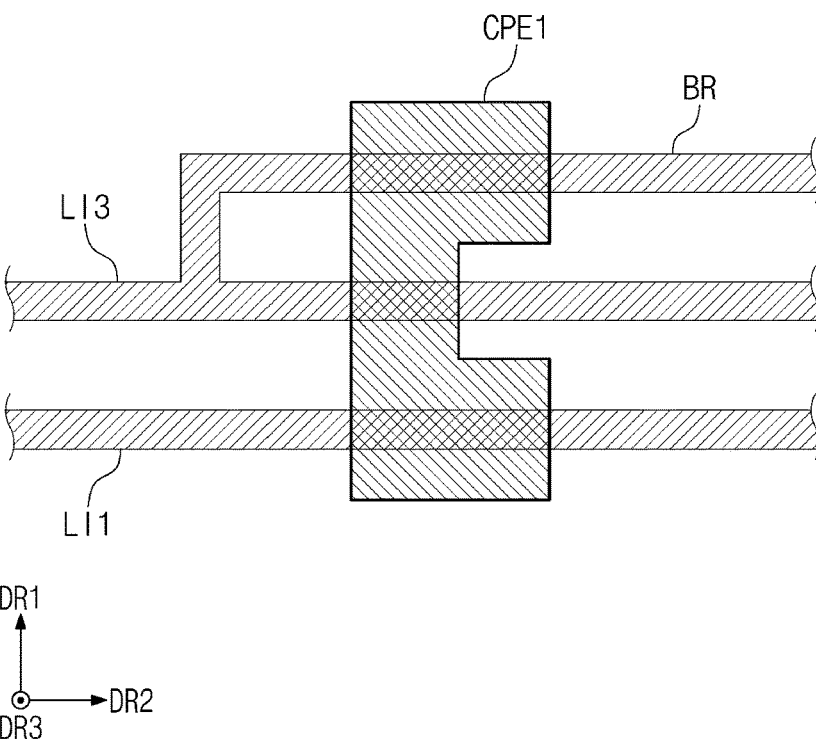

FIGS. 24 and 25 are views illustrating a configuration of an extension line of portions of the first region AR1 spaced apart from the central portion of the display panel according to an embodiment.

Referring to FIGS. 24 and 25, the number of extension lines LI1, LI2, and LI3 extending in the second direction DR2 may be varied depending on positions as described with reference to FIGS. 12A and 12B. As illustrated in FIG. 24, one third extension line LI3 may extend in the second direction DR2 and may overlap the first capacitor electrode CPE1, or as illustrated in FIG. 25, two first and third extension lines LI1 and LI3 may extend in the second direction DR2 and may overlap the first capacitor electrode CPE1.

In an embodiment, the number of lines overlapping the first capacitor electrodes CPE1 irrespective of the positions of the pixel drivers PC may be set to K.

For example, as illustrated in FIG. 24, two branch lines BR may extend from the third extension line LI3 extending in the second direction DR2 and may extend in the second direction DR2. The two branch lines BR and the one third extension line LI3 may overlap the first capacitor electrode CPE1.

Furthermore, as illustrated in FIG. 25, one branch line BR may extend from the third extension line LI3 and may extend in the second direction DR2. The one branch line BR and the two first and third extension lines LI1 and LI3 may overlap the first capacitor electrode CPE1.

As illustrated in FIG. 22, the three lines LI may overlap the first capacitor electrode CPE1, and as illustrated in FIGS. 24 and 25, the three lines LI1, LI3, and BR may overlap the first capacitor electrodes CPE1, respectively, in other portions of the display panel DP.

Referring to FIGS. 4, 5, and 22, the three extension lines LI may overlap the first capacitor electrodes CPE1 in FIG. 22, but the extension lines LI1, LI2, and LI3 may not overlap the first capacitor electrodes CPE1 in FIGS. 4 and 5. A deviation between the capacitances of parasitic capacitors between the first capacitor electrodes CPE1 and the extension lines LI1, LI2, and LI3 may vary depending on positions. Accordingly, as described above, a deviation between the capacitances of the first capacitors C1 may also be increased.

Referring to FIGS. 22 to 25, in an embodiment, the numbers of lines overlapping the first capacitor electrodes CPE1 may be identically set. Accordingly, the deviation between the capacitances of parasitic capacitors between the first capacitor electrodes CPE1 and the extension lines LI1, LI2, and LI3 may be reduced. Accordingly, the deviation between the capacitances of the first capacitors C1 may also be reduced.

Figure 26:
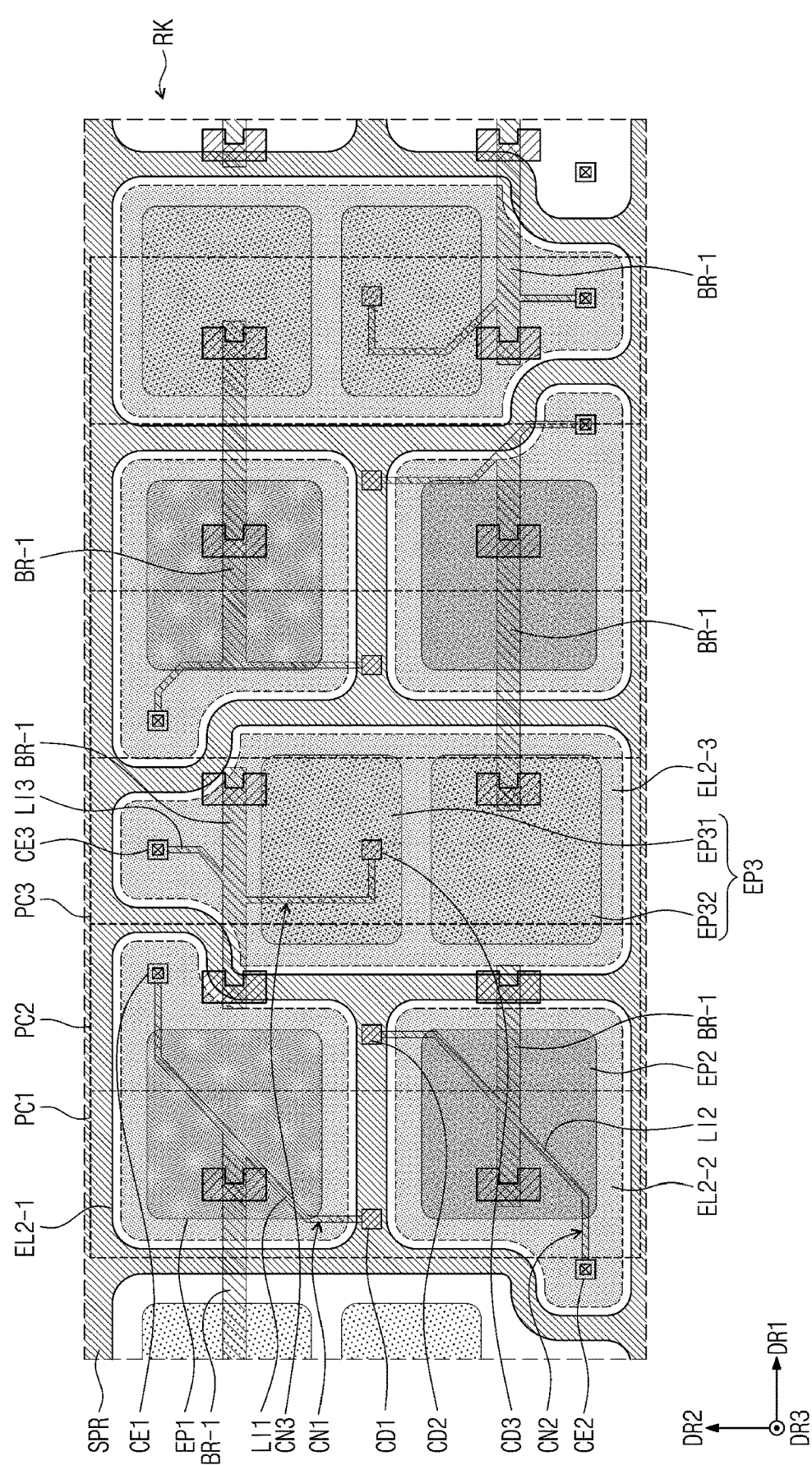
FIG. 26 is a view illustrating a configuration of extension lines according to an embodiment.

FIG. 26 is a view illustrating a configuration of extension lines according to an embodiment.

Referring to FIG. 26, a single branch line BR-1 may extend from each of the extension lines LI1, LI2, and LI3 in the second direction DR2. The branch lines BR-1 extending from the extension lines LI1, LI2, and LI3 may overlap the first capacitor electrodes CPE1. The line width of each of the branch lines BR-1 may be greater than the line width of each of the extension lines LI1, LI2, and LI3. The line widths may be defined as numerical values measured in directions perpendicular to the extension directions of the lines.

According to the embodiments, a capacitance difference between the parasitic capacitors formed between the first electrode and the first capacitor electrodes and a capacitance difference between the parasitic capacitors formed between the extension lines and the first capacitor electrodes may be reduced. Accordingly, horizontal stains caused by the capacitance difference between the parasitic capacitors may be improved, and thus the display quality may be improved.

While the disclosure has been described with reference to embodiments thereof, it will be apparent to those of ordinary skill in the art that various changes and modifications may be made thereto without departing from the spirit and scope of the disclosure and as set forth in the following claims.

What is claimed is:

1. A display device comprising:

light emitting elements, each including a first electrode electrically connected to a first power supply line, a second electrode disposed over the first electrode, and an emissive layer disposed between the first electrode and the second electrode; and pixel drivers disposed below the light emitting elements and electrically connected to the light emitting elements, respectively, wherein each of the pixel drivers includes:

a first transistor switched by a voltage of a node and electrically connected between the second electrode and a second power supply line;

a second transistor electrically connected between the node and a data line and switched by a write scan signal; and a capacitor including a first capacitor electrode electrically connected to the node and a second capacitor electrode electrically connected between the second power supply line and the first transistor, the data line extends in a first direction, the first capacitor electrode of each of the pixel drivers is disposed in a second direction intersecting the first direction, the first electrode of each of the light emitting elements overlaps the first capacitor electrode of each of the pixel drivers, and the first capacitor electrode entirely overlaps at least the first electrode in a plan view defined by a plane comprising the first and second directions and a plane perpendicular to a thickness direction, the second electrode of each of the light emitting elements overlaps at least the first capacitor electrode in the plan view, the first electrode of each of the light emitting elements is an anode, and the second electrode of each of the light emitting elements is a cathode, and the first electrodes of the light emitting elements are integral with one another and the integral first electrodes of the light emitting elements overlap the first capacitor electrodes of the pixel drivers.

2. The display device of claim 1, wherein the integral first electrode of each of the light emitting elements includes an overlapping part extending in the second direction, and the overlapping part overlaps the first capacitor electrode of each of the pixel drivers.

3. The display device of claim 1, further comprising:

light emitting parts defined as regions where light is emitted from the light emitting elements in the plan view; and light emitting units, each including a first light emitting part, a second light emitting part, and a third light emitting part among the light emitting parts, the light emitting units being disposed in the second direction intersecting, wherein the second light emitting part is spaced apart from the first light emitting part in the first direction, the third light emitting part is spaced apart from the first light emitting part and the second light emitting part in the second direction, and the pixel drivers are disposed in the second direction.

4. The display device of claim 3, further comprising:

connecting electrodes disposed between the first electrode of each of the light emitting elements and extending from the first electrode of each of the light emitting elements.

5. The display device of claim 4, wherein the connecting electrodes are in plural numbers between the first light emitting part and the second light emitting part.

6. The display device of claim 4, wherein the connecting electrodes are singly disposed between the first light emitting part and the second light emitting part.

7. The display device of claim 3, further comprising:

drive units, each including a first pixel driver electrically connected to a first light emitting element constituting the first light emitting part, a second pixel driver electrically connected to a second light emitting element constituting the second light emitting part, and a third pixel driver electrically connected to a third light emitting element constituting the third light emitting part, the drive units disposed in the second direction; and a display panel including the light emitting units and the drive units, wherein in the second direction, a width of each of the drive units is less than a width of each of the light emitting units.

8. The display device of claim 7, wherein a distance between each of the drive units and a light emitting unit corresponding to each of the drive units is gradually increased from a center of the display panel toward a periphery of the display panel in the second direction.

9. The display device of claim 8, wherein the display panel is divided into a first region, a second region, and a third region disposed in the second direction, the light emitting units are disposed in the first region, the second region, and the third region, and the drive units are disposed in the first region and the second region, the light emitting units disposed in the third region are electrically connected to the drive units disposed in the second region, and the light emitting units disposed in the first region and the second region are electrically connected to the drive units disposed in the first region.

10. The display device of claim 3, further comprising:

connecting lines including light emitting connections respectively electrically connected to the light emitting elements, drive connections respectively electrically connected to the respective pixel drivers, and extension lines respectively extending from the light emitting connections to the drive connections.

11. The display device of claim 10, wherein each first electrode does not overlap the light emitting connections.

12. The display device of claim 10, further comprising:

a display panel including the light emitting elements and the pixel drivers; and branch lines overlapping, in the second direction, first capacitor electrodes of pixel drivers disposed in a central portion of the display panel.

13. The display device of claim 12, wherein the branch lines extend from extension lines disposed in the central portion of the display panel.

14. The display device of claim 12, wherein

K extension lines overlap a first capacitor electrode of a pixel driver adjacent to a periphery of the display panel in the first direction, and K is a natural number of 2 or more, and a number of branch lines overlapping each of the first capacitor electrodes disposed in the central portion of the display panel is K.

15. The display device of claim 14, wherein the K branch lines extend in parallel in the second direction from each of the extension lines disposed in the central portion of the display panel.

16. The display device of claim 12, wherein a single branch line extends in the second direction from each of the extension lines.

17. The display device of claim 16, wherein a line width of single branch lines is greater than a line width of each of the extension lines.

18. The display device of claim 1, wherein the first capacitor electrode does not overlap the emissive layer in the thickness direction.

19. A display device comprising:

light emitting elements, each including a first electrode electrically connected to a first power supply line, a second electrode disposed over the first electrode, and an emissive layer disposed between the first electrode and the second electrode; and pixel drivers disposed below the light emitting elements and electrically connected to the light emitting elements, respectively, wherein each of the pixel drivers includes:

a first transistor switched by a voltage of a node and electrically connected between the second electrode and a second power supply line;

a second transistor electrically connected between the node and a data line and switched by a write scan signal; and a capacitor including a first capacitor electrode electrically connected to the node and a second capacitor electrode electrically connected between the second power supply line and the first transistor, and the first electrode of each of the light emitting elements is integral with one another and overlap the first capacitor electrode of each of the pixel drivers.

20. A display device comprising:

light emitting elements, each including a first electrode electrically connected to a first power supply line, a second electrode disposed over the first electrode, and an emissive layer disposed between the first electrode and the second electrode;

pixel drivers disposed below the light emitting elements and electrically connected to the light emitting elements, respectively;

connecting lines including light emitting connections respectively electrically connected to the light emitting elements, drive connections respectively electrically connected to the pixel drivers, and extension lines respectively extending from the light emitting connections to the drive connections, respectively; and branch lines extending from connecting lines disposed in a central portion among the connecting lines, wherein each of the pixel drivers includes:

a first transistor switched by a voltage of a node and electrically connected between the second electrode and a second power supply line;

a second transistor electrically connected between the node and a data line and switched by a write scan signal; and a capacitor including a first capacitor electrode electrically connected to the node and a second capacitor electrode electrically connected between the second power supply line and the first transistor, and the branch lines overlap each of the first capacitor electrode disposed in a central portion among each of the first capacitor electrode of the pixel driver.

21. An electronic device for providing an image, comprising:

a display device comprising:

light emitting elements, each including a first electrode electrically connected to a first power supply line, a second electrode disposed over the first electrode, and an emissive layer disposed between the first electrode and the second electrode; and pixel drivers disposed below the light emitting elements and electrically connected to the light emitting elements, respectively, wherein each of the pixel drivers includes:

a first transistor switched by a voltage of a node and electrically connected between the second electrode and a second power supply line;

a second transistor electrically connected between the node and a data line and switched by a write scan signal; and a capacitor including a first capacitor electrode electrically connected to the node and a second capacitor electrode electrically connected between the second power supply line and the first transistor, the data line extends in a first direction, the first capacitor electrode of each of the pixel drivers is disposed in a second direction intersecting the first direction, the first electrode of each of the light emitting elements overlaps the first capacitor electrode of each of the pixel drivers, and the first capacitor electrode entirely overlaps at least the first electrode in a plan view defined by a plane comprising the first and second directions and a plane perpendicular to a thickness direction, the second electrode of each of the light emitting elements overlaps at least the first capacitor electrode in the plan view, the first electrode of each of the light emitting elements is an anode, and the second electrode of each of the light emitting elements is a cathode, and the first electrodes of the light emitting elements are integral with one another and the integral first electrodes of the light emitting elements overlap the first capacitor electrodes of the pixel drivers.

*    *    *    *    *